US012184224B2

(12) United States Patent
Detrick et al.

(10) Patent No.: US 12,184,224 B2
(45) Date of Patent: Dec. 31, 2024

(54) BIFACIAL PHOTOVOLTAIC MODULE

(71) Applicant: Maxeon Solar Pte. Ltd., Singapore (SG)

(72) Inventors: Adam Detrick, Fremont, CA (US); Nadeem Haque, Fremont, CA (US); Vishal Chandrashekar, Fremont, CA (US); Michael Lau, Fremont, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 87 days.

(21) Appl. No.: 17/095,375

(22) Filed: Nov. 11, 2020

(65) Prior Publication Data

US 2021/0143772 A1 May 13, 2021

Related U.S. Application Data

(60) Provisional application No. 62/934,447, filed on Nov. 12, 2019.

(51) Int. Cl.
*H02S 40/20* (2014.01)
*H02S 40/32* (2014.01)
*H02S 40/34* (2014.01)

(52) U.S. Cl.
CPC .............. *H02S 40/20* (2014.12); *H02S 40/32* (2014.12); *H02S 40/34* (2014.12)

(58) Field of Classification Search
CPC ........... H02S 40/20; H02S 40/32; H02S 40/34
See application file for complete search history.

(56) References Cited

U.S. PATENT DOCUMENTS

| 5,660,646 | A | * | 8/1997 | Kataoka | H01L 31/0504 |
| | | | | | 136/251 |
| 2002/0153038 | A1 | * | 10/2002 | Umemoto | B32B 17/10036 |
| | | | | | 136/251 |
| 2004/0182432 | A1 | * | 9/2004 | Yoda | H01L 31/0488 |
| | | | | | 136/251 |
| 2007/0277810 | A1 | * | 12/2007 | Stock | H01L 31/0547 |
| | | | | | 136/246 |
| 2009/0095341 | A1 | * | 4/2009 | Pfenninger | H01L 31/055 |
| | | | | | 136/246 |
| 2011/0297207 | A1 | * | 12/2011 | Ishihara | H01L 31/048 |
| | | | | | 136/246 |
| 2012/0037203 | A1 | * | 2/2012 | Sainoo | B32B 27/306 |
| | | | | | 136/252 |

(Continued)

FOREIGN PATENT DOCUMENTS

KR 10-20130030866 A 3/2013
WO WO2019005752 A1 1/2019

OTHER PUBLICATIONS

Myong, et al., Solar Energy Materials and Solar Cells, 2015, vol. 143, pp. 442-449 (Year: 2015).*

(Continued)

*Primary Examiner* — Sadie White
(74) *Attorney, Agent, or Firm* — Schmidt Patent Law, Inc.

(57) ABSTRACT

A bifacial photovoltaic module has components that are arranged to maximize the efficiency of a module for both front and back surfaces. An opaque portion is disposed on back surfaces of modules and aligned with horizontal support bars of a multiple-module system. Junction boxes are arranged at opposing ends of the opaque portion and couple adjacent modules in the system.

14 Claims, 51 Drawing Sheets

(56) References Cited

U.S. PATENT DOCUMENTS

| | | | |
|---|---|---|---|
| 2012/0055539 A1* | 3/2012 | Kim | H01L 31/0481 |
| | | | 136/251 |
| 2013/0167898 A1* | 7/2013 | Hong | H01L 31/0684 |
| | | | 136/244 |
| 2013/0167903 A1 | 7/2013 | Aspnes et al. | |
| 2014/0116495 A1* | 5/2014 | Kim | H02S 40/22 |
| | | | 136/246 |
| 2015/0090314 A1* | 4/2015 | Yang | H01L 31/0504 |
| | | | 438/66 |
| 2015/0349173 A1 | 12/2015 | Morad et al. | |
| 2015/0349703 A1* | 12/2015 | Morad | H01L 31/049 |
| | | | 136/251 |
| 2016/0035922 A1* | 2/2016 | Kim | B32B 27/36 |
| | | | 136/251 |
| 2016/0225931 A1* | 8/2016 | Heng | H01L 31/0725 |
| 2017/0033250 A1* | 2/2017 | Ballif | G02B 5/0278 |
| 2017/0117425 A1* | 4/2017 | Asbeck | H02S 40/22 |
| 2017/0148942 A1* | 5/2017 | Van Roosmalen | |
| | | | H01L 31/0547 |
| 2018/0183385 A1* | 6/2018 | Potempa | H01L 31/056 |
| 2019/0006544 A1* | 1/2019 | Terashita | H01L 31/022425 |
| 2019/0319147 A1* | 10/2019 | Detrick | H01L 31/0684 |

OTHER PUBLICATIONS

Kim, et al., Solar Energy 159 (2018) 465-474 (Year: 2018).*
International Search Report and Written Opinion for PCT/US2020/059875, mailed Feb. 26, 2021.

* cited by examiner

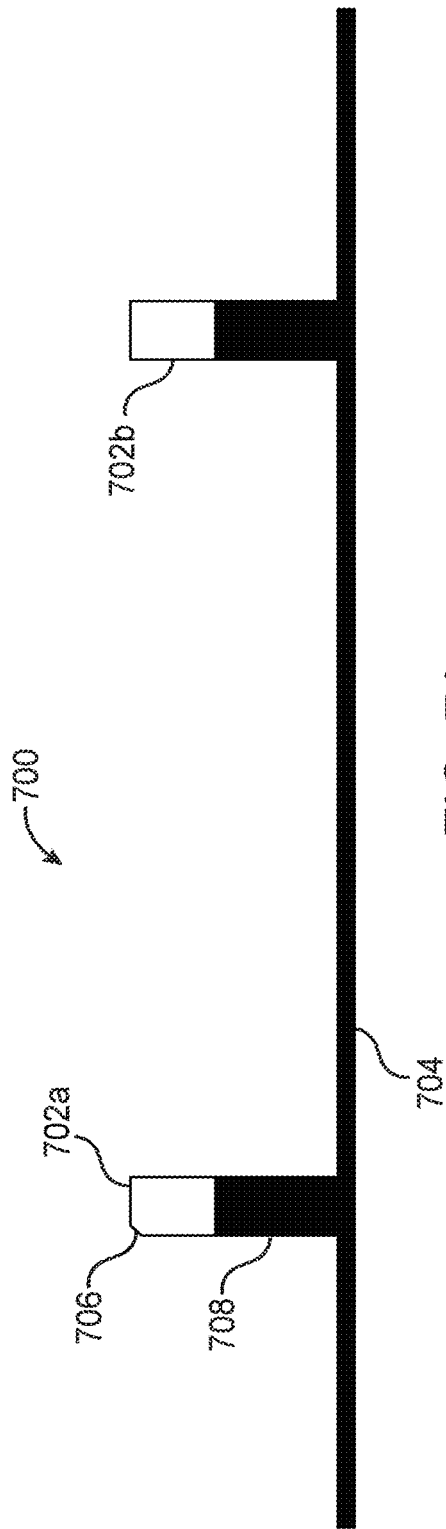
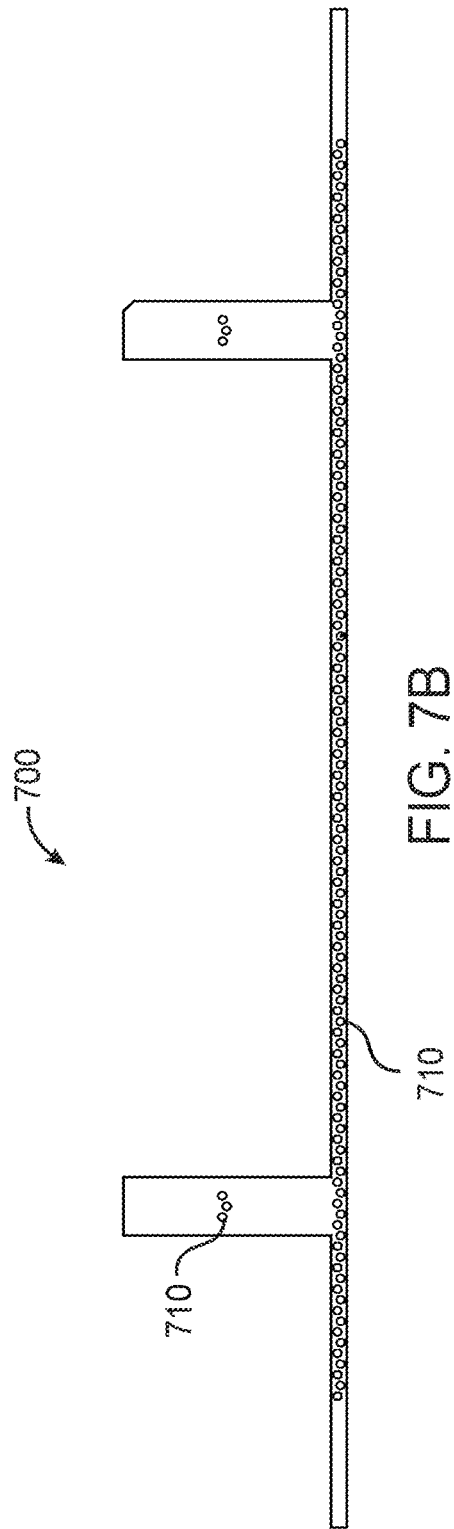

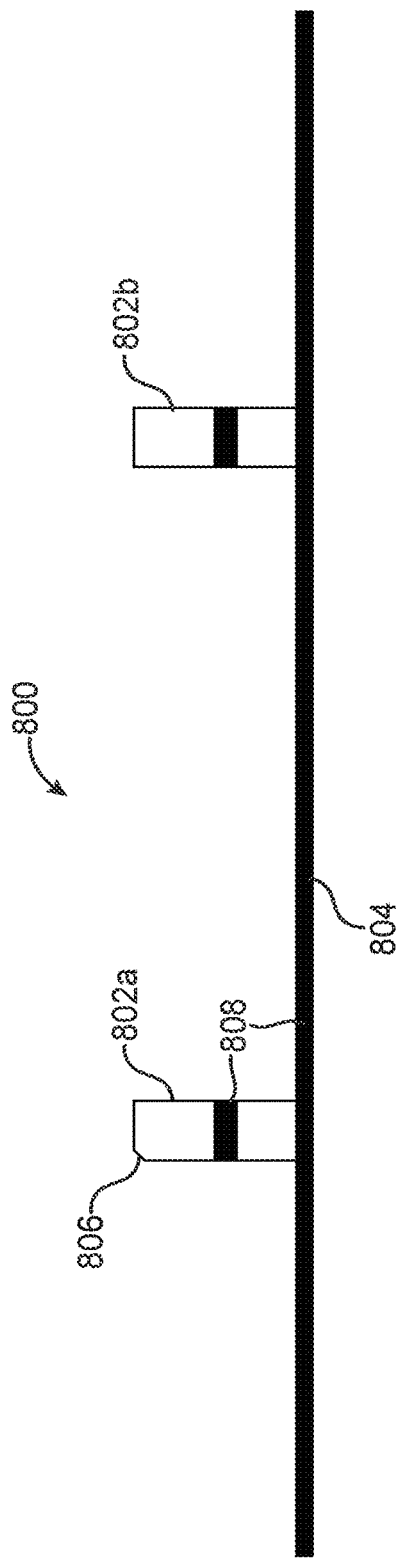
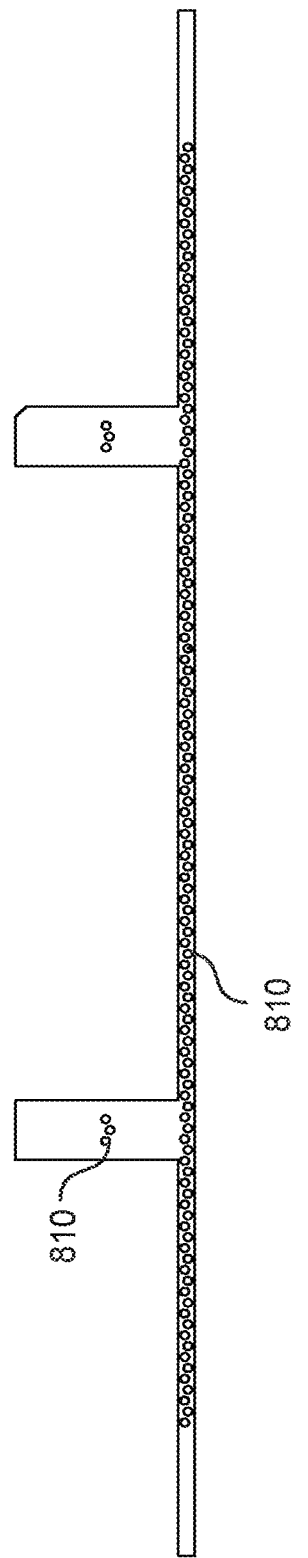
FIG. 8A
FIG. 8B

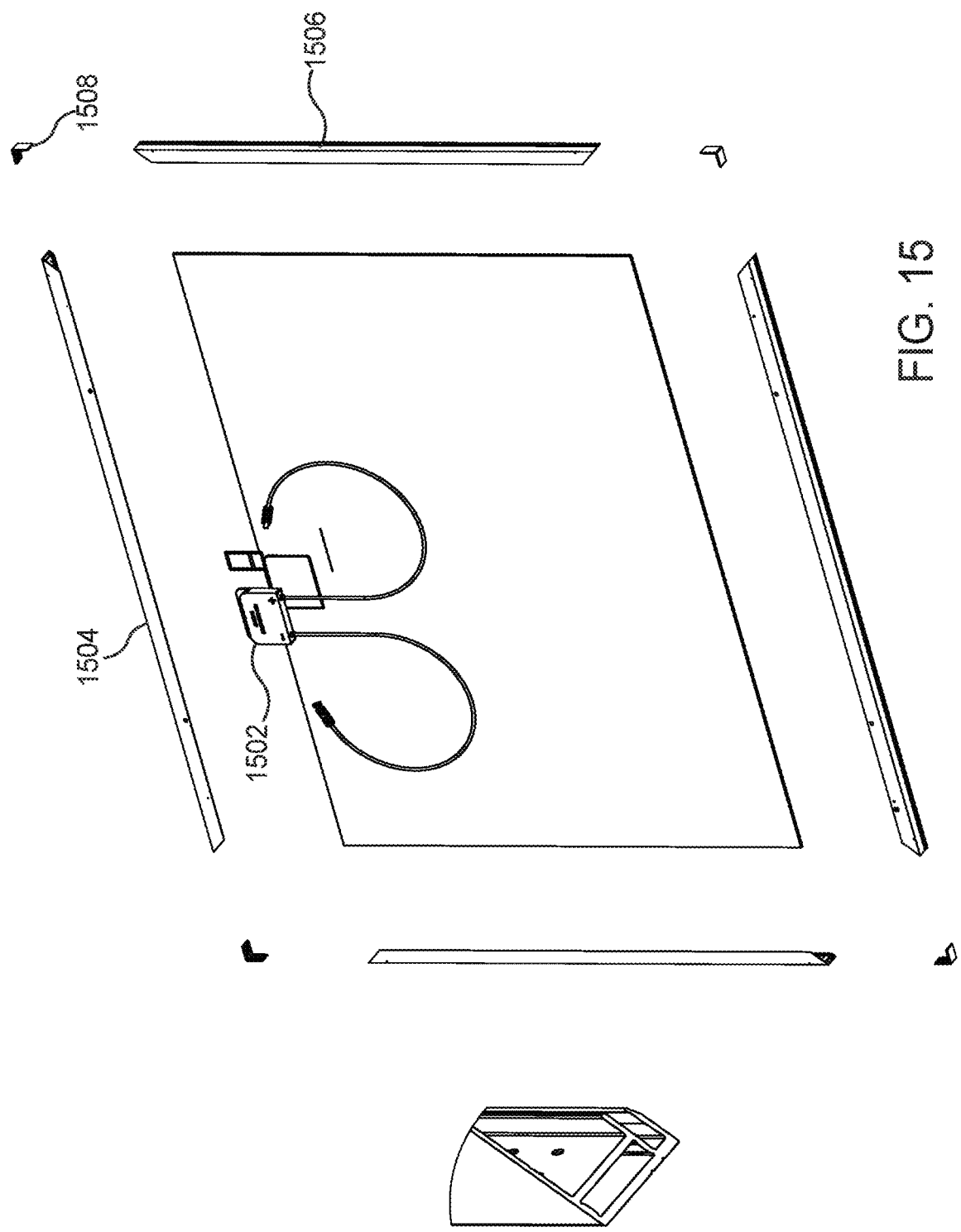

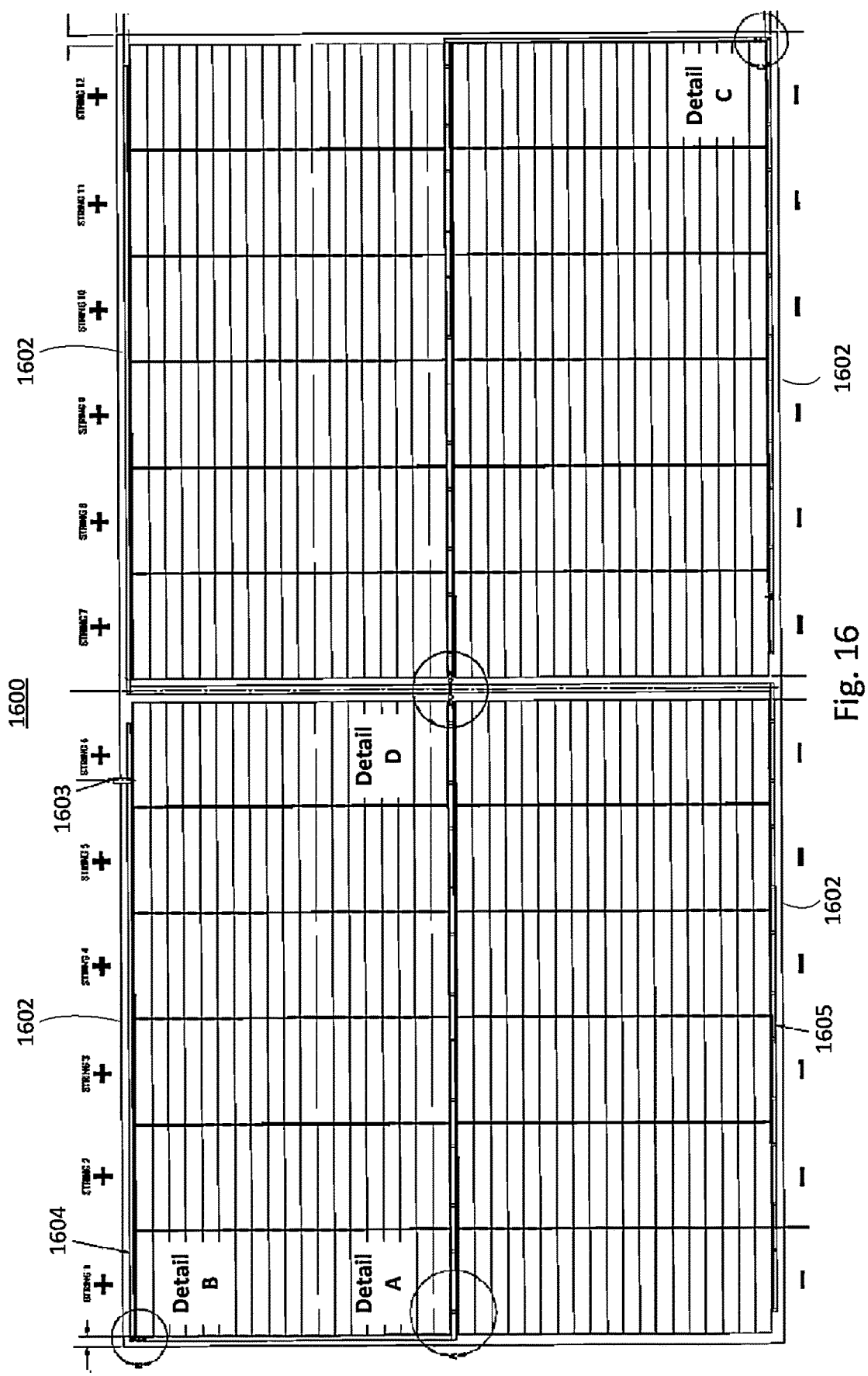

1650

Fig. 18B
Fig. 18C
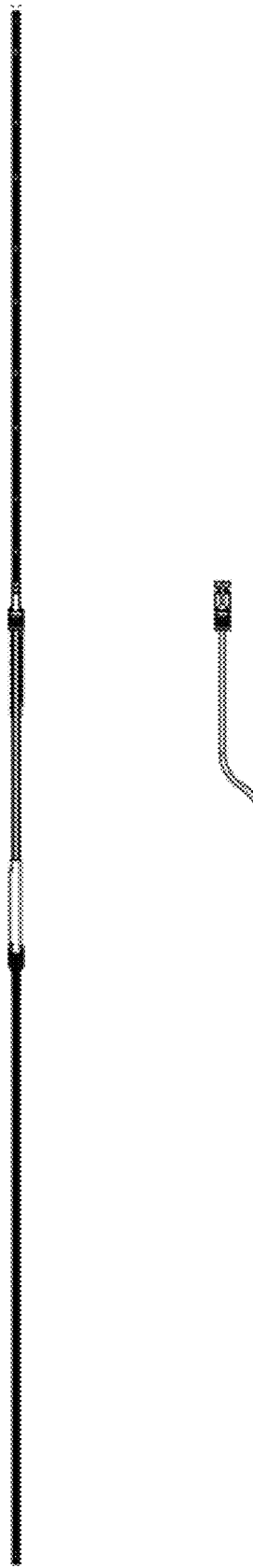
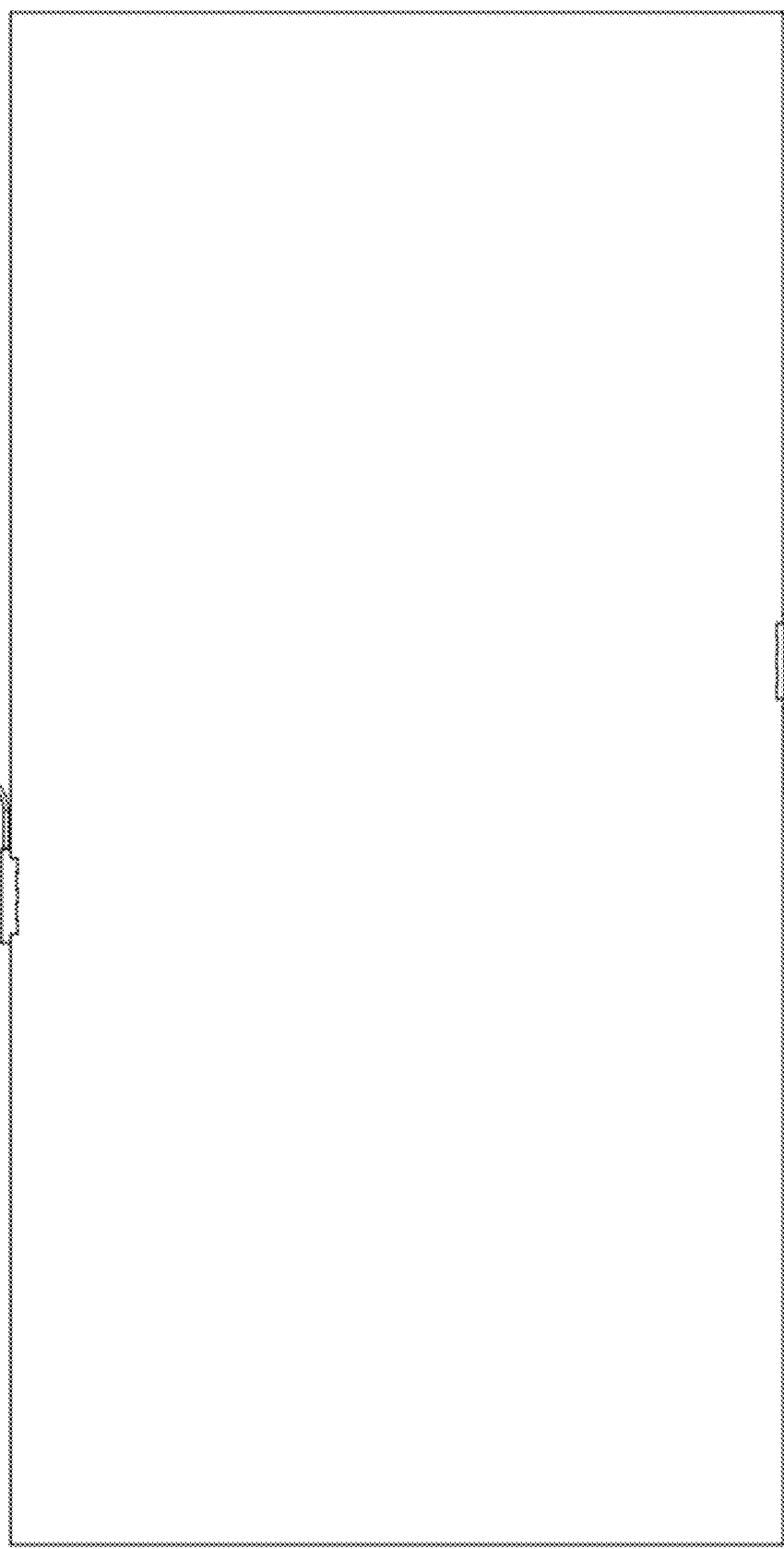

1908

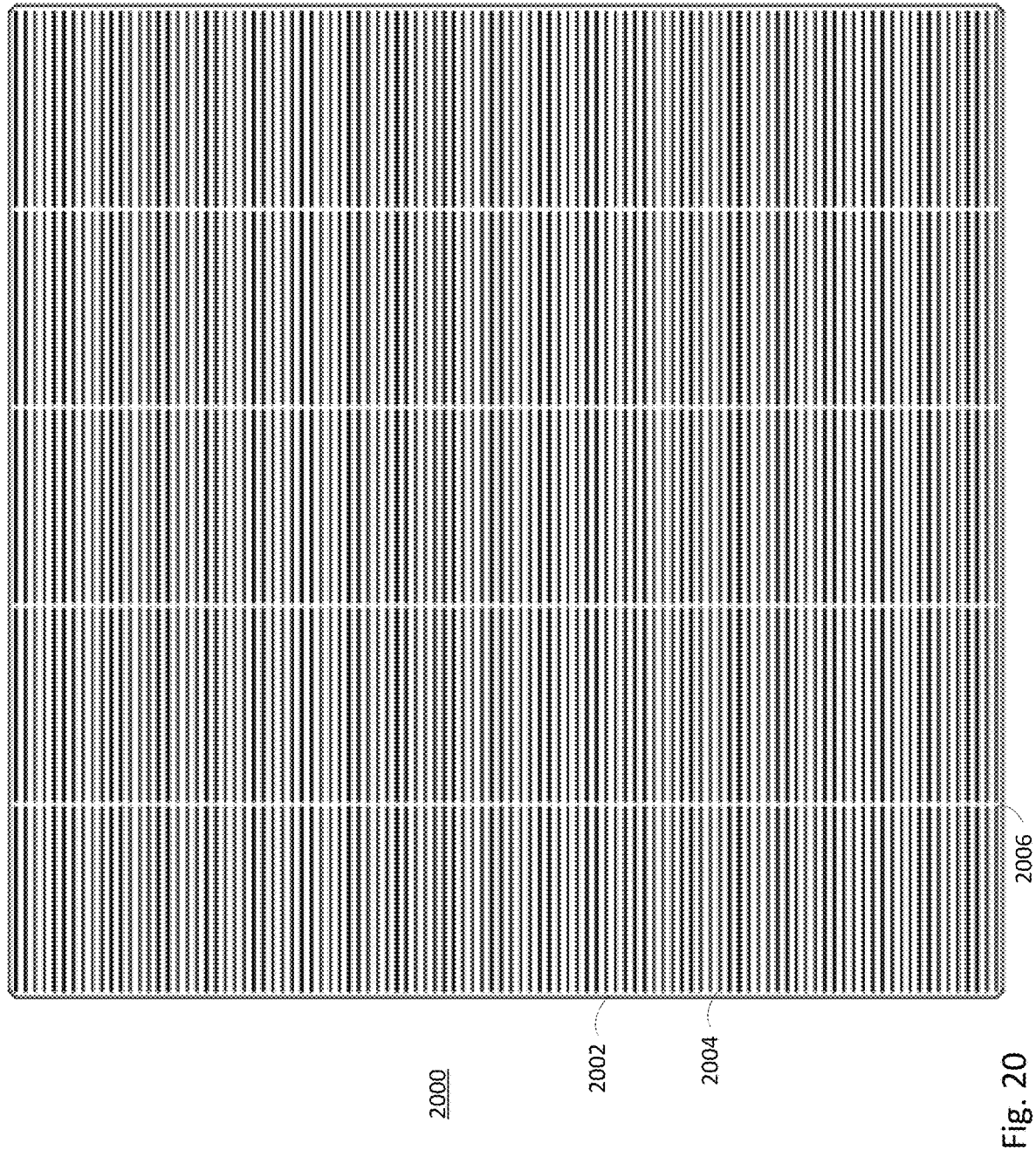

BIFACIAL PHOTOVOLTAIC MODULE

CROSS-REFERENCE TO RELATED APPLICATION

The instant nonprovisional application claims priority to U.S. Provisional Patent Application No. 62/934,447 filed Nov. 12, 2019 and incorporated by reference in its entirety herein for all purposes.

BACKGROUND

Photovoltaic devices are becoming an increasingly important element of global energy production. As technologies for creating photovoltaic materials are improved and economies of scale manifest, the price of photovoltaic material has been dropping at an exponential rate, making photovoltaic installations increasingly cost-competitive with other energy production technologies.

Due to the high scalability of photovoltaic devices and the ubiquitous presence of solar radiation, photovoltaic energy generation is well suited for small-scale installations that serve individual residential and commercial structures. In these scenarios, photovoltaic cells are typically arranged into individual panels or modules, and one or more of the modules are installed in an area that is exposed to solar radiation. The modules convert solar energy to electricity, which is used to supply the energy needs of a structure, stored for future use, or delivered to the electrical grid.

TECHNICAL FIELD

The present application relates to bifacial photovoltaic modules and systems.

BRIEF SUMMARY

Embodiments of the present application are directed to bifacial photovoltaic modules. Characteristics of the bifacial modules include protection for each zone by a single diode, which promotes optimum performance in a variety of light intensity situations that are experienced by the modules, junction boxes that are disposed on sides of a module frame, which reduce or eliminate cabling and greatly simplify connections between multiple adjacent modules, and a highly efficient configuration of components that simultaneously maximizes the area efficiency of the front and back surfaces of the module.

BRIEF DESCRIPTION OF THE DRAWINGS

FIGS. 7A and 7B illustrate respective coated and uncoated surfaces of a back conductive ribbon;

FIGS. 8A and 8B illustrate respective coated and uncoated surfaces of a front conductive ribbon;

FIG. 15 illustrates a photovoltaic module.

FIG. 16 illustrates an embodiment of a bifacial photovoltaic module.

FIG. 18B illustrates a side view of the module of FIG. 18. FIG. 18C illustrates a front plan view of the module of FIG. 18.

FIG. 20 illustrates an embodiment of a bifacial cell for a photovoltaic module.

DETAILED DESCRIPTION

A detailed description of embodiments is provided below along with accompanying figures. The scope of this disclosure is limited only by the claims and encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description. These details are provided in order to promote a thorough understanding the scope of this disclosure by way of specific examples, and embodiments may be practiced according to the claims without some or all of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

It is convenient to recognize that a photovoltaic module has a side that faces the sun when the module is in use, and an opposite side that faces away from the sun. Although, the module can exist in any orientation, it is convenient to refer to an orientation where "upper," "top," "front" and "aperture side" refer to the sun-facing side and "lower," "bottom" and "back" refer to the opposite side. Thus, an element that is said to overlie another element will be closer to the "upper" side than the element it overlies.

Figure 1A:
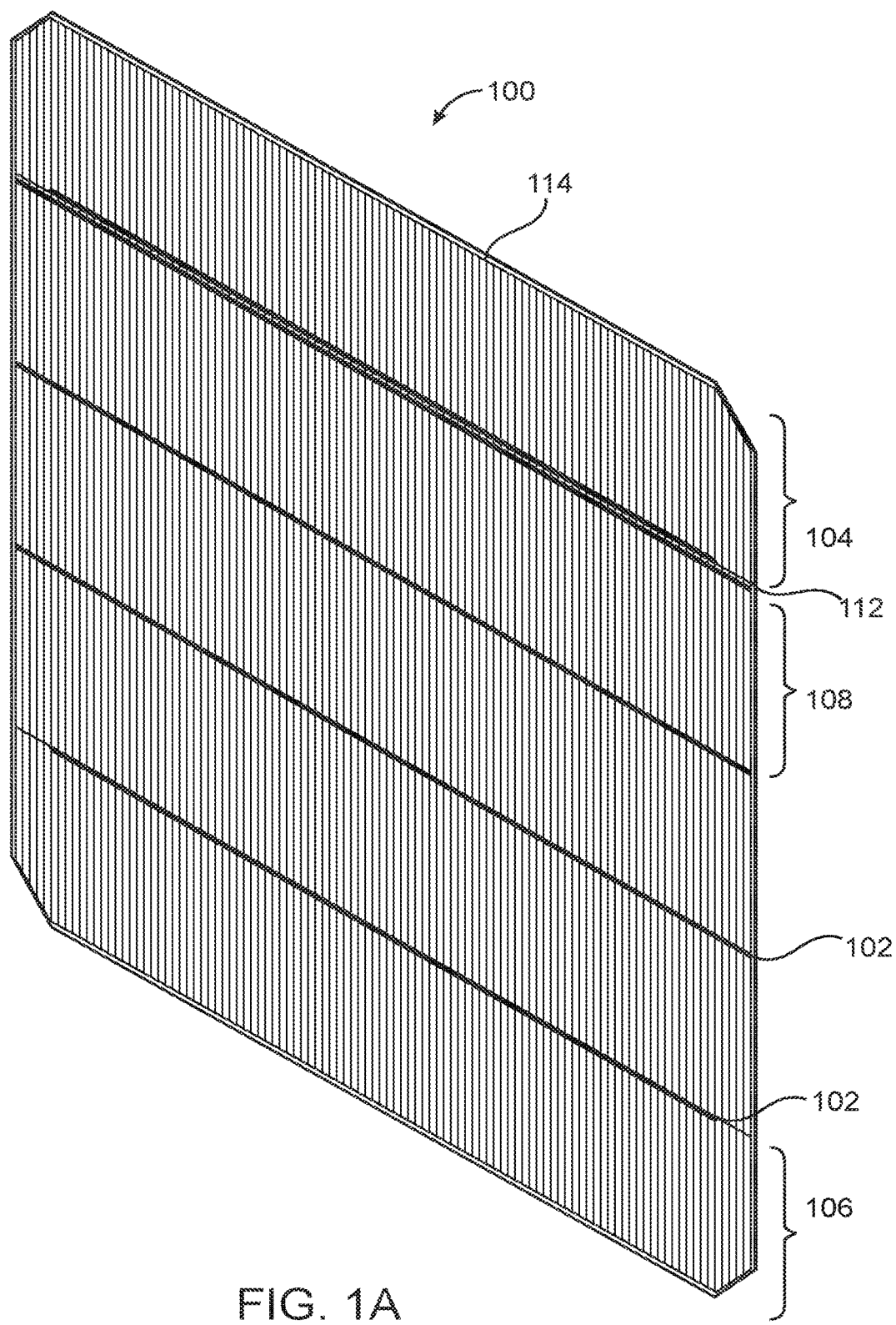
FIGS. 1A and 1B illustrate respective front and back sides of a photovoltaic cell.

FIG. 1A is a front perspective view of a photovoltaic (PV) cell 100. This figure is merely an example of a photovoltaic cell, and one of ordinary skill in the art would recognize other variations, modifications, and alternatives to the specific embodiment shown in FIG. 1.

The surface of PV cell 100 illustrated in FIG. 1A is an aperture region of the cell 100 that exposes photovoltaic material, which is exposed to solar radiation. In various embodiments of PV cells 100, the photovoltaic material can be silicon, polycrystalline silicon, single crystalline silicon, or other photovoltaic materials as known in the art.

The solar cell 100 can be characterized as comprising a plurality of strips, each of which has a bus bar 102 on its front face. Because the cell 100 shown in FIG. 1A has chamfered corners, some of the strips have different shapes. The cell 100 has a first end strip 104 disposed against a first edge of the cell, and a second end strip 106 disposed on a second edge of the cell opposing the first edge.

In the embodiment shown in FIG. 1A, the first end strip 104 has a 45-degree chamfer 110 on each outer corner. Other embodiments may have other cell shapes—for example, in some embodiments, the cell 100 is a rectangular cell with right-angle corners.

Three rectangular interior strips 108 are disposed in a central portion of the PV cell 100. Each of the interior strips 108 in FIG. 1A has a substantially rectangular shape, and a bus bar 102 running across the front surface. A plurality of thin conductive fingers 114 that are arranged perpendicular to the bus bars 102 are visible on the aperture surface of the strips.

The bus 102 associated with the second end strip 106 is separated from the bus bar 102 associated with the adjacent interior strip 108 by a narrow scribe region 112. The scribe region 112 is a region where the cell may be cut to separate the various strips.

In the cell 100 of FIG. 1, the first end strip 104, the second end strip 106, and the plurality of strips 108, and the second end strip 106 are arranged in parallel to each other in the cell 100 such that the cell is divided into a total of five strips including three interior strips 108.

In an embodiment, the PV cell 100 has a length and a width of 156 mm plus or minus 2 mm, but other embodiments are possible.

Figure 1B:
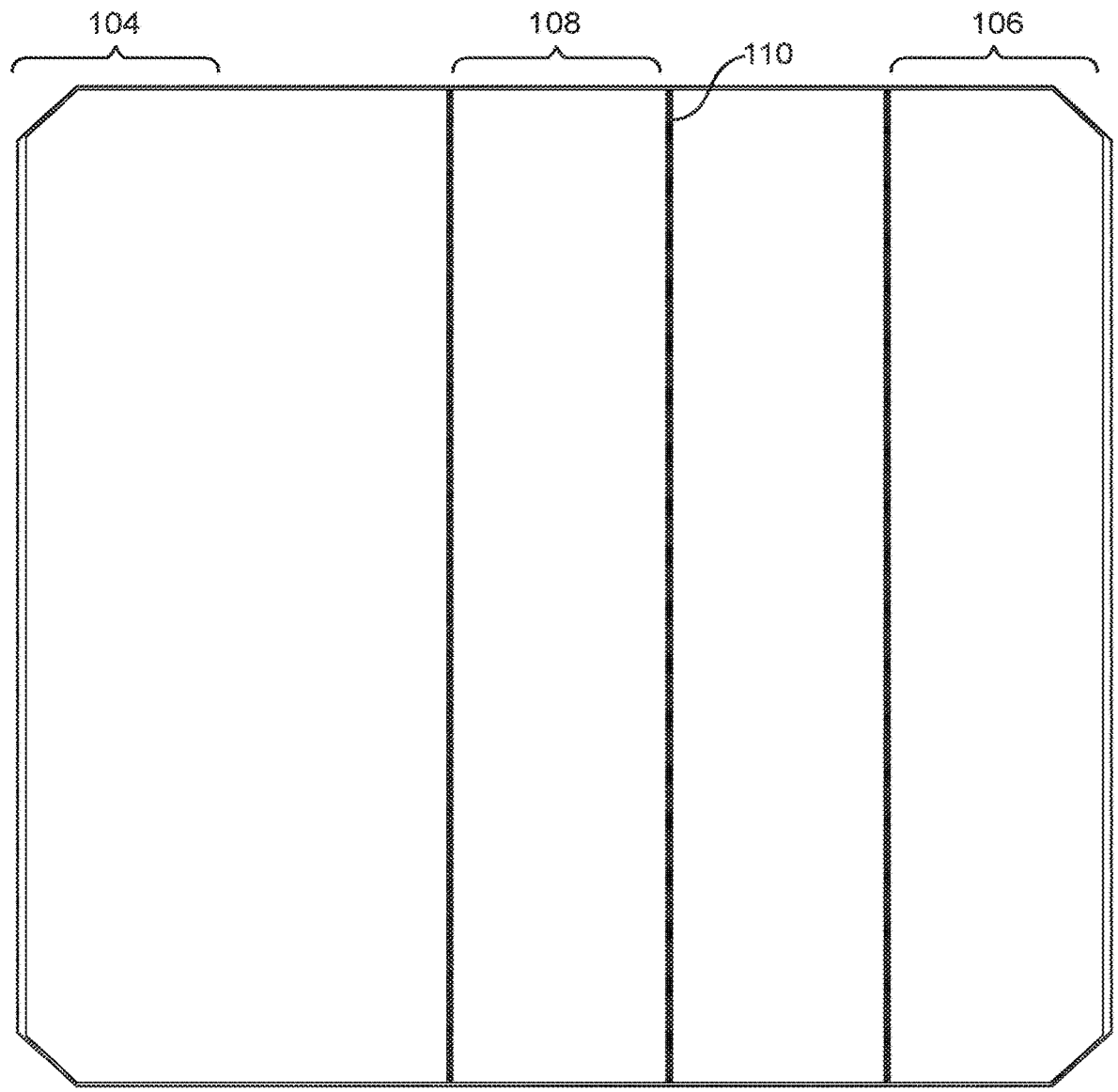

FIG. 1B shows a backside of the PV cell 100 of FIG. 1A. A plurality of backside bus bars 110 are asymmetrically arranged on the backside of the PV cell 100.

In cell 100, the plurality of strips 104, 106 and 108 are monolithically connected with each other. In embodiments of the present application, the monolithic solar cell 100 is subjected to a separation or singulation process in which the strips are physically separated from one another using, for example, mechanical sawing or laser energy. The strips may be separated from one another by dividing the PV cell 100 at its bus bars, so that each face of a strip has a bus bar located at an edge of the strip.

Figure 2A:
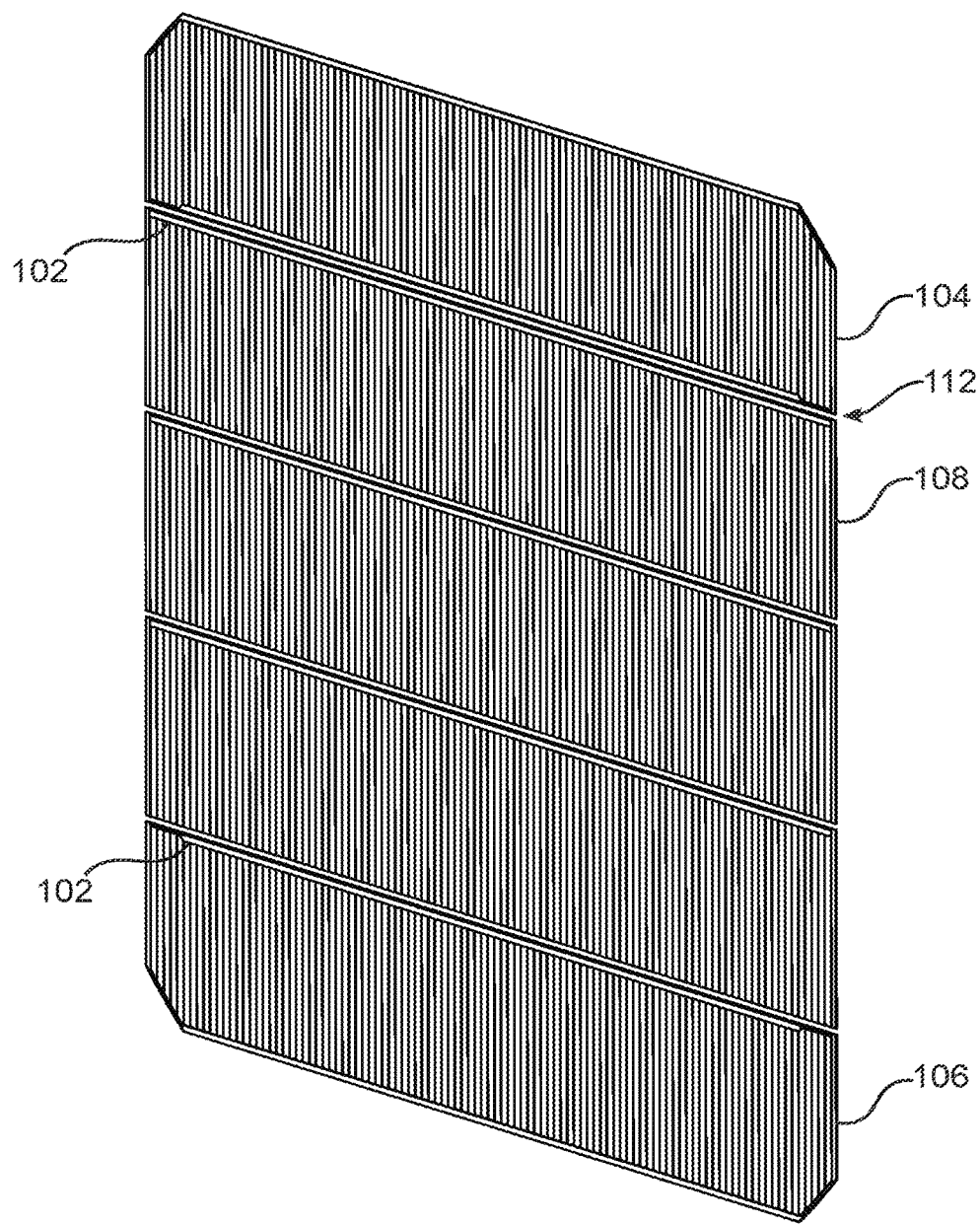
FIGS. 2A and 2B illustrate respective front and back sides of a photovoltaic cell that has been separated into strips.
Figure 2B:
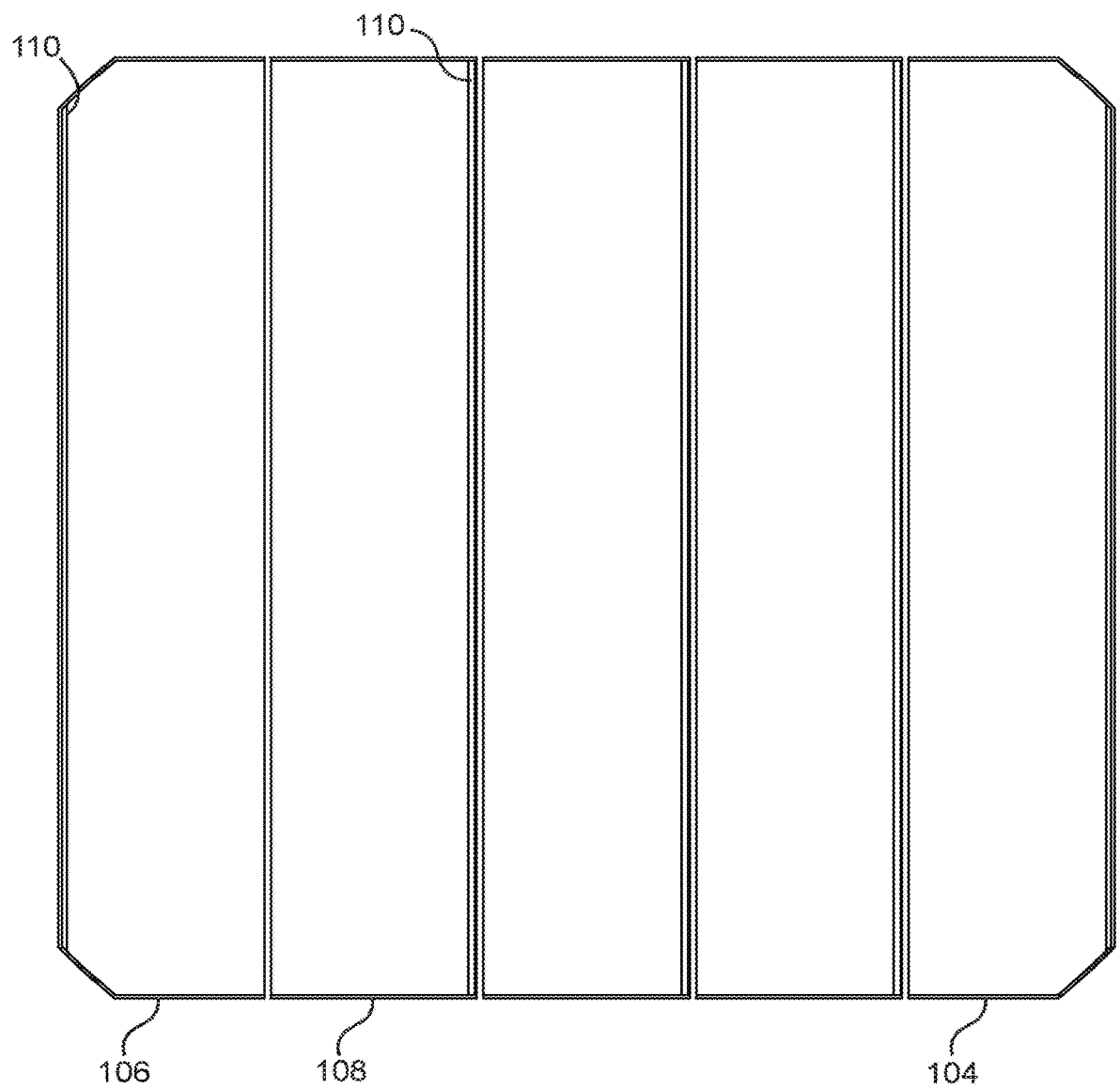

FIG. 2A is a front perspective view of a PV cell 100 that has been subjected to a separation process that separates the cell into a plurality of individual strips. In the embodiment shown in FIG. 2A, the cell 100 is separated into first and second end strips 104 and 106, and three rectangular strips 108 from the middle of the cell. FIG. 2B shows a back view of the same cell 100.

Between FIG. 2A and FIG. 2B, it is apparent that each strip has one bus bar exposed on each face of the strip. The front face of first end strip 104 exposes a front bus bar 102, the front face of second end strip 106 shows another front bus bar 102, and each of the front faces of strips 108 from the interior of the cell have front bus bar 102 on one edge.

On back faces of the strips, as seen in FIG. 2B, every strip has one backside bus bar 110 against an edge of the strip. For the first and second end strips 104 and 106, backside bus bars 110 are disposed on the longest edge of the strips, which is opposite to the chamfered edge. Accordingly, the first and second end strips 104 and 106 have substantially the same characteristics. Similarly, each of the interior strips 108 has substantially the same characteristics as other interior strips 108.

Although FIGS. 1A-2B illustrate strips separated from a standard sized cell 100, other embodiments are possible. For example, it is possible to fabricate PV strips in net shape without any cutting, and to cut PV strips from cells of a variety of shapes and sizes.

Figure 3A:
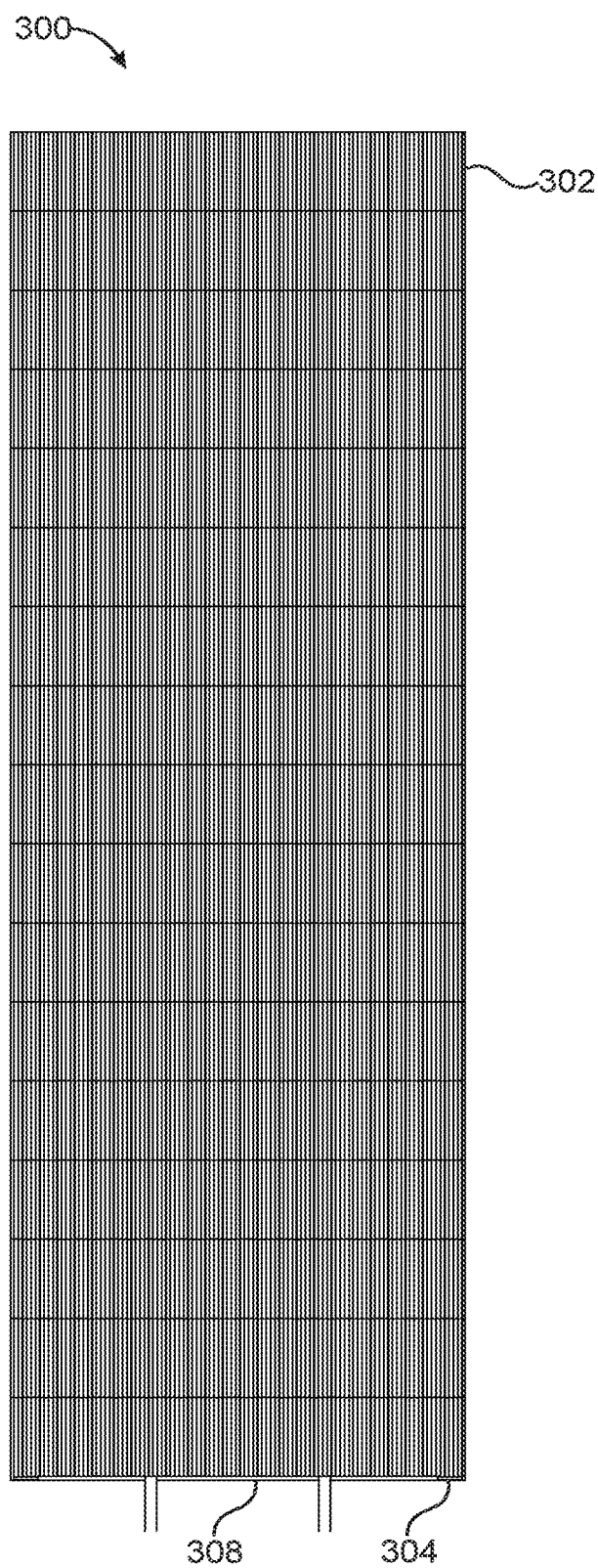
FIGS. 3A, 3B and 3C illustrate respective front, side and back surfaces of a photovoltaic string.
Figures 3B, 3C:
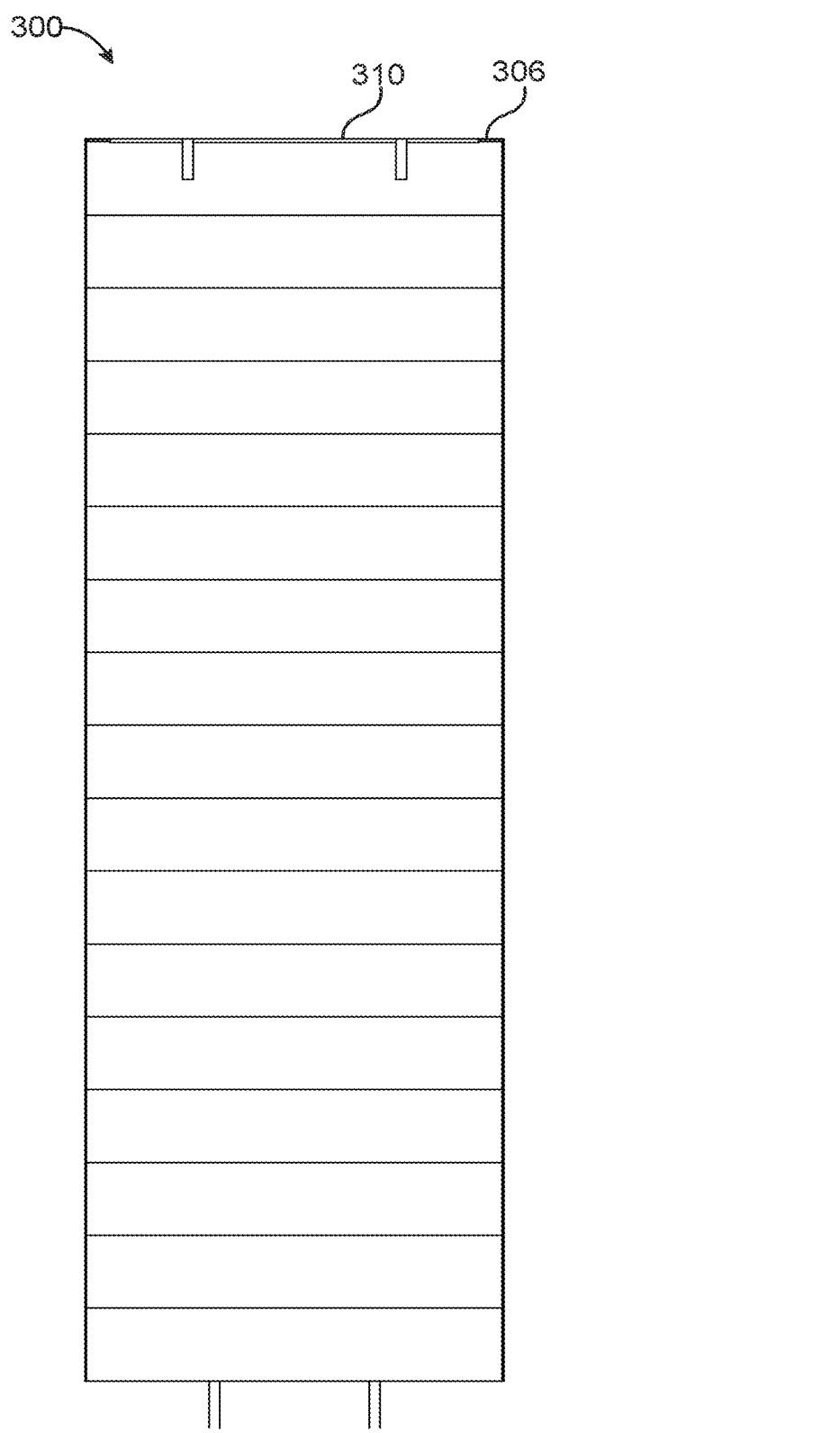

The presence of a front bus bar 102 and back bus bar 110 facilitates a tiled arrangement of individual strips into a string. FIGS. 3A, 3B and 3C illustrate an embodiment of a string 300 that comprises a plurality of strips 302, each connected on a long edge to at least one other strip. FIG. 3A shows a front face of a string 300, FIG. 3B shows a back face of the string 300, and FIG. 3C shows a side view of the string 300.

In the embodiment of FIGS. 3A to 3C, the string 300 has 17 strips 302 coupled in series. However, the number of strips 302 in a string 300 can vary between different embodiments. For example, a string 300 may comprise two strips 302, ten strips 302, twenty strips 302, or fifty strips 302.

The number of strips 302 in a string 300 affects the electrical characteristics of the string. When strips 302 are connected in series to form a string 300, the current of an individual strip is the same as the current for the entire string, but the voltage of each strip is combined. In a simplified example, a string of 10 strips, in which each strip operates at 5 volts and 5 amps, would have an operating voltage of 50 volts and an operating current of 5 amps. Thus, arranging strips 302 into strings 300 facilitates adapting electrical characteristics of photovoltaic material.

As seen in FIG. 3C, strips 302 are arranged in an overlapped or tiled configuration within a string 300. In more detail, front bus bars 304 of strips 302 in the string 300 overlap with and are electrically and mechanically coupled to back bus bars 306 of adjacent strips. In embodiments, the strips 302 may be connected by a material such as a metallic solder or an electrically conductive adhesive (ECA).

An ECA has several advantages as a coupling material in a string 300. Polymeric components of ECA can provide higher elasticity than metal materials, which can help maintain a mechanical bond under various thermal states when the materials contract and expand. In other words, the ECA can relieve mechanical stress caused a coefficient of thermal expansion (CTE) mismatch between mated materials. ECA can be formulated to be soluble to various solvents, which facilitates various manufacturing processes. In addition, an ECA bond is typically more elastic than, for example, a solder bond, so an ECA bond is less prone to cracking during assembly.

In an embodiment in which strips are connected by ECA, the ECA may be a cured adhesive polymer formulation that is highly loaded with conductive metal particles. In some embodiments, the conductive metal is silver. The ECA may be a thermosetting acrylate adhesive. The adhesive may have may be modified with one or more hardening components such as epoxy, phenol-formaldehyde, urea-formaldehyde, etc., that provide hardness and bonding strength. In an example, the ECA is a low temperature cure one-part adhesive.

When strips 302 are connected in series in a string 300, bus bars at the far ends of the string are exposed. In other words, unlike strips 302 in the middle of a string 300, one bus bar of the outermost strips in a string is connected to an adjacent strip, but one bus is not connected to a strip. Instead, in embodiments of the present disclosure, bus bars of the outermost strips 302 are connected to conductive ribbons.

In embodiments of the present disclosure, a system utilizes a ⅕th strip width versus ⅓rd, ¼th or ⅙th of a cell strip width, as shown in Table 1 below.

In Table 1, width refers to the width of a strip after it has been cut from a cell. Current is the amount of current that a strip produces, which is directly proportional to the size of the strip. Fingers carry current across a strip, while shading is the area of the strip shadowed by the fingers. Cell utilization is the amount of area in a string in which strips do not overlap one another. The number of placements is how many strips are cut from a cell and placed in a string. Fill factor is the efficiency of the photovoltaic material present in a string compared to its maximum power producing potential.

In an example, modules are configured to have current and resistance characteristics that are similar to a conventional module (Voc, Vmp, Isc, Imp, Power). However, modules can be designed to have different characteristics for different applications. For example, modules created according to embodiments of this disclosure can be configured to have lower voltage and higher current for the solar tracking applications, and to have higher voltage and lower current for residential modules that interface with module power electronics.

In an example, one embodiment uses a 31.2 mm strip width, which optimizes module characteristics, as well as providing a current and voltage similar to standard modules. This allows embodiments to take advantage of standard inverters, electronics, and mechanical features.

FIG. 3A shows a front ribbon 308 over the exposed front bus bar 304 of the lowermost strip 302 in the string 300. As seen in FIG. 3B, a back conductive ribbon 310 covers the back bus bar 306 at of the uppermost strip 302 of the string 300. The back bus bar 306 is the back terminal of a strip 302, and front bus bar 304 is a front terminal. Each of the front and back ribbons 308 and 310 has two tabs protruding from the respective the ribbon. In a flat orientation, the tabs of the front ribbon 308 extend outward from the string 300, while the tabs of back ribbon 310 extend inwards from the edge strip to which the back ribbon 310 is attached towards the middle of the string. In an embodiment, the front surface of a strip 302 has a positive polarity and the back surface has a negative polarity. However, other embodiments are possible, where the exposed front aperture surfaces has negative polarity and the back surface has positive polarity.

Figure 4:
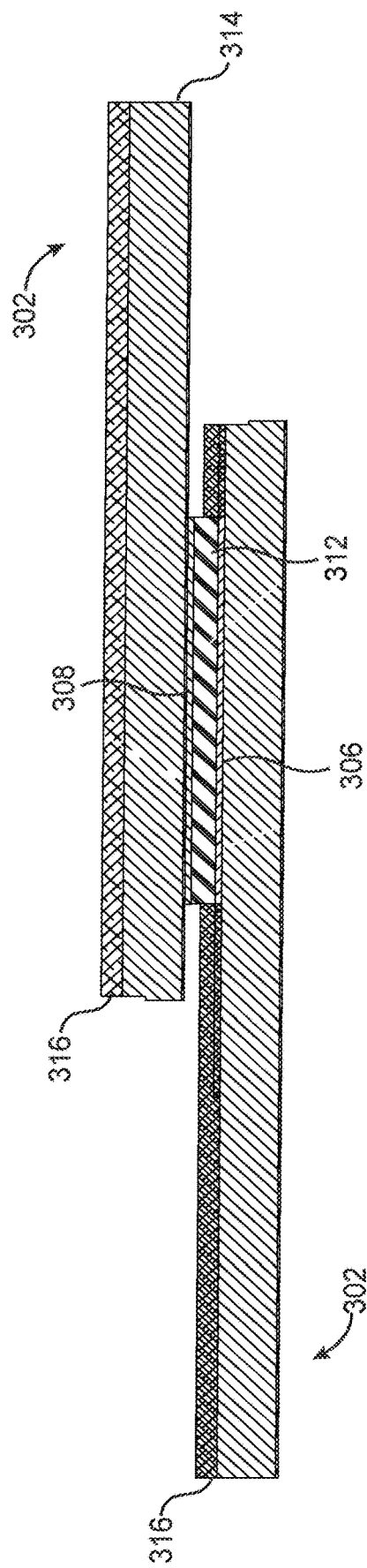
FIG. 4 illustrates overlapped strips in a string.

FIG. 4 shows an detail view of an overlapped joint in which two adjacent strips 302 are connected to one another in a string 300. The overlapped open ends of the strips 302 have a staggered profile, which results from a separation process in which PV cells are separated using two distinct operations, e.g. a cutting operation and a breaking operation. A cutting operation may result in a kerf in the inset portion of the edge, while a breaking operation does not cause a kerf, resulting in the slight protrusion visible in FIG. 4.

TABLE 1

| | PV width | | | | | Comment |
|---|---|---|---|---|---|---|
| Width | 78 | 52 | 39 | 31.2. | 26 | mm |
| Cell Current | 4.5 | 3 | 2.25 | 1.8 | 1.5 | Isc = 9A standard cell |
| Fingers | 80-200 | 80-150 | 80-120 | 80-100 | 80 | (Microns) Based on standard cell finger |
| Shading | 7.0% | 5.8% | 5.0% | 4.5% | 4% | Finger shading |
| Cell Utilization | 98.7% | 97.4% | 96.2% | 94.9% | 93.6% | 2 mm overlap |
| Placements | 2X | 3X | 4X | 5X | 6X | Over standard module |
| Fill Factor | 76% | 77% | 78% | 79% | 79% | |

Each strip 302 in the string 300 has a thickness of PV material 314 and a thickness of a backing material 316. In many conventional PV cells, the backing material 316 is aluminum, but embodiments are not limited to that material. A back bus bar 306 is exposed by the backing material 316, and a layer of ECA 312 mechanically and electrically couples the back bus bar 306 to a front bus bar 308 on the overlapped strip 302.

Figure 5:
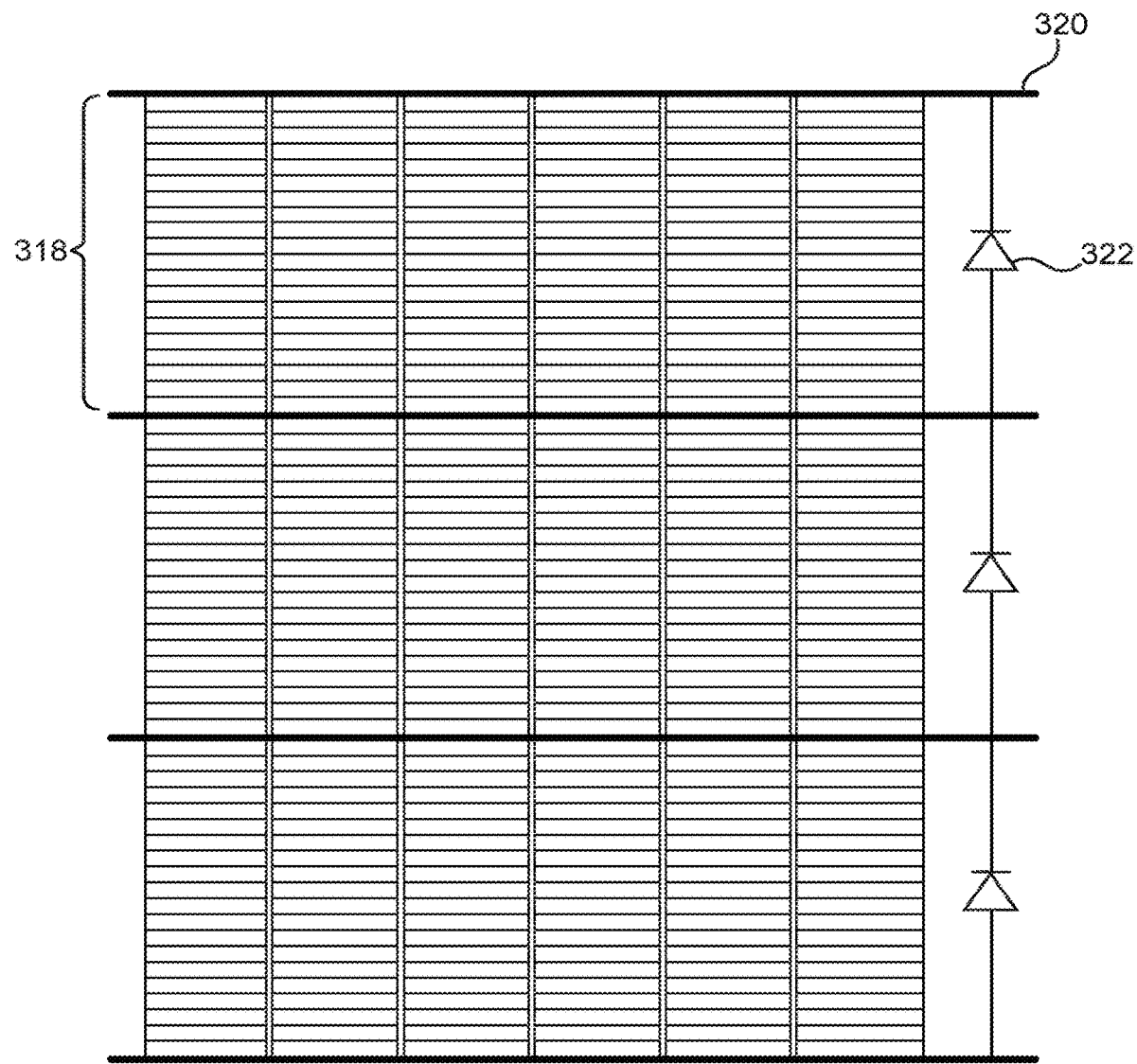
FIG. 5 is a simplified illustration of a photovoltaic module with three zones.

FIG. 5 is a simplified diagram of a photovoltaic apparatus that comprises a plurality of strings 300 that are arranged into a plurality of zones 318. In the specific embodiment shown by FIG. 5, each string 300 has 20 strips 302 connected in series with one another. Each string 300 is connected in parallel with five additional strings through electrical busses 320 disposed at opposing ends of the parallel connected strings, so that a total of six strings are connected in parallel. Each set of strings 300 that are connected in parallel is referred to herein as a "zone" 318.

The number of strings 300 in a zone 318 may vary between embodiments. For example, other embodiments may have from two to ten strings 300 in a zone 318.

The embodiment shown in FIG. 5 has three separate zones 318, and each zone is protected by a single diode 322 coupled in parallel to the six strings 300 in the respective zone. Conventional PV module arrangements are divided into multiple cells that are all connected in series with one another, and diodes are periodically disposed between subgroups of the series connected cells. In such conventional arrangements, when a single cell is disabled, for example by being shaded, all other cells coupled to the same diode are also disabled. In other words, in conventional devices, when one cell is disabled, all cells that are coupled to the diode that protects the disabled cell are also disabled.

In contrast, the PV device shown in FIG. 5 has better performance. Each diode 322 protects a zone 318 in a much more efficient manner than conventional devices. Like conventional devices, when one or more strip 302 in a first string 300 is disabled, all of the strips in the first string are disabled, and current flows through the diode 322. However, unlike conventional devices, all other strings 300 that are present in the same zone 318 and do not have any disabled strips 302 continue to produce normal levels of energy. Accordingly, energy losses due to shading are much lower in embodiments of the present application than conventional devices.

Figure 6:
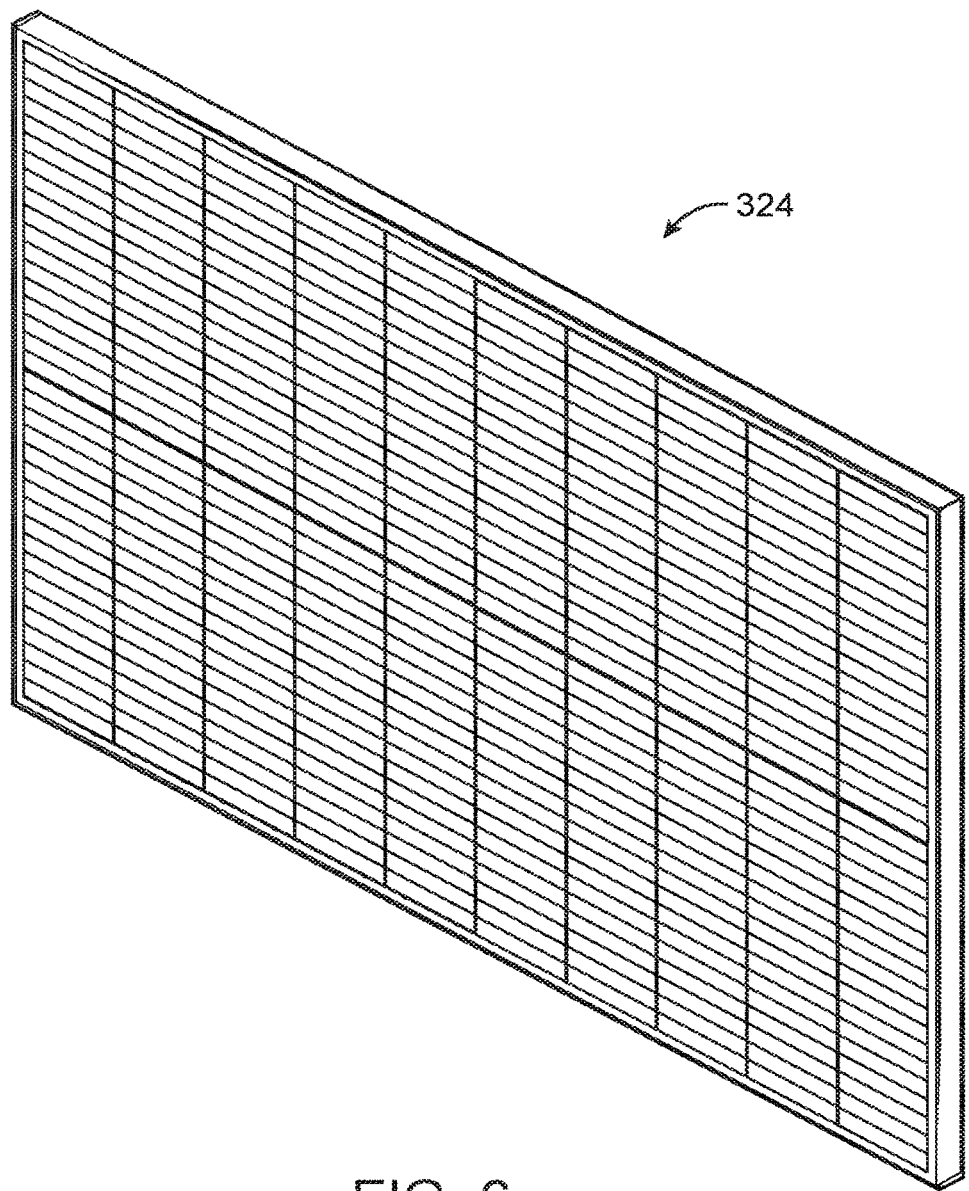
FIG. 6 illustrates an assembled photovoltaic module.

FIG. 6 shows an example of a PV module 324 that includes the photovoltaic components shown in FIG. 5. In more detail, the PV module 324 shown in FIG. 6 has 20 strings 300, and each string 300 includes a plurality of strips 302 that are mechanically and electrically connected in series with one another.

Returning to FIGS. 3A and 3B, the front bus bar 304 of a string 300 is covered by a front ribbon 308, and the back bus bar 306 is covered by back ribbon 310. The ribbons are mechanically and electrically connected between the respective bus bars of the PV string 300 and electrical busses 320. The conductive ribbons have a number of innovative features not found in conventional photovoltaic devices. Features of the ribbons will now be explained in greater detail.

Ribbons

FIGS. 7A and 7B illustrate an embodiment of respective first and second surfaces of a front ribbon 700. The front ribbon is configured to be attached to a front bus bar 304 of a PV strip 302, which may be disposed on a far end of a string 300. In an assembled module 324, conductive ribbons are disposed at opposing ends of a PV string 300, and conduct electricity between wiring of a PV module and the photovoltaic elements.

The front ribbon is a single monolithic body that includes two tabs, which may be referred to as a first tab 702a and a second tab 702b. The tabs are connected to a bus interface part 704. The bus interface part 704 has a shape that covers a front bus bar 304.

The front bus bar 304 to which front ribbon 700 is attached is disposed on the sun-facing side of a PV strip 302, so it may be visible when the strip 302 is mounted in a PV module 324. Accordingly, the height and width of the bus interface part 704 may be larger than an exposed surface of a front bus bar 304, so that when the bus interface 704 of the ribbon is attached to the front bus bar, it completely obscures the front bus bar 304 from view in an assembled module. In a specific embodiment, the width of a bus interface 704 is 50% or more than the width of a bus bar to which it is attached. The shape of the bus interface part 704 may be rectangular, or some other shape that corresponds to a shape of a bus bar to which it is attached.

In an embodiment, the front ribbon 700 has an asymmetric shape. For example, as seen in FIGS. 7A and 7B, the two tabs 702a and 702b have different shapes from one another. Specifically, first tab 702a has an asymmetric element 706, which is a chamfer, but could be other shapes such as a rounded end or corner in other embodiments. Second tab 702b does not have an asymmetric element 706, so the first tab 702a has a different shape from second tab 702b. As a result, first tab 702a is asymmetric with second tab 702b, and the front ribbon 700 does not have any plane of symmetry.

The asymmetry of front ribbon 700 serves as a visual indicator of the ribbon's orientation. Regardless of other features, it is possible to determine the orientation of front ribbon 700 based on the position of the asymmetric element 706 from a brief visual observation. Absent the asymmetric element 706, it could be difficult to determine which surface is the first surface shown in FIG. 7A, and which surface is the second surface shown in FIG. 7B, at various phases in manufacturing elements of a PV module according to embodiments of the present disclosure.

While the front ribbon 700 attaches to a front bus bar 304, embodiments of the present disclosure also include a back ribbon 800 that is attached to a back bus bar 306 disposed on a back, non-sun facing side of PV material. In some embodiments, the front ribbon 700 and the back ribbon 800 are the same part. However, the specific constraints and environment of a back ribbon may be different from those of a front ribbon, so there are a number of technological advantages that can be achieved by using a different ribbon for front and back terminals.

FIGS. 8A and 8B show an embodiment of a back ribbon 800 that has different characteristics from front ribbon 700 described above. The back ribbon 800 has first and second tabs 802a and 802b that extend from a bus interface 804, and the first tab 802a includes an asymmetric element 806. In an embodiment, the distance between tabs 702a and 702b of a front ribbon 700 is less than the distance between tabs 802a and 802b of back ribbon 800. However, in other embodiments, the distance between tabs 702a and 702b is greater than the distance between tabs 802a and 802b of back ribbon 800. In such embodiments, back and front ribbons can be efficiently cut from the same roll of sheet metal because the tabs of two ribbons in parallel do not overlap. Accordingly, embodiments in which the tab spacing does not overlap between back and front ribbons result in significant material, time and cost savings.

In addition, having a different distance between the tabs of a front ribbon 700 and a back ribbon 800 facilitates efficient assembly of a module in which two strings 300 are disposed in close proximity to one another. The amount of solar energy collected per unit of exposed surface area is an important characteristic for PV modules, especially as the sizing and electronic interfaces for PV modules are increasingly standardized. In order to maximize the efficiency of a PV module per surface area, embodiments of the present disclosure include strips 300 that are arranged end-to-end to minimize the amount of sun-facing surface area that is not occupied by PV material. To facilitate this arrangement, a first end of a first string 300 is arranged in close proximity to a second end of a second string. In such an arrangement, having different spacing between the tabs of a front ribbon 700 compared to a back ribbon 800 prevents damage and electrical shorting that could otherwise result.

In some embodiments, the distance, or length for which the tabs extend from the bus interface 704 are different between front and back ribbons. For example, the tab length for the front ribbon 700 may be longer than tab lengths for the back ribbon 800. In an embodiment, even when both sets of tabs are attached to similar sized bus wiring, the tab lengths for the front ribbon 700 are longer than those of the back ribbon 800 so that the front ribbon can be bent over an edge of a PV strip 302 to which it is attached, thereby hiding the bus wiring from view when the strip is mounted in a PV module 324.

In specific embodiments, back ribbon tabs 802 may extend from the bus interface 804 by from 10 to 20 mm, from 12 to 17 mm, or from 10 to 15 mm. Front ribbon tabs 702 may extend from the bus interface 704 by 15 to 30 mm, 15 to 25 mm, or 15 to 20 mm. Front tabs 702 may be longer than back tabs 802 by at least 2 mm, by at least 4 mm, by about 5 mm, or by more than 5 mm. Widths of front and back tabs may be the same, and may be from 3 mm to 10 mm from 4 mm to 8 mm, or about 6 mm. Other differences between the back and front ribbons will be apparent from subsequent discussion of their features.

The ribbons conduct electricity generated by the PV strips 302 to bus wiring. Accordingly, the ribbons comprise electrically conductive materials. PV modules are typically installed outdoors and may encounter a wide variety of environmental conditions, so it is desirable to select a material that is resistant to corrosion.

There are several material property considerations for a conductive ribbon, including hardness, elastic modulus, malleability, and coefficient of thermal expansion (CTE). The ribbon material should be resistant to surface damage such as scratches and gouges that could be caused by interactions with tooling during the manufacturing process, so softer conductive materials such as copper are less desirable for an exposed surface of a ribbon. On the other hand, the front ribbon 700 is bent and folded around an edge of a strip 302 in assembly, and it is desirable for the bend radius to closely conform to the edge of the strip. Accordingly, a relatively tight bend radius is desirable, which is achieved by malleable materials such as copper.

Conductive materials with a relatively low elastic modulus are desirable in order to minimize the amount of force required to bend a ribbon. Accordingly, an embodiment of the front ribbon 700 may be heat treated so that it is stiff enough to resist damage during handling, while being malleable enough to be manually bent in assembly. A ribbon material may have sufficient stiffness so that the foil body does not undergo plastic deformation when it is grasped by an end of the thin bus interface, while being sufficiently malleable to be manually bent around a corner of PV material with a corner radius of less than 1.0 mm.

PV modules are installed in a variety of environmental conditions, and the ribbons are in intimate contact with photovoltaic materials. The thermal conditions experienced by a module may be enhanced when outward-facing surfaces of the module are a dark color, which can increase the temperature of a module to significantly above the ambient air temperature. Therefore, it is desirable for a ribbon to have a CTE that approximates the CTE of materials of a photovoltaic strips to which it is attached.

To accommodate some of the competing considerations of hardness, conductivity, malleability, CTE, etc., a conductive ribbon may be a coated material. Specifically, in an embodiment of the present disclosure, a conductive ribbon may have a copper core that is plated with tin to impart surface hardness and oxidative stability while maintaining desirable tensile and CTE properties. More specifically, the ribbon may comprise a copper core having a thickness of about 100 to 150 microns, and a tin plating of about 1 to 5 microns. Accordingly, an overall thickness of a ribbon material may be between about 100 to 150 microns in some embodiments.

At least a portion of an outward-facing surface of front ribbon 700 is coated with a coating 708. The coating 708 may be an opaque material with a predetermined color that is selected to match other components of a PV module to provide a consistent, homogenous appearance.

The bus interface 704 of the front conductive ribbon 700 is oriented on the sun-facing side of a module so that it is a visible element of a PV module. Accordingly, the outward-facing surface of the front ribbon 700 has an opaque coating 708. Similarly, when a PV module is assembled, portions of the tabs 702*a* and 702*b* are exposed to the sun-facing side of the module, and may be visible in an assembled module. Accordingly, the coating 708 extends over portion of the tabs that are adjacent to the bus interface part 704. However, in an embodiment, ends of the tabs 702*a* and 702*b* are disposed behind PV material to which the ribbon is attached, so they are hidden from view in an assembled module. In such an embodiment, it is not necessary to coat the ends of the tabs of the front ribbon 700.

In various embodiments, the coating material 708 may have several different characteristics. The coating 708 should readily adhere to the outer surface material of the conductive ribbons. Because PV modules are typically exposed to direct sunlight, the coating 708 should have good UV stability, preferably one that resists cracking and fading for a duration of 20 years or more. In order to minimize potential shorting conditions, a material for coating 708 may have sufficient dielectric properties to provide effective electrical insulation at thicknesses in the tens of microns.

In the process of assembly, the conductive ribbons are exposed to a variety of environmental conditions, so it is desirable to select materials that are stable under those conditions. For example, temperatures of lamination processes may reach or exceed 150° C., and soldering processes may reach or exceed 250° C., so it is desirable to use a material for coating 708 that is stable at 250° C.

In addition, various chemicals are present in materials that are in close proximity to the conductive ribbons, such as the ECA 312. Accordingly, the material for coating 708 may be compatible with solvents and polymers present in un-cured ECA 312. In one specific embodiment, the coating 708 is highly compatible with Ethylene Vinyl Acetate (EVA). In another embodiment, the coating 708 is compatible with typical components of solder flux.

The coating 708 material may be a polymeric material that is applied in a liquid or powder form. In various embodiments, the polymer may be a catalytic polymer, or a polymer that is dissolved in a solvent. In some embodiments, coating 708 is a liquid polymeric paint. In other embodiments, the coating may be a colored sheet material that is applied to the ribbon with an adhesive or solvent bond.

As seen in FIG. 8A, in an embodiment, the back ribbon 800 has a coating 808. Although the embodiment of FIG. 8A is coated, in other embodiments, the back ribbon 800 is not coated.

In the embodiments shown in the figures of the present disclosure, back ribbon 800 is entirely disposed behind the PV strings 300. Accordingly, the back ribbon 800 may not be a visible element of a PV module.

In a process of manufacturing conductive ribbons, front ribbons 700 and back ribbons 800 may be cut or stamped from the same sheet of material. Each PV string 300 has a first end with a back side bus bar and a second end that terminates with a front side bus bar, so each PV string uses one front ribbon 700 and one back ribbon 800. In such a process, the amount of back conductive ribbons 800 is equal to the number of front conductive ribbons 700.

In an embodiment in which the front ribbons 700 are coated to a predetermined thickness, the back ribbons 800 may be coated so that they have the same thickness as the front ribbons. In addition, coatings may be applied in such a way that the ribbons are substantially level when they are stacked onto a fixture. Specifically, the ribbons may have coating material applied to the tabs as well as to the bus interface. When the bus interface is coated but the tabs are not coated, the thickness of the tab portion of the ribbons is less than the thickness of the bus interface, and a stack of such conductive ribbons would not be flat and level.

Figure 9:
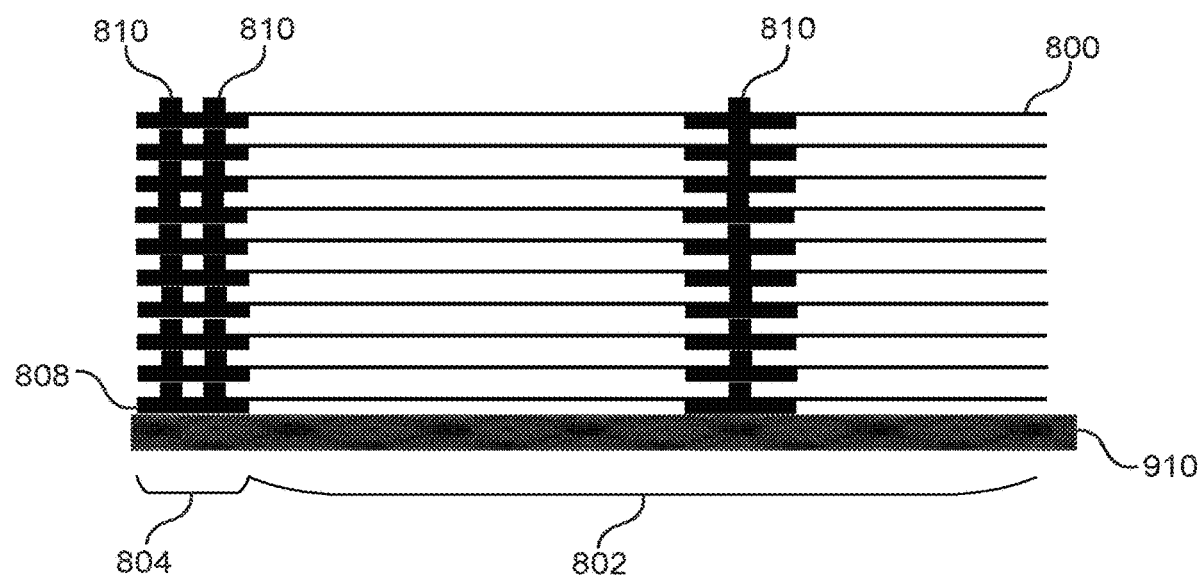
FIG. 9 illustrates a plurality of conductive ribbons stacked on a fixture.

FIG. 9 illustrates an embodiment of a plurality of back conductive ribbons 800 stacked on a fixture 900. In the embodiment shown in FIG. 9, the plurality of back ribbons 800 lie flat on the fixture. In order to achieve a flat orientation, the thickness of the bus interface 804 should be the same as the thickness of the tabs 802. Embodiments of the present disclosure have conductive protrusions disposed on both the tabs 802 and the bus interface 804, and a coating 808 is disposed on both the bus interface 804 and the tabs 802. In addition, the coating 808 on one face of the back ribbon 800 are aligned with the conductive protrusions 810 on the opposite face of the back ribbon. Accordingly, the plurality of back ribbons lie flat on the fixture 900.

Although not illustrated, front ribbons 700 have conductive protrusions 710 aligned with portions of coating 708 on opposing faces as well, so they are level when stacked. Front ribbons 700 may be stacked on the same fixture 900 as back ribbons 800, or different fixtures may be used for each ribbon type.

A level stack of conductive ribbons has several advantages. A level stack reduces the chance that conductive ribbons will be damaged when being transported or handled. A level stack of conductive ribbons provides a stable, predictable surface for automated and manual assembly processes. In addition, stacking conductive ribbons is an efficient way to store and transport a plurality of fixtures in a manufacturing process.

In an embodiment, front and back ribbons may be stacked on the same fixture. To ensure that an equal number of front and back conductive ribbons are stacked onto a fixture, it is desirable for the front and back ribbons to have the same thickness. In addition, having the same stack height for back and front ribbons on the same fixture facilitates automated processes that pick both ribbons from the same fixture.

As seen in FIG. 7B, an embodiment of front ribbon 700 includes a plurality of conductive protrusions 710. The conductive protrusions 710 protrude from a side of the front ribbon that is coupled to the front bus bar 304 of a PV string 300, which is opposite to the coated side of the ribbon.

As discussed above, an ECA 312 may be used to electrically couple conductive ribbons to busses of the PV strips 302. However, there are several potential limitations of the ECA 312 as a conductive interface. Adhesives are typically organic materials that do not conduct electricity. Instead, most ECAs derive their conductive properties from metallic particles that are embedded in the ECA. Because metallic particles lack adhesive properties, an ECA typically represents a compromise between conductivity and adhesion. Higher loading of metal particles increases conductivity, but decreases adhesive strength.

Another potential issue with ECA materials relates to barrier properties provided by the ECA material. Many conductive metal materials that are suitable for conductive ribbons are also susceptible to oxidation, which reduces conductivity. Because PV modules are potentially subject to a variety of environmental conditions and have expected lifetimes of 20 or more years, it is possible for metal materials of the conductive ribbons and busses to oxidize through an ECA. The oxygen may be introduced through pores in the ECA, or be released from the ECA itself as the ECA degrades over time.

The conductive protrusions 710 mitigate some of the shortcomings of the ECA bond described above. The conductive protrusions 710 extend outward from the surface of front ribbon 700, and either directly contact the bus material to which they are attached, or reduce the thickness of the ECA between the conductive ribbon and a bus. In other words, the conductive protrusions 710 either eliminate or reduce the amount of ECA between front ribbon 700 and a bus, which increases conductivity between the ribbon and a bus, and reduces the probability and impact of oxidation of the bus and ribbon materials.

In addition, conductive protrusions increase the surface area of the conductive contact surface, which can enhance both adhesion and conductivity. However, for some material combinations, the bond between the ECA and the conductive protrusions may be less than the bond between the ECA and the conductive ribbon surface material.

The conductive protrusions 710 may be a metal material with a high degree of conductivity, such as silver, copper, gold or aluminum. In various embodiments, the protrusions 710 may protrude from the surface of the front ribbon by from 2 to 20 microns, from 2 to 15 microns, or from 5 to 10 microns.

As seen in FIG. 7B, conductive protrusions 710 are arranged in a predetermined pattern. In particular, a plurality of conductive protrusions 710 are disposed along the bus interface 704 in an alternating offset pattern. In addition, a plurality of conductive protrusions 710 may be disposed on each of the first and second tabs 702a and 702b at a point along the tabs to which the tabs are coupled to bus wiring. However, in other embodiments, the conductive protrusions 710 are disposed on a face or portion of the tabs 702 that is not coupled to bus wiring. In such an embodiment, the conductive protrusions 710 may be present on the tabs 702 so that one or more front ribbons 700 lies flat when loaded or stacked on a fixture.

The pattern of conductive protrusions 710 may not extend across the entire length of the bus interface 704. In the embodiment shown in FIG. 7B, the bus interface 704 has bare patches at its far ends. The length of the exposed parts of the ends of bus interface 704 are greater than the distance between adjacent conductive protrusions 710 in the pattern of protrusions. In various embodiments, a bus interface 704 may have one or more bare exposed part that has a width that is at least 5, 10 or 20 times the distance between adjacent conductive protrusions 710. The bare patches may enhance adhesion when the material of the conductive ribbon 700 has greater adhesion strength to the ECA 312 than the material of the conductive protrusions 710.

The total surface area of the bus interface part 704 that is occupied by conductive protrusions 710 may be a significant portion of the surface area of the bus interface 704. For example, in some embodiments, the conductive protrusions 710 may occupy over 10%, 25%, or 50% of the surface area of the bus interface 704. In specific embodiments, the diameter, or height of the conductive protrusions 710 may be over 25% or over 50% of the width of the bus interface 704.

Conductive protrusions 710 are not present on conductive ribbons in some embodiments. In other embodiments, conductive protrusions 710 that are disposed on conductive ribbons are not present on in some connections between ribbon tabs and other conductive elements such as bus wiring. Some of the shortcomings of the ECA interface can be overcome by enhancing the barrier properties of the adhesive, providing a reducing agent in the adhesive formulation, formulating a highly conductive ECA, passivating surfaces of the conductive ribbons, etc.

A metal solder material may be used in place of the ECA, but the bond created by a metal solder can be compromised by a CTE mismatch between a ribbon and a bus. Accordingly, solder bonds are better suited to bonding same materials, or metal materials with similar CTEs, while ECA is more suitable when there is a significant CTE mismatch between the bonded materials, or when one of the materials degrades at soldering temperatures.

As seen in FIG. 8B, a back conductive ribbon 800 has a plurality of conductive protrusions 810 that may have the same characteristics as the protrusions 710 of front conductive ribbon 700 discussed above. For example, a plurality of conductive protrusions 810 may be disposed on each of the first and second tabs 802a and 802b at a point along the tabs to which the tabs are coupled to bus wiring. However, in other embodiments, the conductive protrusions 810 are disposed on a face or portion of the tabs 802 that is not coupled to bus wiring. In such an embodiment, the conductive protrusions 810 may be present on the tabs 802 so that one or more back ribbons 800 lies flat when loaded or stacked on a fixture. The conductive protrusions may be a conductive metal material, such as silver or copper.

In order to create a strong, reliable electrical and mechanical connection between PV panels and internal bussing, a conductive ribbon should have a high degree of flatness and straightness. Deviations of camber and flatness as low as 0.1 mm can have a measurable negative impact on ribbon assembly and performance. Accordingly, care should be taken to minimize handling of the ribbons in a manufacturing process. One way that handling is minimized is by stacking a plurality of pairs of front and back ribbons 700 and 800 on the same fixture.

When conductive protrusions are present on a ribbon, the protrusions may cause a ribbon to warp, for example when the ribbon is exposed to heat in use or during assembly. The warpage caused by conductive protrusions can be sufficient to compromise the performance of a conductive ribbon. However, the warpage can be constrained by applying a coating material to an opposing side of a conductive ribbon.

For example, it is apparent from comparing FIG. 8A to FIG. 8B that the coating 808 on tabs 802 is disposed directly opposite to a location of the conductive protrusions 810 on the other side of the conductive ribbon 800. Similarly, a first surface of the bus interface 804 has a plurality of conductive protrusions 810, while the opposite second surface of the bus interface 804 is covered with coating 808. In an embodiment, the coating 808 is applied to ribbon before the conductive protrusions 810 are applied to prevent warp that would otherwise occur when the conductive protrusions are formed. Accordingly, a coating 808 provides several technological advantages.

Figure 10:
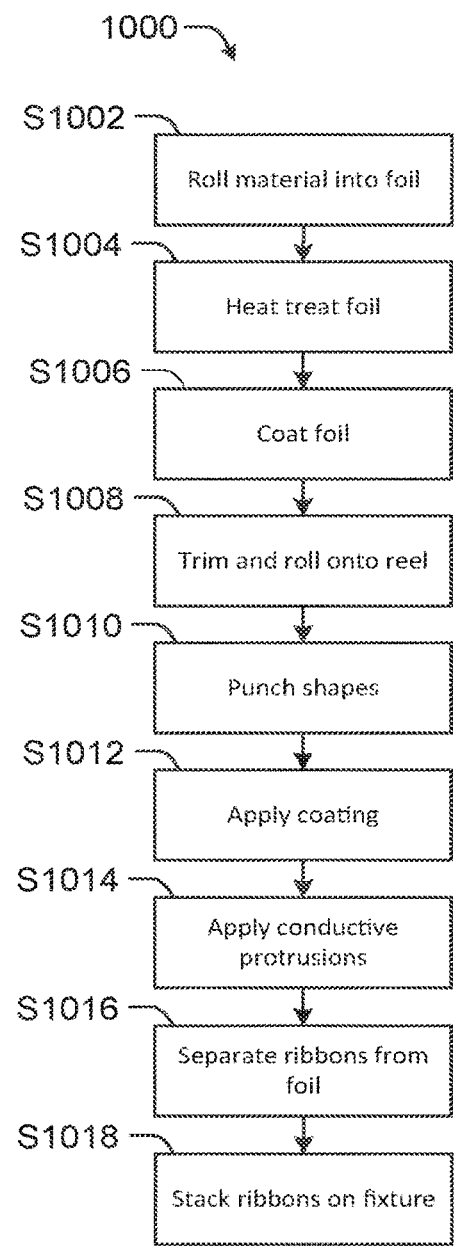
FIG. 10 is an exploded view of a photovoltaic module.

FIG. 10 illustrates an embodiment of a process 1000 for forming a conductive ribbon. Copper wire or plate is rolled to create a flat foil with a thickness of about 100 to 150 microns at S1002. The foil may be heat treated at S1004 so that it has a flexural modulus appropriate for bending the tabs around a far edge of a string so that the shape of the tabs closely conforms to the shape of the corner of the far edge, while retaining enough stiffness to minimize unintentional plastic deformation when assembling a PV module.

The copper foil is coated at S1006 by a hot dip or electroplating process, and trimmed and rolled onto a reel at S1008. The foil reel is fed into a stamping machine that punches out net shape e-ribbons at S1010. The machine may punch out front and back ribbon pair shapes simultaneously from the same portion of foil on the reel, and the conductive ribbons may be stamped so that they remain attached to the foil.

The reel is then fed into a coating apparatus that applies the coating to one side of the ribbons attached to the foil at S1012. A coating may be applied to both the front and back ribbons. Conductive protrusions are then applied to the opposite side of the foil at S1014. The conductive protrusions may be applied by melting a conductive metal onto a surface of the foil. The foil may then pass through a straightening set of rollers and then to a punch which separates the back and front ribbon from the reel at S1016. Individual e-ribbons are then stacked onto fixtures for shipment and insertion into stringers at S1018.

Assembled Module

Figure 11:
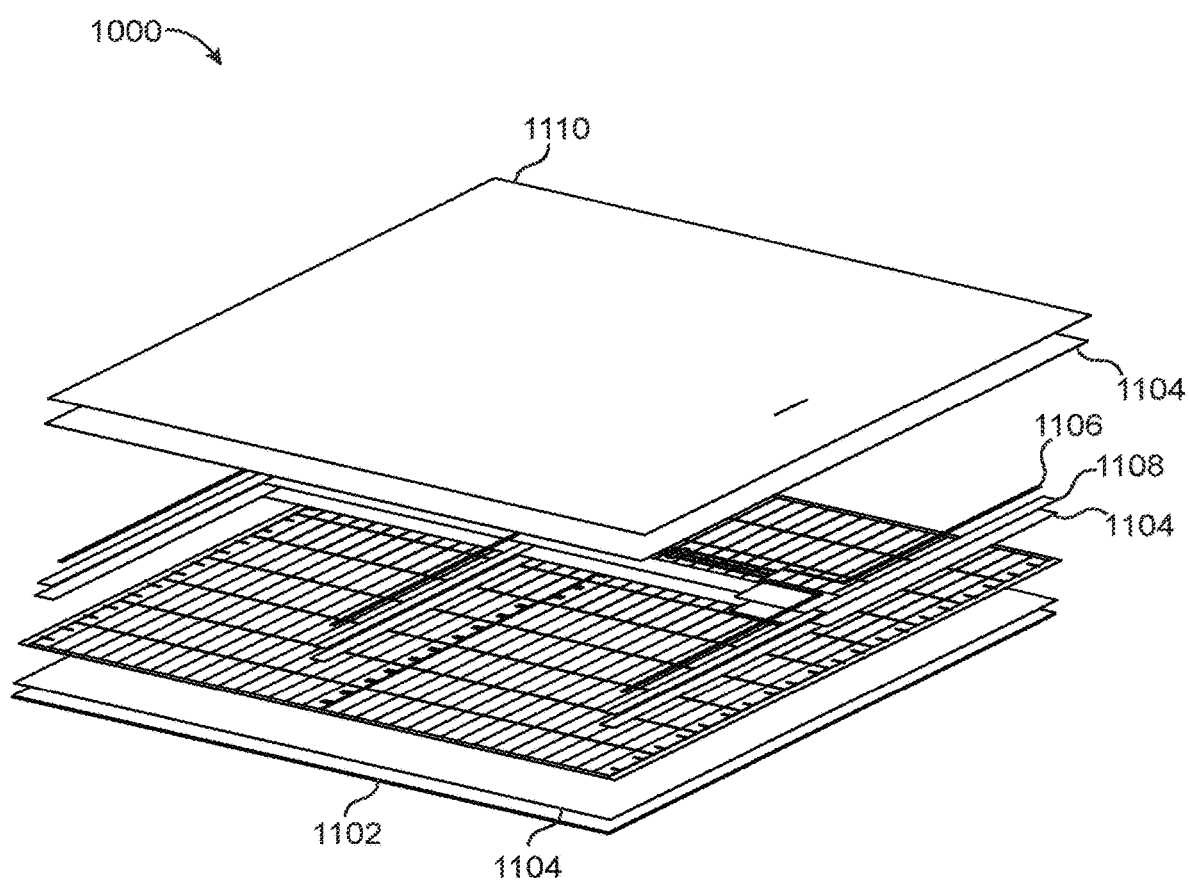
FIG. 11 is a back view of a photovoltaic module.

FIG. 11 illustrates a back-facing view of components of an embodiment of a PV module 1100. An outer surface of PV module 1100 is a glass panel 1102, and a translucent laminate material 1004 is disposed between the glass panel and the aperture side of PV elements. In an embodiment, the laminate material 1104 is a sheet of EVA film that seals the PV elements when the PV module 1100 is assembled. When a PV module is assembled, heat and pressure may be applied to components of the module shown in FIG. 11 so that the laminate material seals and bonds to adjacent components.

PV elements are disposed directly beneath the laminate 1104. In an embodiment of the present disclosure, the PV elements are a plurality of strings 300, each of which comprises a corresponding plurality of strips 302. Each of the strings 300 has a front ribbon 700 disposed on a first end of the string, and a back ribbon 800 disposed on an opposing second end of the string.

Bus wiring 1106 is disposed behind the plurality of strings 300. The bus wiring 1106 connects front and back terminals of the PV strings 300 to circuitry of the PV module. Although the present embodiment uses flat bus wiring 1106, other embodiments may use other wire shapes.

A plurality of insulation patches 1108 are disposed between the PV material and the flat bus wiring 1106 to prevent electrical shorts between conductive elements of the PV module 1100. A second translucent element 1004 is disposed behind the bus wiring 1106 and insulation patches 1108, followed by a backsheet 1110 which forms an outer backing surface of the PV module.

Figure 12:
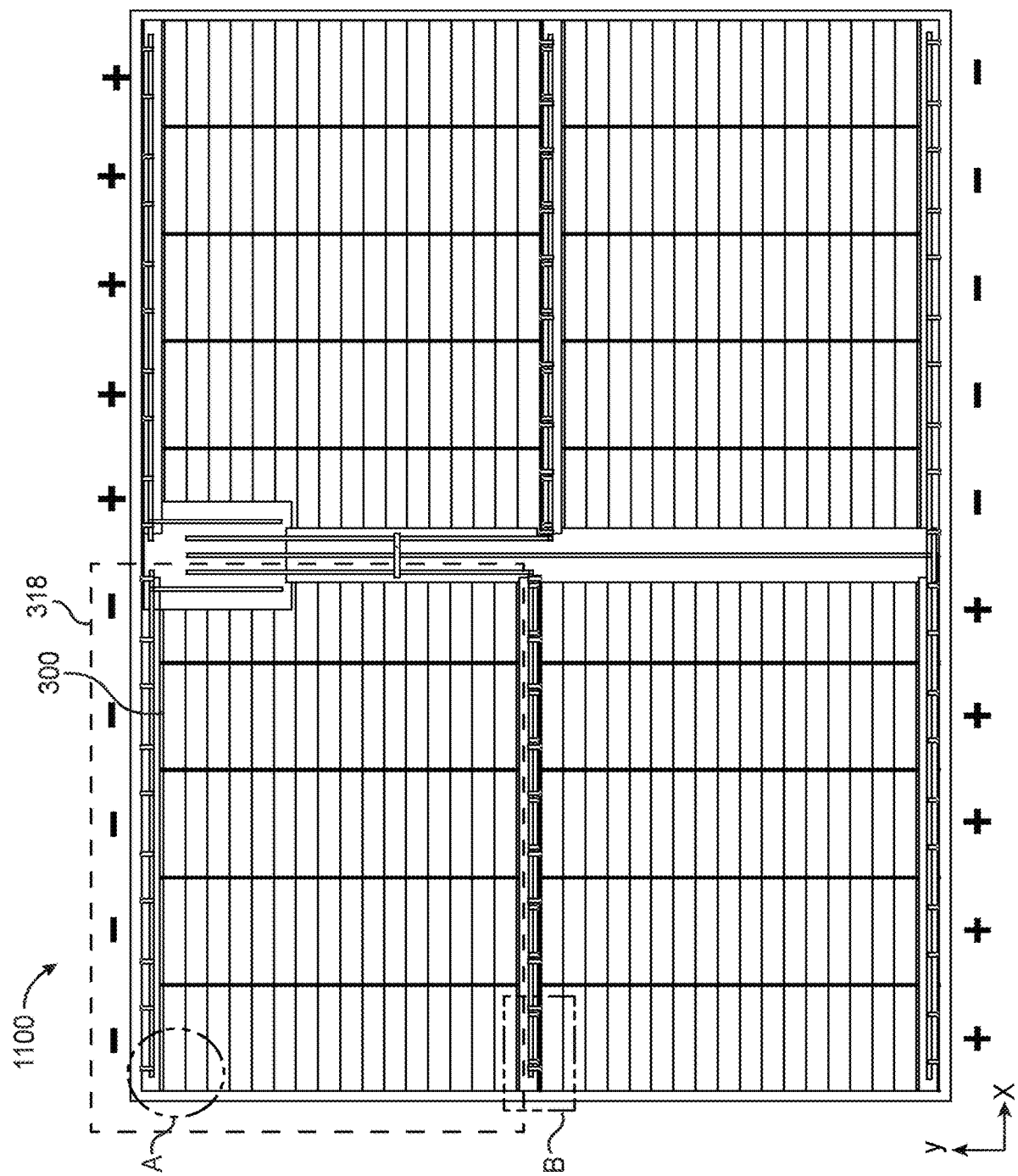
FIG. 12 illustrates a conductive ribbon folded over an end of a string.

FIG. 12 illustrates a back view of a PV module 1100. As seen in the embodiment of FIG. 12, five PV strings 300 are arranged in parallel to one another to create four separate zones 318. Each of the PV strings 300 of each zone 318 have opposing terminal ends that are aligned with each other and commonly coupled to the same bus wire 1106. Zones are arranged so that a front terminal of one zone 318 is adjacent to a back terminal of an adjacent zone.

For example, the front terminal end of the zone in the lower left sector of FIG. 12 is directly adjacent to the back terminal end of the zone in the upper left sector, or the X direction as indicated in the figure. Similarly, the back and front terminal ends of each zone 318 are in an opposite orientation from the orientation of an adjacent zone in the Y direction. As a result, each terminal end of each zone 318 is adjacent to a terminal end of another zone with an opposite polarity.

Figure 13:
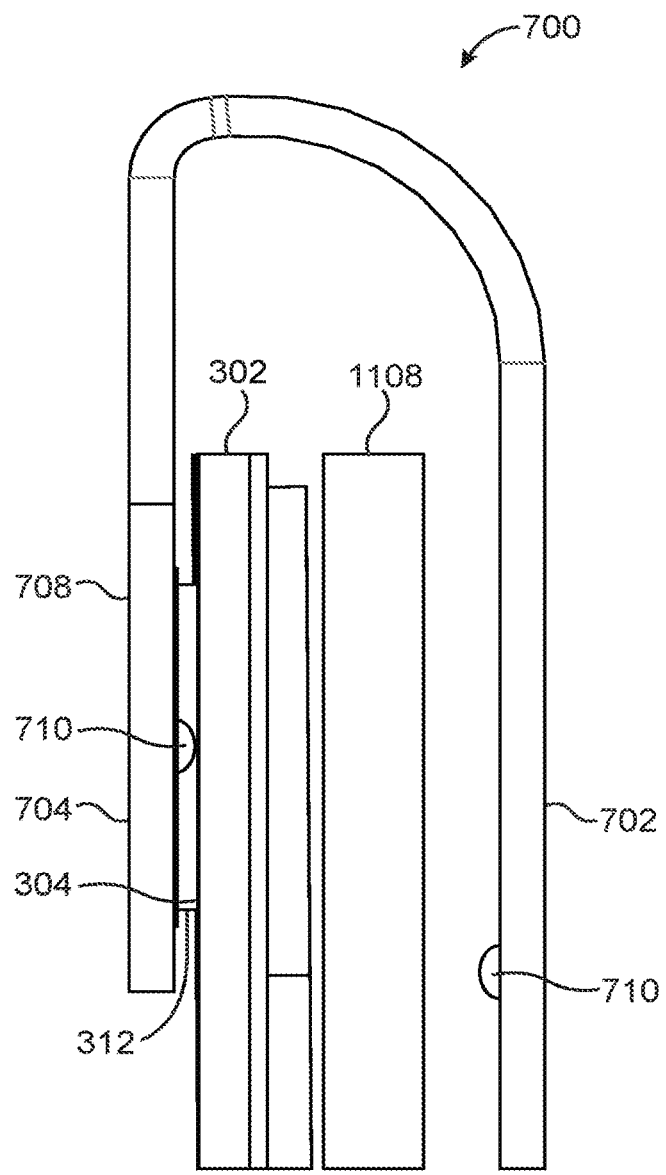
FIG. 13 illustrates a conductive ribbon configuration.

FIG. 13 is a detail view of section A of FIG. 12, and shows a front terminal end of a PV strip 302 of a PV string 300 according to an embodiment of the present disclosure. A bus interface portion 704 of front ribbon 700 is coupled to a front bus bar 304 through a layer of ECA 312. Tabs 702 of the front ribbon 700 extend past the edge of the PV strip 302 by a predetermined distance that may be 1.0 mm or less, or between 0.5 mm and 2.0 mm. The gap created by the predetermined distance may prevent damage to the PV material.

In an embodiment, a tool is used to form the bend the front ribbon 700 over the edge of the PV strip 302. The tool may ensure that the predetermined gap is provided while fixing the ribbon material in place so that the ECA bond is not compromised when the tabs are bent. The tabs may be bent 180 degrees from a flat orientation so that they extend in an opposite direction compared to a flat orientation of the ribbon 700.

An opaque coating material 708 is present on outward-facing portions of the front ribbon 700 that are visible when a PV module 1000 is assembled. The entire bus interface portion 704 of the front ribbon is coated with the opaque coating 708. In addition, portions of the tabs 702 are coated with coating 708 so that the coated portion of the tabs is contiguous with the coating over the bus interface 704. The portions of the tabs 702 that are coated are portions that that are folded over the edge of the PV strip 302. In an embodiment in which a coating material is present in those areas of the conductive ribbon 700, no reflective surfaces of the conductive ribbon are visible in an assembled PV module 1000.

An insulation patch 1108 is disposed between a backside surface of the PV strip 300 and an inner surface of front ribbon 700. The insulation patch 1108 may be secured to the backside surface of the PV strip 302 by an adhesive or laminate material such as EVA. In the embodiment shown in FIG. 12, conductive protrusions 710 that extend from a surface of the bus interface 704 are aligned with the front bus bar 304 of the PV strip 302, and provide a low resistance connection between the front ribbon 700 and the PV strip. In contrast, the conductive protrusions 710 on tabs 702 face inwards towards insulation patch 1008. Accordingly, in the embodiments shown in FIG. 12, the conductive protrusions 710 on the tabs 704 are not in a conductive path between the ribbon 700 and a bus of a PV strip 302.

Returning to FIG. 12, the tabs 702 of front ribbons 700 disposed on outer edges of the PV strings 300 on a top edge of the module are connected to a first flat bus wire 1106. Similarly, tabs 802 of back ribbons 800 along the top edge are coupled to a second bus wire 1106. In contrast, the tabs 702 and 802 of respective front and back ribbons 700 and 800 that are disposed along bottom edge of the module 1100 are commonly coupled to the same bus wire 1106. Similarly, front ribbons 700 and back ribbons 800 of adjacent edges of adjacent zones 318 are commonly coupled to the same bus wire 1106.

The connection between tabs of the front and back ribbons and the bus wiring 1006 may be a solder connection or an ECA connection. When an ECA connection is present, conductive protrusions disposed on the tabs may be aligned with the ECA material. In some embodiments, the conductive protrusions on tabs of a conductive ribbon may be present on an opposite face of the ribbon from the conductive protrusions on the bus interface part of the same ribbon. In other words, conductive protrusions on a ribbon's tabs may be on the opposite face from the conductive ribbons on the ribbon's bus interface.

Figure 14:
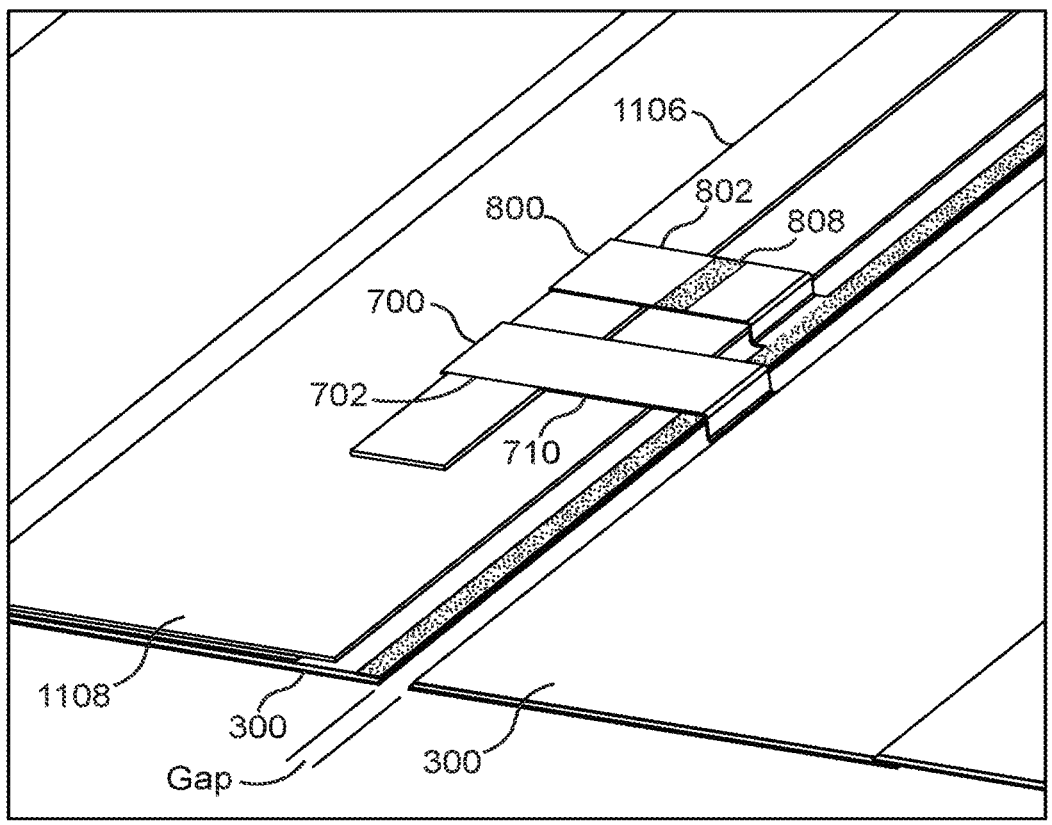
FIG. 14 illustrates components of a photovoltaic module.

FIG. 14 is a detail view of section B of FIG. 12, and shows ribbon configurations for adjacent PV strings 300. A bus interface 804 of the back ribbon 800 is coupled to the back bus bar 306 of an edge strip 302 so that the coated surface of the back ribbon faces outwards from the back face of the PV material. An insulation patch 1108 is coupled to the back surface of the PV material, and may be retained by an adhesive or laminate material such as EVA.

Tabs 802 of back ribbon 800 extend away from bus interface 804, fold over the insulation patch 1008, and are coupled to the bus wiring 1106. Tabs 702 of the front ribbon 700 fold over from the front of the strip 302 to which they are attached to the back surface of the strip 302 to which the back ribbon 800 is attached.

Accordingly, the tabs 802 of the back ribbon 800 attached to a first string 300 are aligned in parallel with the tabs 702 of the front ribbon 700 of a second string 300 that is adjacent to the first strip. Therefore, in an embodiment in which opposing terminals of PV strings 300 are adjacent to one another, tabs of respective conductive ribbons are routed in the same direction, and are commonly coupled to the same bus wire 1006.

In more detail, tabs 702 of front ribbon 700 have two opposing 90 degree bends so that they are arranged in parallel to unbent tabs 802 of a back ribbon 800 in assembly. In such an orientation, both of the front and back ribbons can be connected to the same bus wire 1006 in close proximity to one another. The connection may be a solder connection or an ECA connection.

An opaque coating 808 is visible on the exposed surface of the bus interface 804 and the tabs 802 of back ribbon 800. Conductive protrusions 710 protrude outwards from the exposed face of tabs 702 of the front ribbon 700, while conductive protrusions 810 on tabs 802 of back ribbon 800 face into the insulation patch 1008. Although not shown in FIG. 14, the surface of front ribbon tab 702 that is coupled to bus wire 1006 is not coated.

A gap is present between the adjacent strings 300. The gap may accommodate dimensional changes from temperature variation, e.g. expansion of the PV material during a lamination process. Although a portion of front tab 702 passes across the gap between strings, when the portion of that tab is coated with an opaque coating material 710, no reflective surfaces are visible through the gap in an assembled PV module 1100. In various embodiments, the gap may be from 1 to 10 mm, from 1 to 5 mm, from 1 to 3 mm, or about 2 mm. The surface of backsheet 1110 that is visible through the gap may have a color that is the same as a color of the coating 710. In an embodiment, that color is black.

The conductive ribbons may be components of a mechanical sub-structure in a PV panel 1100. In assembly, the conductive ribbons are a rigid mechanical link between strings 300. In one embodiment, conductive ribbons are physically bonded to strings 300 through an ECA 312, and two tabs of each conductive ribbon are soldered to bus wiring 1106. Bus wiring 1106 runs across both ends of every string 300, and each zone has one bus wire that runs across each of its poles. Accordingly, the conductive ribbons, bus wiring, and PV strings comprise a rigid mechanical sub-structure of a PV module 1100 that is especially resistant to deformation in the primary plane of the PV module, which is the X/Y plane of FIG. 12. Other configurations, e.g. configurations in which bus wiring is round, are not sufficiently resistant to deformation in the primary plane to prevent dislocation in a lamination process.

Components of a PV module 1100 may be exposed to significant forces during a lamination process. In a lamination process, pressure and heat are applied to PV module components so that laminate material 1104 flows to fill gaps and spaces between components, creating a sealed laminate structure. In an embodiment, all of the components shown in FIG. 11 are compressed in a single lamination process.

A lamination process applies a significant amount of force to components of a PV module. The mechanical sub-structure, including the conductive ribbons, prevent the module components from moving during a lamination process. When the mechanical sub-structure is present, including the conductive ribbons and flat bus wires, it may prevent strips from moving relative to one another by less than 5 mm, or by less than 2 mm.

FIG. 15 illustrates several additional components of a panel 1100, including a junction box 1502, a long frame piece 1504, a short frame piece 1506, and a corner fame piece 1508. In an assembled panel 1100, long frame pieces 1504 are connected to short frame pieces 1506 by corner pieces 1508. The front surfaces of the frame pieces that are disposed on an aperture side of the panel 1100 may have portions that extend over edges of glass, laminate and backing materials to provide an even appearance.

Returning to FIG. 12, the efficient and unique arrangement of components in a PV module 1100 provides a number of technological advantages. Use of the same bus material 1106 to connect tabs of conductive ribbons from opposite poles of adjacent zones 318 achieves simultaneous series connections between separate zones and parallel connections between strings 300 within the same zone, as seen in FIG. 5, while minimizing the number of connections and the amount of materials in a panel. Therefore, a PV module 1100 according to an embodiment of the present application is highly efficient and reliable.

In addition, elements of the panel arrangement of the panel 1100 provide a PV panel that does not have reflective surfaces that are visible from the aperture side of the panel. Tiling of PV strips in each of the strings hides metallic bus bars that are visible in conventional panels. Although a PV strip 302 at each end of a PV string 300 has one bus region for which a metallic bus bar would be exposed, embodiments of the present application completely cover that bus bar with a conductive ribbon, and all surfaces of the conductive ribbon that are visible in an assembled PV module are covered with an opaque coating material. Meanwhile, the PV strings are arranged in the panel so that no gaps greater than a few millimeters are present between adjacent strips and strings, and what gaps are present are minimal in size. Components of the PV module may be attached to form a mechanical sub-structure that retains components in place during a lamination process to ensure that gaps and alignment are maintained to a high tolerance.

Apart from the coated surfaces of the conductive ribbons, no bus wiring is visible from an aperture side of a PV module 1100. The only reflective elements than can be perceived from the aperture side of a PV module 1100 according to an embodiment of the present disclosure are the fingers that run across the surface of PV material, and the fingers are too small to be noticeable from a distance of 10 feet or more, so that fingers are not perceived as reflective surfaces from most viewing positions of a typical PV installation.

Embodiments of the present disclosure provide several improvements to PV module technology. The expansion of photovoltaic technologies is limited by aesthetic elements, including color variation and the presence of reflective surfaces. An embodiment of this disclosure is substantially free of reflective elements that are visible from a distance of at least 10 feet. In addition, due to the spacing and alignment of components, embodiments of the present disclosure minimize the amount of material behind the PV elements that is visible, and maximize efficiency by minimizing gaps between elements.

Module and Ribbon Features

In an embodiment, a photovoltaic (PV) string comprises a plurality of PV strips coupled in series, each strip of the plurality of strips including first and second end strips disposed at opposing ends of the string and at least one middle strip disposed between the first and second end strips, wherein each strip comprises: an aperture side; a front bus bar disposed on the aperture side; a back side opposite to the aperture side; and a back bus bar disposed on the backside, wherein the back bus of every middle strip overlies the front bus of an adjacent strip in the string; a front conductive ribbon coupled to the front bus of the first end strip, the front conductive ribbon comprising: a bus interface disposed over the front bus of the first end strip; a bus side that faces the aperture side of the first end strip; an exposed side opposite to the bus side; at least one tab extending from the bus interface; and an opaque coating that covers the exposed side of the bus interface and extends across at least a portion of the at least one tab.

In an embodiment, the front conductive ribbon is attached to the front bus bar of the first end strip by an electrically conductive adhesive (ECA). In an embodiment, the front conductive ribbon comprises a first pattern of conductive protrusions protruding from the bus side of the bus interface that are part of an electrical connection between the front conductive ribbon and the front bus of the first end strip. In an embodiment, the front conductive ribbon comprises a second pattern of conductive protrusions disposed on the bus side of the at least one tab. In an embodiment, every conductive protrusion on the bus side is directly opposite to a portion of the opaque coating on the exposed side. In an embodiment, the front conductive ribbon has a copper core coated with tin.

In an embodiment, the at least one tab includes a first tab and a second tab that is asymmetric to the first tab. In an embodiment, the at least one tab extends from 75 mm to 200 mm from the bus interface. In an embodiment, the PV string further comprises a back conductive ribbon coupled to a back bus of the second end strip. In an embodiment, the back conductive ribbon comprises: a second bus interface that completely covers the back bus of the second end strip; a second bus side that faces the backside of the second end strip; a second exposed side opposite to the second bus side; a second tab extending from the second bus interface, the second at least one tab extending from the second bus interface; and a second opaque coating that covers the second exposed side of the bus interface and at least a portion of the second tab. In an embodiment, the back conductive ribbon is coupled to the back bus of the second end strip by an ECA, and the back conductive ribbon comprises a third pattern of conductive protrusions protruding into the ECA. In an embodiment, the front conductive ribbon comprises a first plurality of tabs and the back ribbon comprises a second plurality of tabs, and a distance between adjacent tabs of the first plurality of tabs is different from a distance between adjacent tabs of the second plurality of tabs. In an embodiment, the at least one tab of the front conductive ribbon is folded over onto the back side of the first end strip, and the at least one tab of the back conductive ribbon extends towards the front first end strip on the back side of the string. In an embodiment, the front conductive ribbon comprises a metal foil having a thickness of from 75 microns to 200 microns.

An embodiment of an electrical interconnect structure for conducting electricity from a photovoltaic cell comprises a front conductive ribbon that attaches to a front bus bar on a front side of a photovoltaic cell, the front conductive ribbon comprising: a bus interface having a shape that completely covers the front bus bar of the photovoltaic cell; a bus side that faces the front bus bar of the photovoltaic cell; an exposed side opposite to the bus side; at least one tab extending from the bus interface; and an opaque coating that covers the exposed side of the bus interface and extends across at least a portion of the at least one tab.

In various embodiments, the front conductive ribbon comprises a first pattern of conductive protrusions protruding from the bus side of the bus interface that are part of an electrical connection between the front conductive ribbon and the front bus of the first end strip; the front conductive ribbon comprises a second pattern of conductive protrusions disposed on the bus side of the at least one tab; the structure has a back conductive ribbon configured to attach to a back bus bar on a backside of the photovoltaic cell, the back conductive ribbon comprising: a second bus interface having a shape that completely covers the back bus bar of the photovoltaic cell; a second bus side that faces the back side of the second end strip; a second exposed side opposite to the second bus side; and a second tab extending from the second bus interface. In an embodiment, the back conductive ribbon comprises a third pattern of conductive protrusions disposed on the second bus interface. In an embodiment, the front conductive ribbon comprises a first plurality of tabs and the back ribbon comprises a second plurality of tabs, and a distance between adjacent tabs of the first plurality of tabs is different from a distance between adjacent tabs of the second plurality of tabs.

An embodiment of a photovoltaic (PV) module comprises a string that includes a plurality of PV strips coupled in series, each of the plurality of strips including first and second end strips disposed at opposing ends of the string and at least one middle strip disposed between the first and second end strips, wherein each strip comprises: an aperture side; a front bus bar disposed on the aperture side; and a back side opposite to the aperture side; wherein the back bus bar of every middle strip covers the front bus bar of an adjacent strip in the string so that the only front bus bar that is not covered by an adjacent strip is a front bus bar of the first end strip; a front conductive ribbon that completely covers the front bus bar of the first end strip, the front conductive ribbon comprising: a bus interface that completely covers the front bus bar of the first end strip; and an opaque coating that covers an exposed side of the bus interface, a frame; a transparent covering disposed over the aperture side of the string; and a backsheet that covers the backside of the string; wherein the transparent covering, the backsheet, and the string of PV strips are mounted within the frame.

In an embodiment, all visible surfaces of the front conductive ribbon are covered by the opaque coating. In an embodiment, the plurality of strips in the string are coupled to one another using an electrically conductive adhesive (ECA), and the front ribbon is coupled to the front bus bar of the first end strip by the ECA. In an embodiment, the module comprises a plurality of zones, and each zone comprises a plurality of strings that are coupled in parallel.

In an embodiment, every zone of the plurality of zones is adjacent to at least one other zone, and gaps between the adjacent zones are 5 mm or less. In an embodiment, the plurality of zones includes a first zone and a second zone, and the first and second zones are arranged so that the first end strip of the first zone is adjacent to the second end strip of the second zone, and wherein a back ribbon is disposed over a back bus bar of the second end strip of each string the second zone. In an embodiment, the front ribbon comprises two tabs extending from the bus interface, the back ribbon comprises two tabs extending from a bus interface, and a space between the two tabs of the front ribbon is different from a space between the two tabs of the back ribbon. In an embodiment, each of the front and back ribbons of every string in the first and second zones has at least one tab, wherein the at least one tab of the back conductive ribbons of the second zone are mechanically and electrically coupled to a flat wire, and wherein the at least one tab of the front conductive ribbons of the first zone are mechanically and electrically coupled to the flat wire.

In an embodiment, the at least one tab of respective front ribbons of every string in the first zone are mechanically and electrically coupled to a second flat wire.

In an embodiment, mechanical connections between the strips in each string, between the tabs of the front and back conductive ribbons and the first conductive wire, and between the at least one tab of respective front ribbons and the second flat wire form an interconnected mechanical sub-structure that constrains the strings in each zone. In an embodiment, the mechanical sub-structure constrains adjacent strings so that, when the strings are laminated between two EVA layers, gaps between the adjacent strings move less than 2 mm.

In an embodiment, the PV module further comprises a plurality of zones including a first zone and a second zone, wherein the second end strip of the first zone is adjacent to the first end strip of the second zone, and wherein back conductive ribbons are disposed over back bus bars of the second end strips. In an embodiment, for each string in the first zone, the front conductive ribbon folds over an edge of the first end strip and extends over a back surface of the first end strip. In an embodiment, for each string in the second zone, at least one tab of the front conductive ribbon passes through a gap between the first and second zones and extends over the backside of an adjacent string in the first zone. In an embodiment, every front conductive ribbon of the first zone and every front conductive ribbon of the second zone has the same shape.

In an embodiment, a photovoltaic (PV) module comprises a plurality of strings, each string that including a plurality of PV strips coupled in series, each of the plurality of strips including first and second end strips disposed at opposing ends of the string and at least one middle strip disposed between the first and second end strips, wherein each strip comprises: an aperture side; a front bus bar disposed on the aperture side; a back side opposite to the aperture side; and a back bus bar on the back side, wherein the back bus bar of every middle strip covers the front bus bar of an adjacent strip in the string so that the only front bus bar that is not covered by an adjacent strip is a front bus bar of the first end strip; a front conductive ribbon that completely covers the front bus bar of the first end strip, the front conductive ribbon comprising: a bus interface that completely covers the front bus bar of the first end strip; and an opaque coating that covers an exposed side of the bus interface, a back conductive ribbon disposed over the back bus bar of the second end strip; a first zone and a second zone each comprising a plurality of strings that are coupled in parallel; a frame; a transparent covering disposed over the aperture side of the plurality of zones; and a backsheet that covers the backside of the plurality of zones, wherein the transparent covering, the backsheet, and the string of PV strips are mounted within the frame, and wherein all visible surfaces of each front conductive ribbon are covered by the opaque coating.

In an embodiment, the first and second zones are arranged so that the first end strip of the first zone is adjacent to the second end strip of the second zone, and for each string in the first zone, the front conductive ribbon folds over an edge of the first end strip and extends over a back surface of the first end strip. In an embodiment, for each string in the second zone, at least one tab of the front conductive ribbon passes through a gap between the first and second zones and extends over the backside of an adjacent string in the first zone.

Bifacial Module

Embodiments of the present application are directed to a bifacial module, which is a PV module that uses bifacial PV cells. Such a module receives solar energy from both the front and back sides of the module.

When a bifacial module catches light on the back side, it is typically reflected light, as opposed to direct light from the sun. The reflected light may be reflected off of grass, rocks, dirt, piers etc., and as such, it may be diffuse light. However, reflected light captured by the back surface of a bifacial module is not the same as diffuse light from the sky, which tends to be very homogeneous. Because a module is usually mounted relatively close to the ground, items that are close to the module tend to shade it from diffuse (or reflected light). As such, the diffuse light that shines on the back of the module is typically non-homogeneous from either shading from a nearby structure or brighter because of a nearby surface (shiny rock, concrete slab, metal conduit etc). Accordingly, the backside of a bifacial module may receive light of varying intensities across its surface.

FIG. 16 illustrates a bifacial PV module 1600 according to an embodiment of the present disclosure. FIG. 16A shows an enlarged view of detail A of FIG. 16. FIG. 16B shows an enlarged view of detail B of FIG. 16. FIG. 16C shows an enlarged view of detail C of FIG. 16. FIG. 16D shows an enlarged view of detail D of FIG. 16.

The module includes four zones 1602, each comprising six strings 1604 of 19 strips. In contrast to the module shown in FIG. 12, positive (+) and negative (−) terminals 1603, 1605 of all of the zones of the bifacial module are spatially aligned with one another.

The zones are electrically connected in series. Like the module of FIG. 12, ends of the zones that are adjacent to one another in the middle of the module (FIG. 16D) are mutually connected to a single bus bar through conductive ribbons disposed on the ends of the strings. Positive and negative terminals of zones on opposing ends of the module (FIGS. 16A-C) are coupled through wiring that is routed through a middle portion of the module.

The middle portion routing may be accomplished differently by various embodiments. The wires in the routing may be flat, or round or square to minimize exposed surface area. The wires may be retained by a transparent polymer material. The central routing may be entirely disposed in a gap between adjacent zones, or it may be routed over PV material.

In one embodiment, the middle portion of the panel is free of PV material on a back surface, and wire routing is disposed in the middle portion. In such an embodiment, the front side of the panel may similarly be free of PV material, or may have unifacial strips disposed only on the front surface. In such an embodiment, aluminized back surfaces of the PV strips may be aligned with the middle portion, so that wiring is routed over the aluminized backside surfaces.

Consolidating opaque elements of the module into a central routing portion has several advantages. It is possible to stack certain opaque elements, so consolidating them to a single location can reduce the surface area that is covered by the opaque elements. Another advantage is that routing wires through a central non-PV portion facilitates junction boxes disposed at each end of the non-PV portion. Parts of the junction boxes may be disposed over the non-PV portion without shading any PV material. In addition, when wiring is consolidated in the non-PV portion, junction boxes can be directly connected to the wiring between PV elements, reducing the cost and complexity of additional wiring.

Another advantage is for attachment to a solar tracking apparatus. A solar tracking apparatus typically comprises piers, which are vertical pillars spaced apart from one another and connected through horizontal bars or torque tubes. Several modules are typically mounted between two adjacent vertical pillars and are attached to the torque tube at the midpoint of a panel. Accordingly, in an embodiment of this disclosure, the torque tube completely shades the middle portion of the panel.

Aligning the non-PV part of the back surface of a panel with the torque tube of a tracking system minimizes the impact of the non-PV part, which would be completely shaded by the torque tube. Such a structure has an additional advantage of preventing a portion of the PV material on the backside of the PV module from being permanently shaded by the torque tube. Permanently shaded PV material can compromise the performance and longevity of a module.

Embodiments of a bifacial module include multiple parallel strings that are protected by a single diode. Here, in the particular embodiment of FIG. 16, such a diode is shown as the embedded diode 1650 of the enlarged detail view shown in FIG. 16C.

Specifically, a unique feature of a parallel string structure with diode protection is that it handles uneven illumination better than a conventional module. In a conventional module, the string current is limited by the weakest link.

However, with the parallel structure, the non-shaded strings compensate for the shaded string allowing the module to produce more power and energy. This is true for front side issues like soiling, debris, shading, and degradation.

Moreover, an unexpected benefit to a shingled module structure is that all the advantages associated with such a structure are enhanced with respect to the backside of the module. In an embodiment, two separate diodes respectively protect back and front faces of all strips in a zone.

In another embodiment, a single bypass diode structure may protect both faces of a zone. Note that this is shown in the particular embodiment of the embedded diode 1650 of FIG. 16C.

The benefits of protecting a zone with a single bypass diode are especially important in a bifacial module. Due to the tremendous potential variation in materials that reflect light onto the backside of a module, variations in light intensity are greater on a backside surface than a frontside surface, which typically is positioned to receive direct sunlight.

Figure 16B:
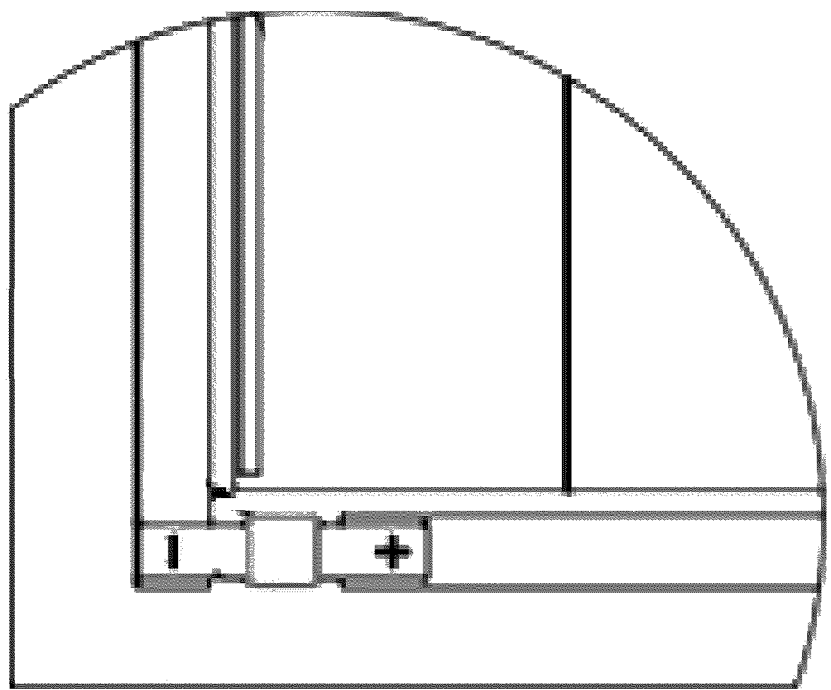
FIGS. 16A-D show enlarged details of FIG. 16.
Figure 16A:
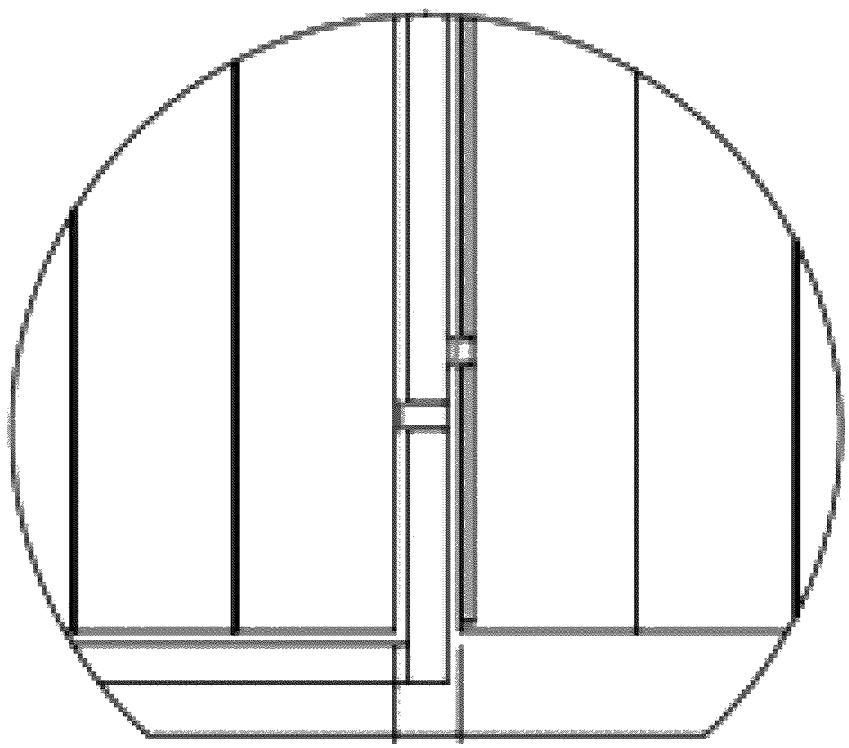
Figure 16D:
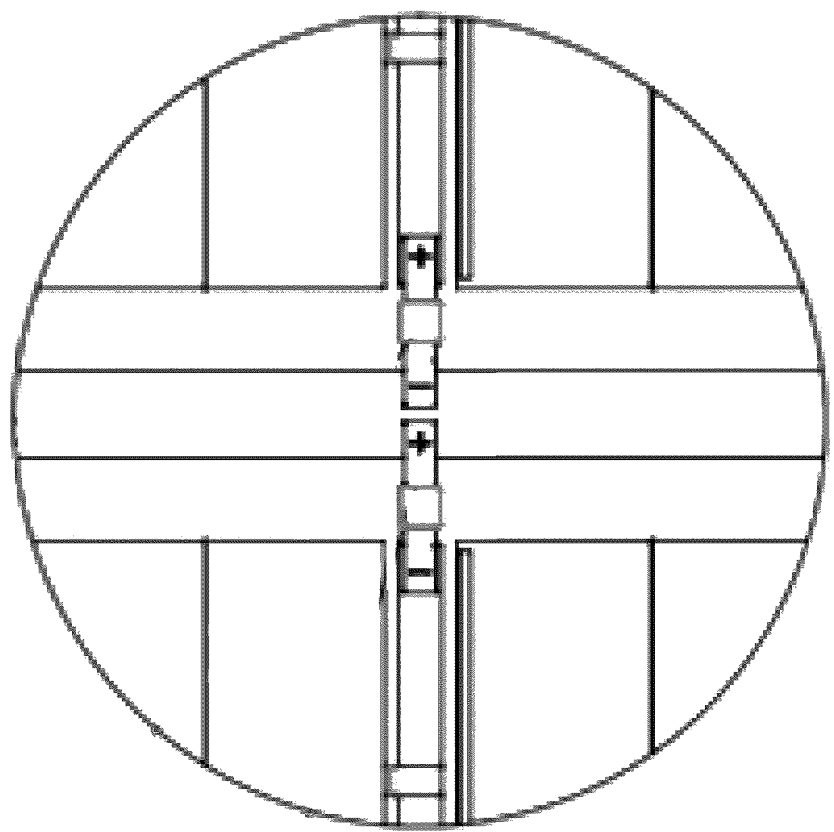
Figure 16C:
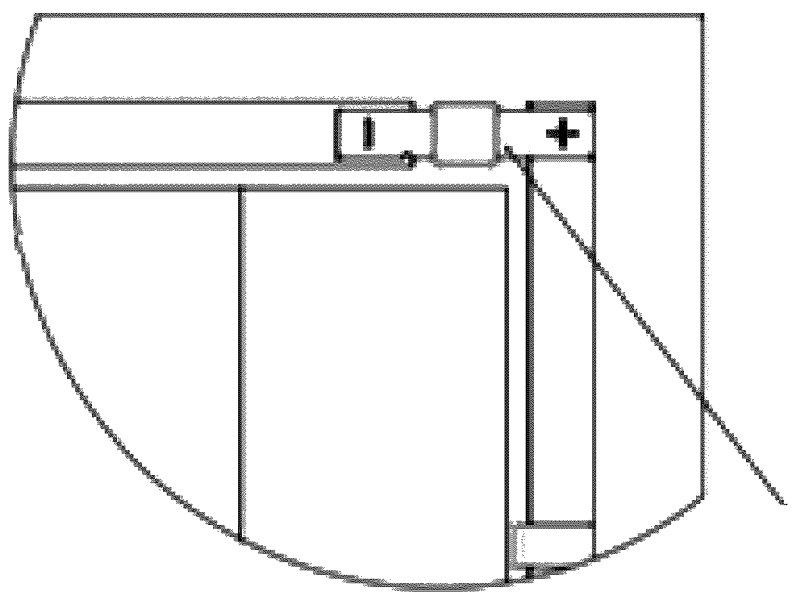

While the particular embodiment of FIGS. 16-16D show a single bypass diode structure protecting both front and back sides of a zone as being an embedded diode, this not required. According to alternative embodiments, the zone-protecting single bypass diode structure need not be embedded in the module, and other diode configurations are possible.

And while the particular embodiment of FIGS. 16-16D show the single bypass diode structure protecting the zone as being present on the module back side, this is also not required. According to alternative embodiments, the zone-protecting single bypass diode structure may be present on the module front side.

Still further alternatively, the single bypass diode structure protecting the front and back sides of a zone may not be present on the face of the module. For example, such a zone-protecting single bypass diode structure may be present in a junction box.

Figure 17:
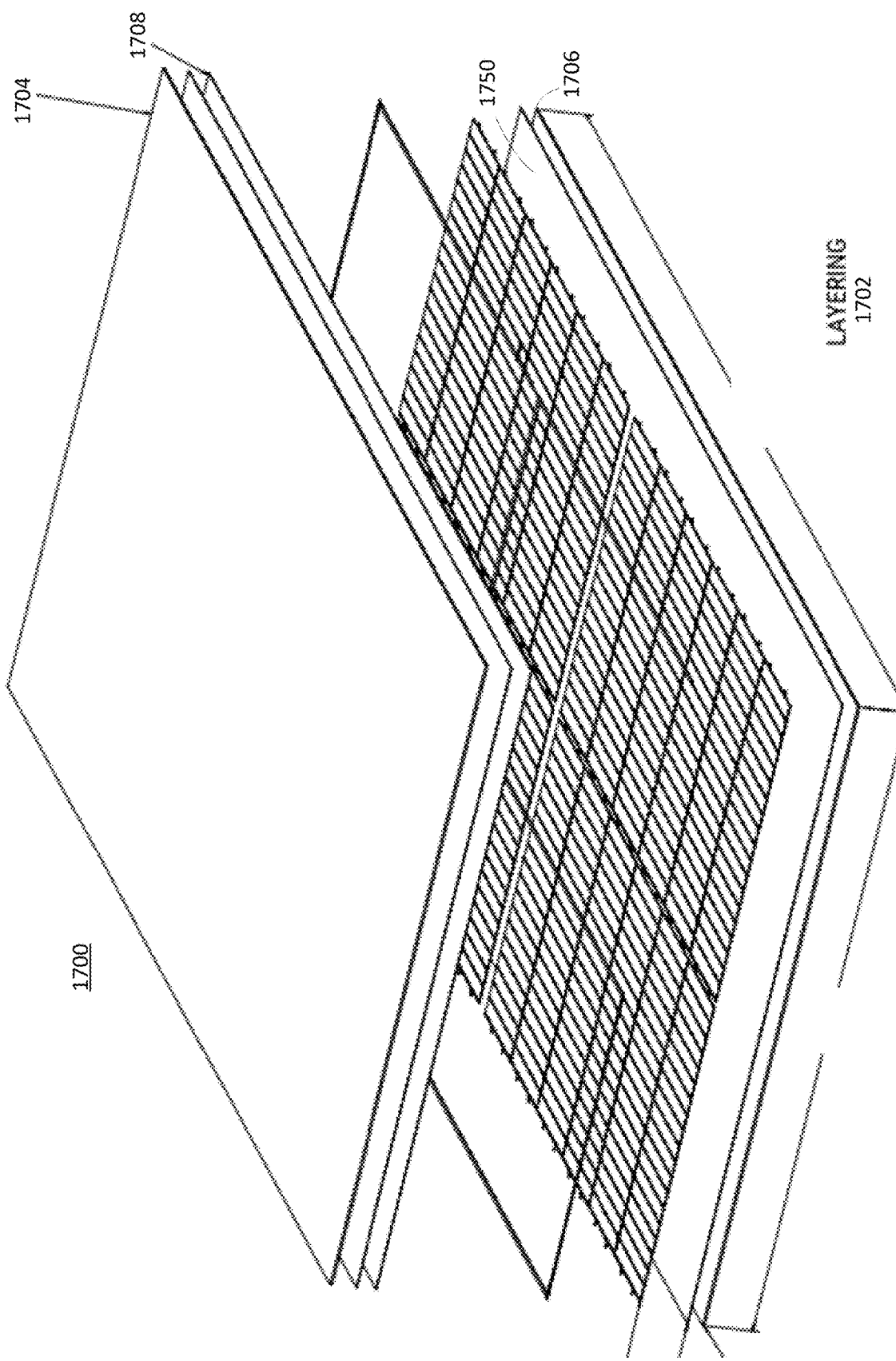
FIG. 17 illustrates an embodiment of a bifacial photovoltaic module.

FIG. 17 illustrates an exploded view showing the layering 1702 of an embodiment of a bifacial photovoltaic module 1700. Here, the top layer 1704 comprises an optically transparent material such as glass, as does the bottom layer 1706.

Sandwiched therebetween are the strips separated from a solar cell and assembled into strings, strings assembled in parallel into zones, and the wiring configured as described above in connection with FIGS. 16-16D. EVA layer 1708 on the front side is also shown.

Figure 18:
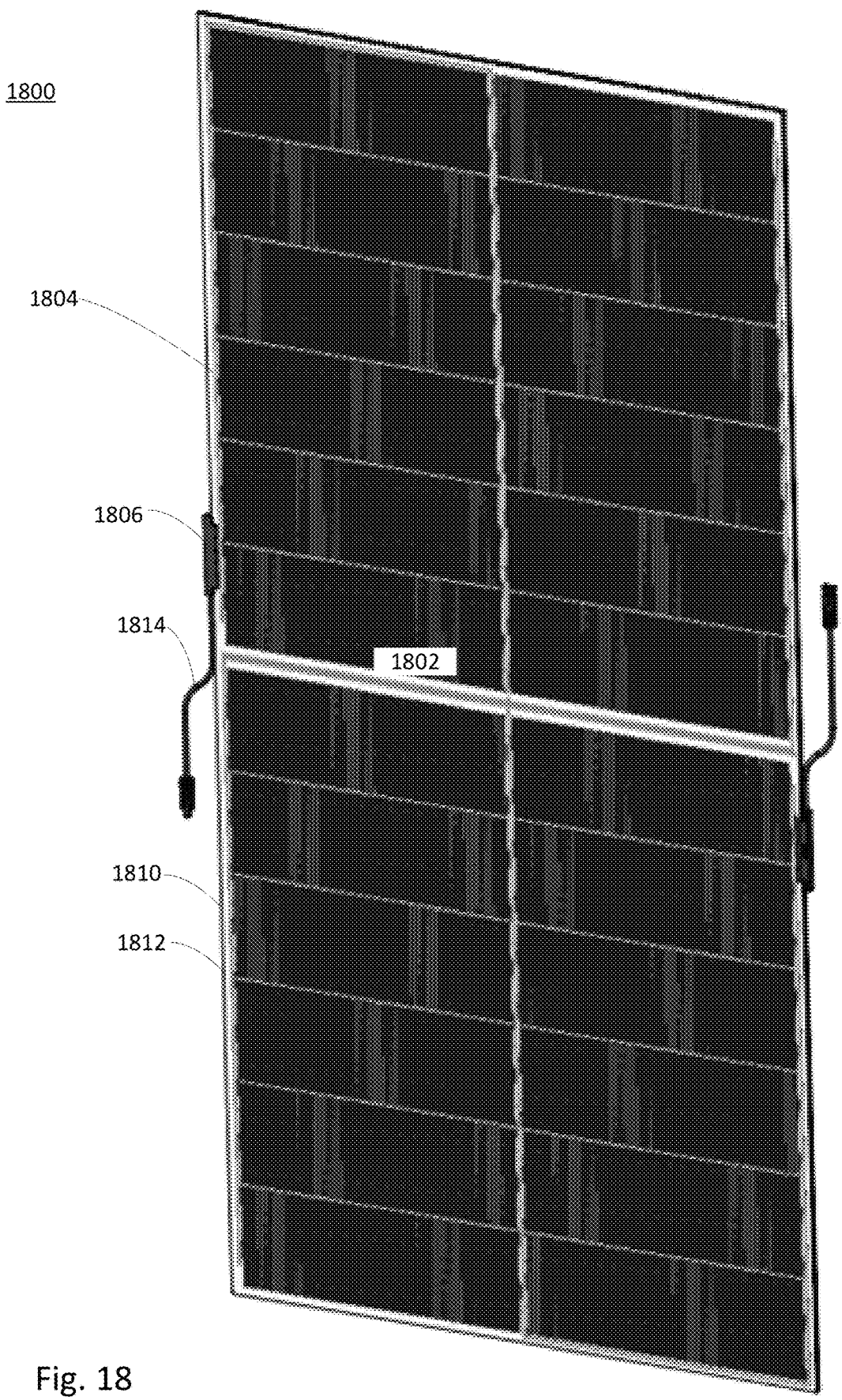
FIG. 18 illustrates a front perspective view of embodiment of a bifacial photovoltaic module.
Figure 18A:
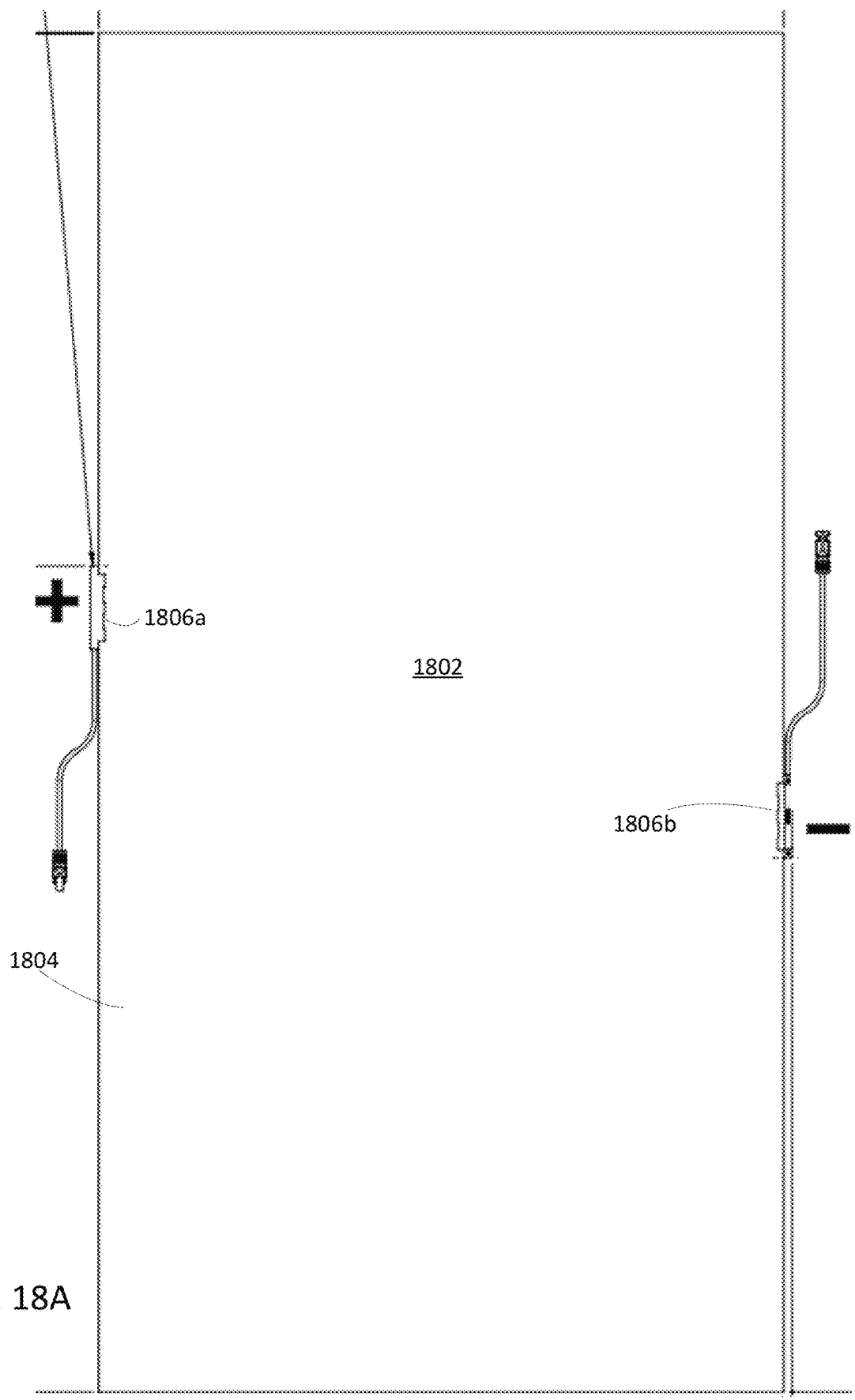
FIG. 18A illustrates a back plan view of the module of FIG. 18.

In a conventional PV module, a junction box is disposed on the backsheet of a module, typically at an upper portion or a corner of the backsheet. In contrast, FIG. 18 shows an embodiment of a PV module 1800 that has a middle portion 1802 on the backside 1804 that is free of PV elements, and has a junction box 1806 disposed at each end of the PV-free portion. The embodiment has a positive junction box 1806a and a negative junction box 1806b. The junction boxes are disposed on edges 1810 of the module so that they do not obscure the PV material exposed by the back surface of the module. In an embodiment, the junction boxes are mounted directly to a frame 1812 that encloses the PV elements.

An advantage of having a junction box disposed on a side of a module is improved connections between adjacent modules. When multiple modules are arranged side-by-side and electrically coupled to one another, the modules are easily connected by attaching connectors 1814 of adjacent junction boxes. This greatly simplifies interconnections between modules, and reduces resistive losses compared to conventional interconnections.

Figure 19:
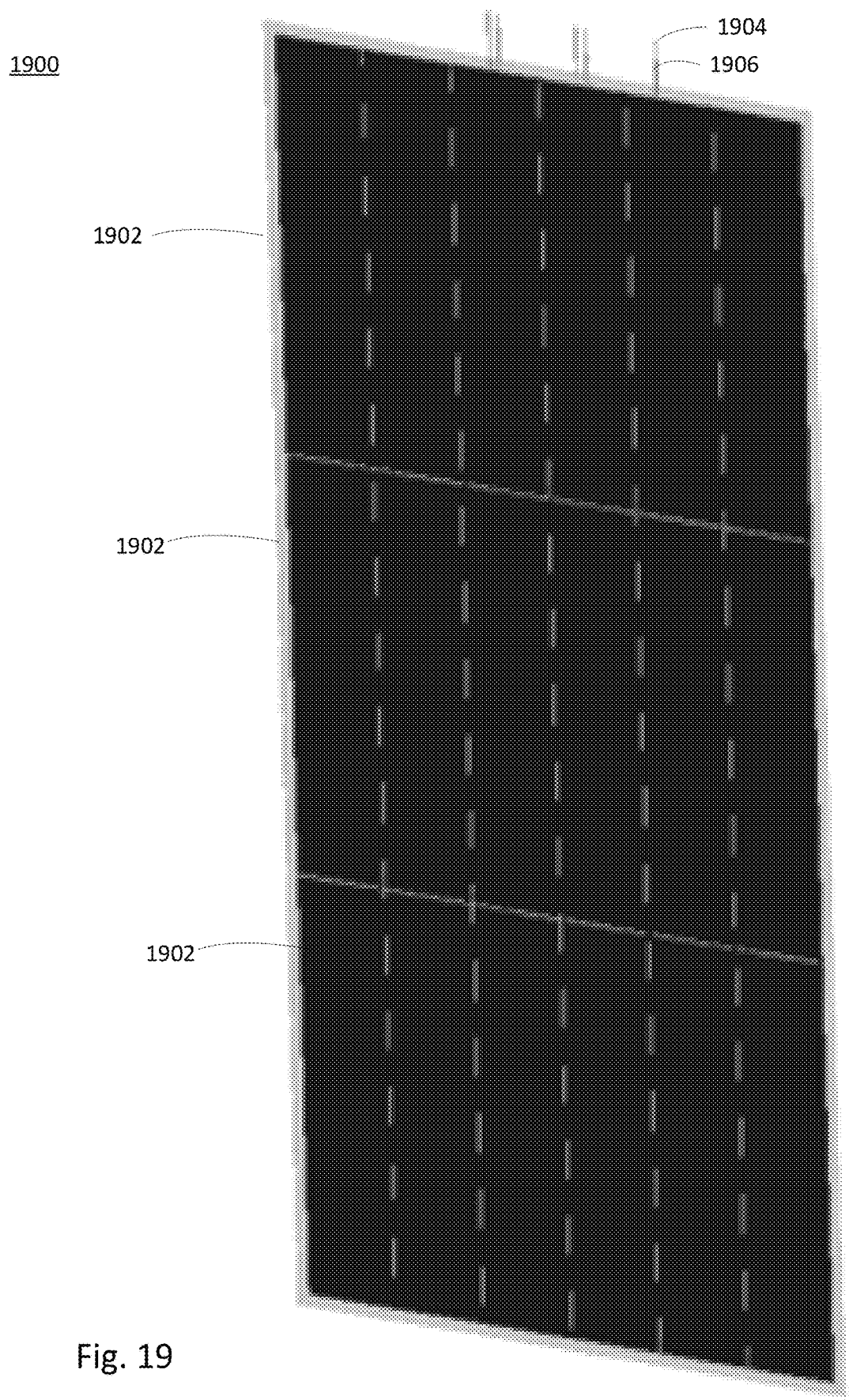
FIG. 19 illustrates a front perspective view of an embodiment of a bifacial photovoltaic module.
Figure 19A:
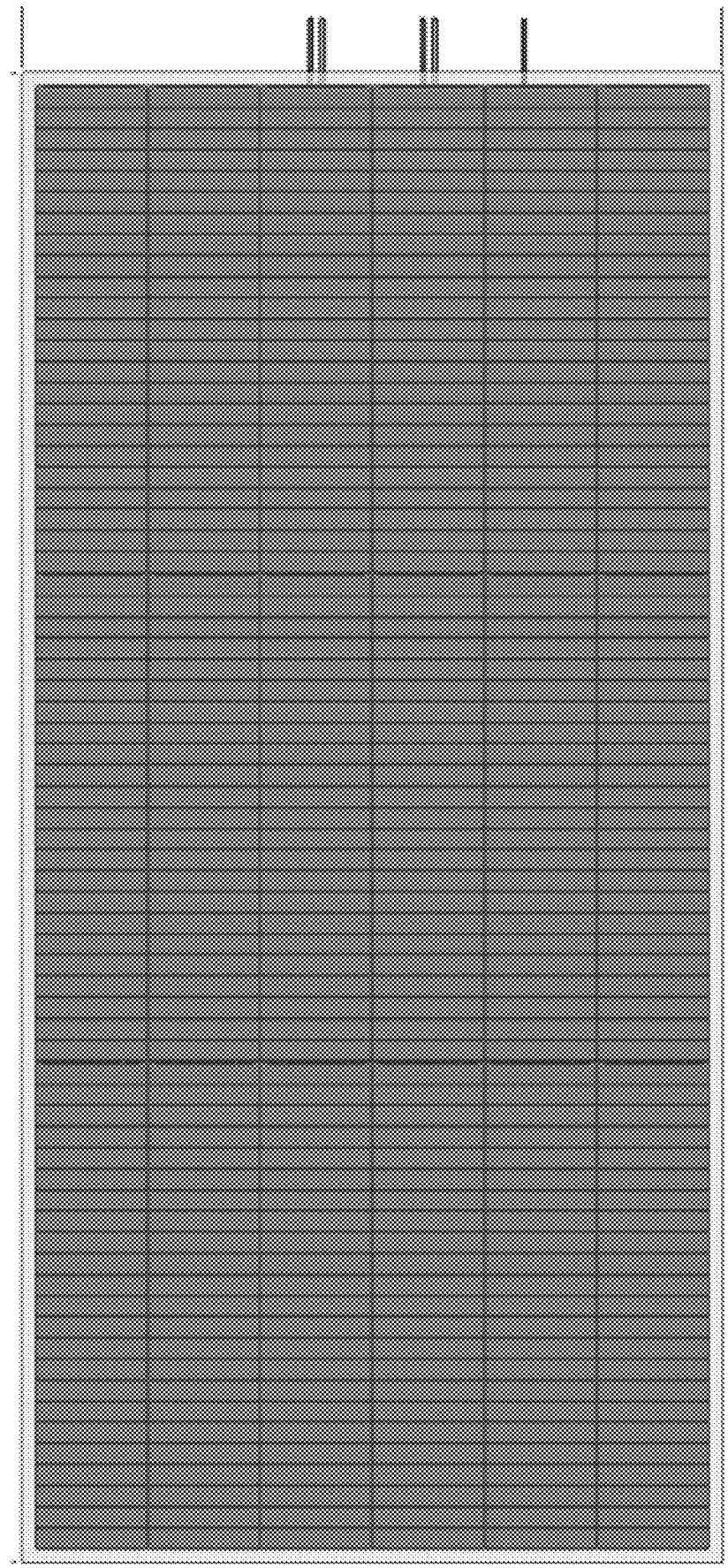
FIG. 19A illustrates a front plan view of the module of FIG. 19.
Figure 19B:
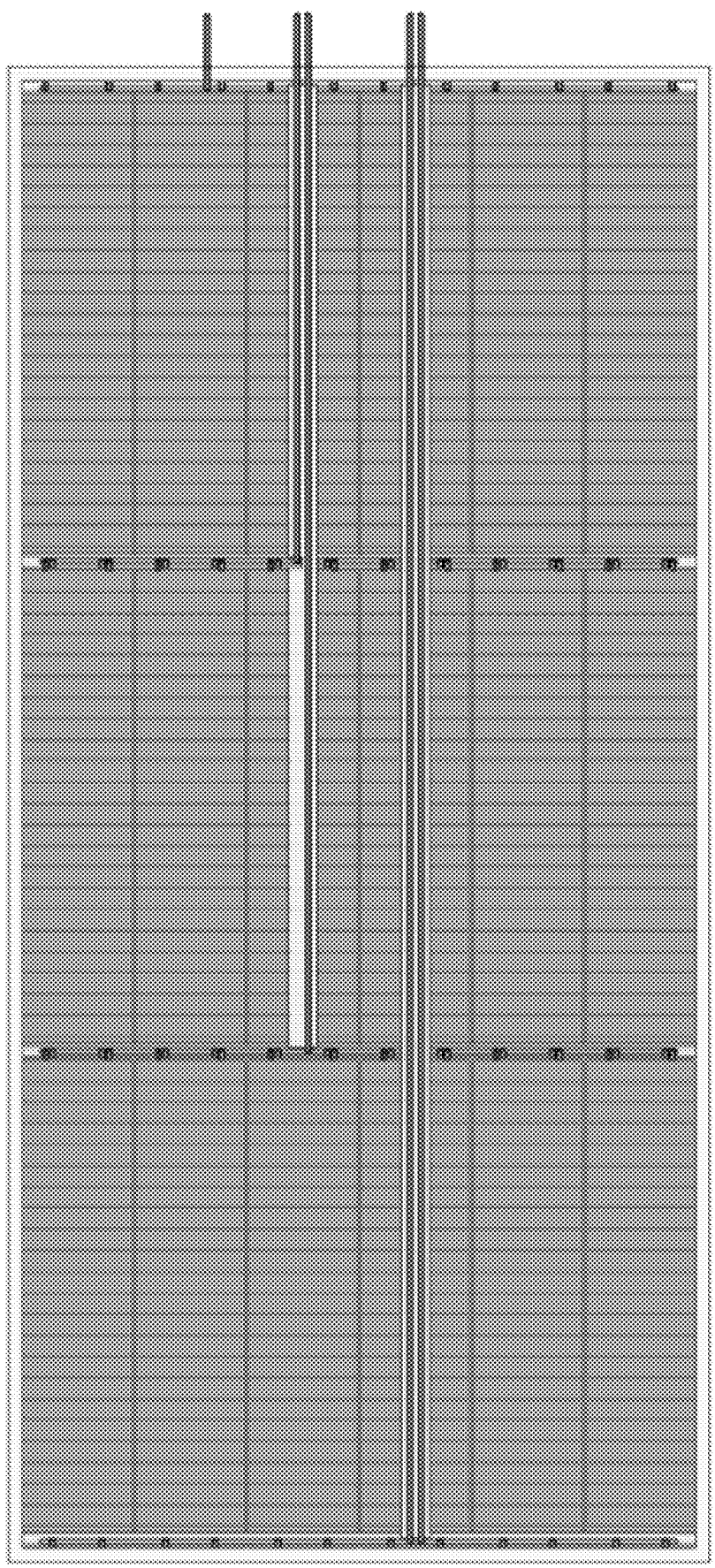
FIG. 19B illustrates a rear plan view of the module of FIG. 19.

FIG. 18 illustrates a particular embodiment of a PV module with wiring routed horizontally in the short direction of the module. FIG. 19 illustrates an embodiment of a PV module 1900 with wiring routed vertically in the long direction of the module.

The module 1900 has three zones 1902 each comprising six strings that are arranged vertically, and each zone has at least one wire lead 1904 extending from the zone. The wires 1906 are disposed over PV material on the backside 1908 of the bifacial module. In an embodiment, the wires are mounted on a transparent material such as an EVA sheet that insulates the wires from the backside PV material. An example of such a backside EVA sheet is shown as 1750 in FIG. 17. In such an embodiment, wiring is the only opaque element that covers the PV material.

Figure 21:
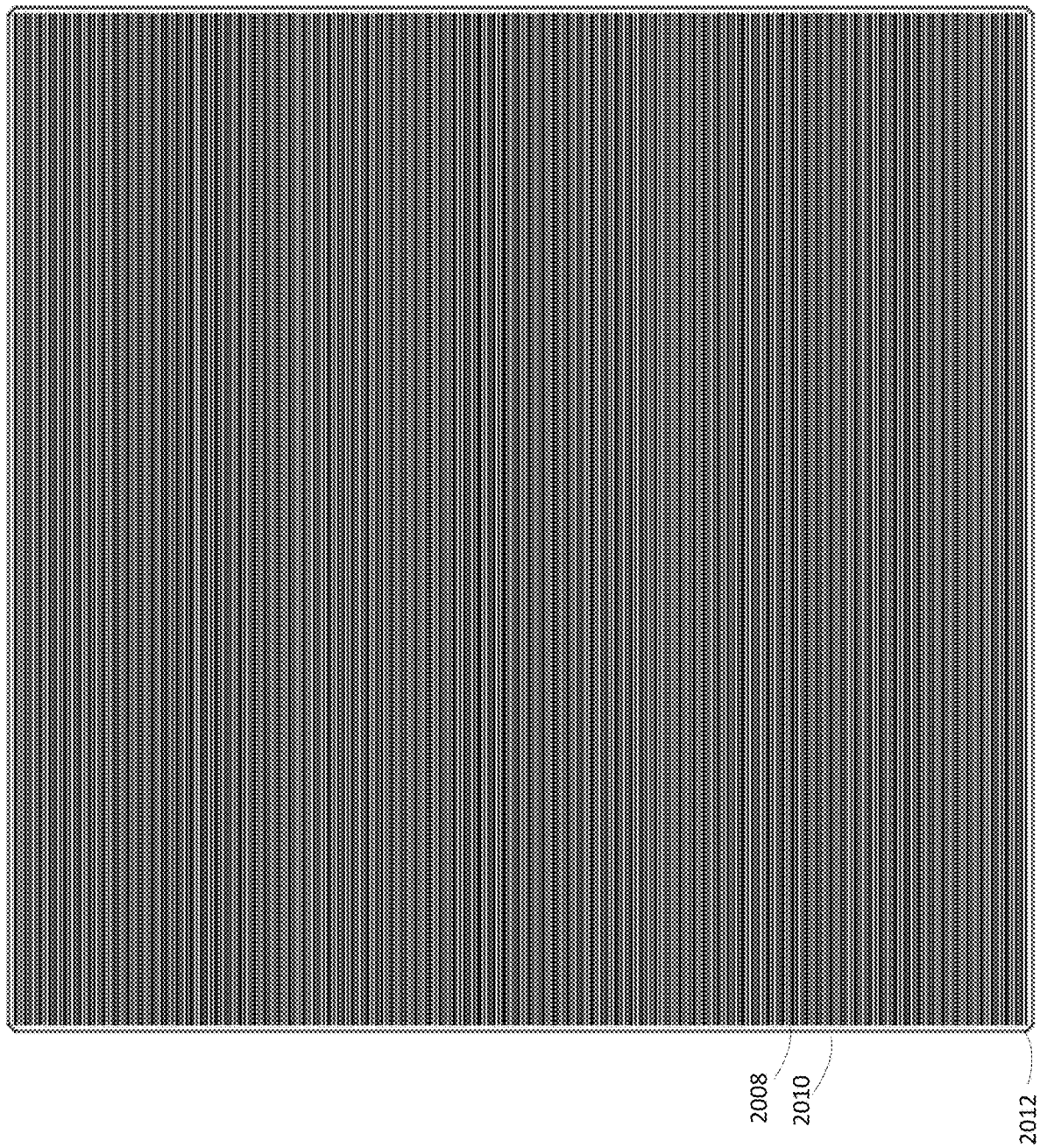
FIG. 21 illustrates an embodiment of a bifacial cell for a photovoltaic module.
Figure 22A:
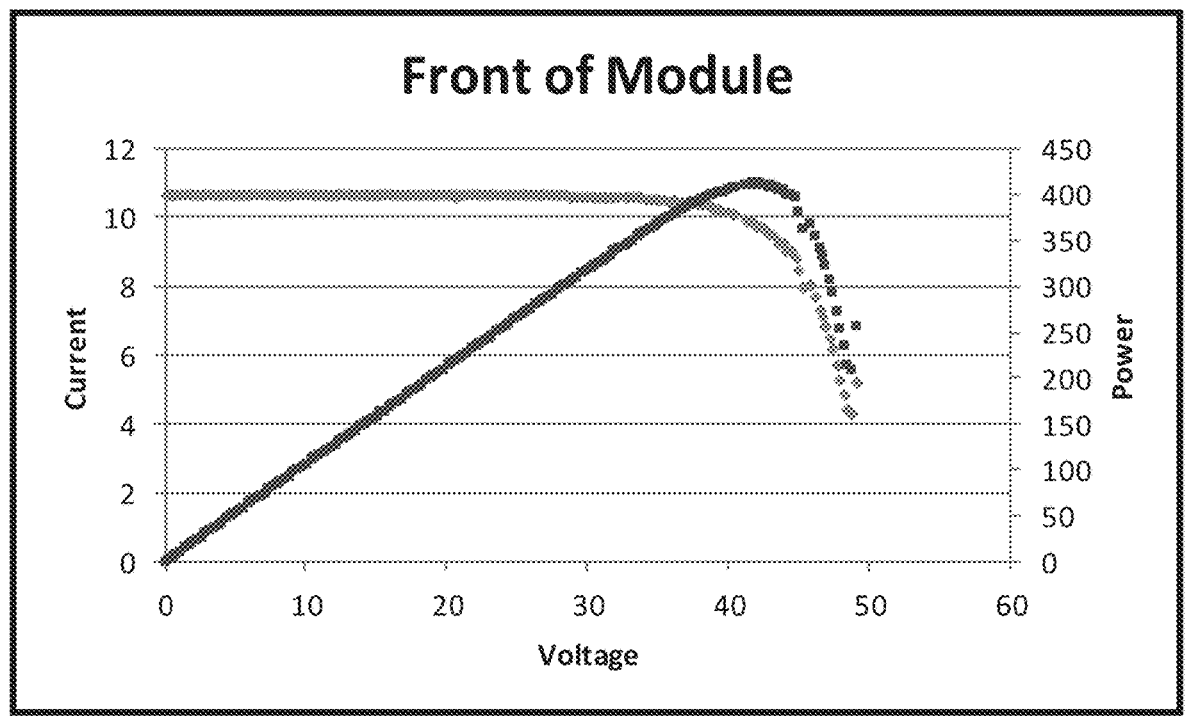
FIGS. 22A-B illustrate front and back test results respectively, of a bifacial photovoltaic module.
Figure 22B:
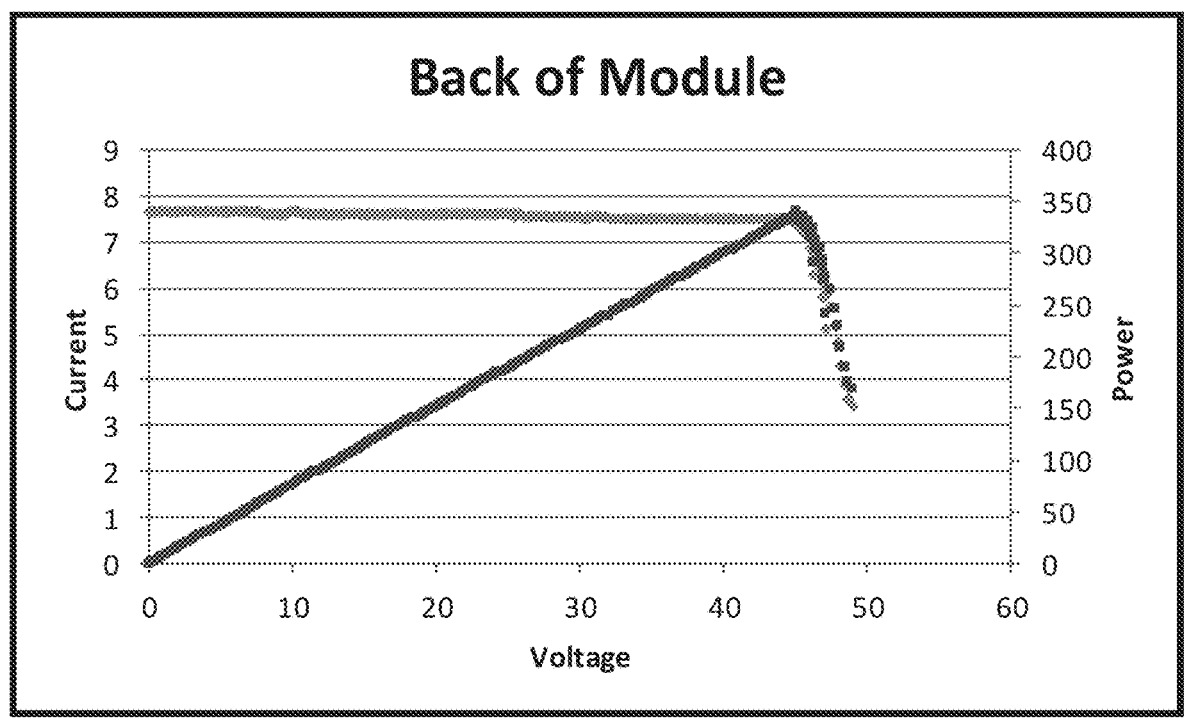
Figure 23A:
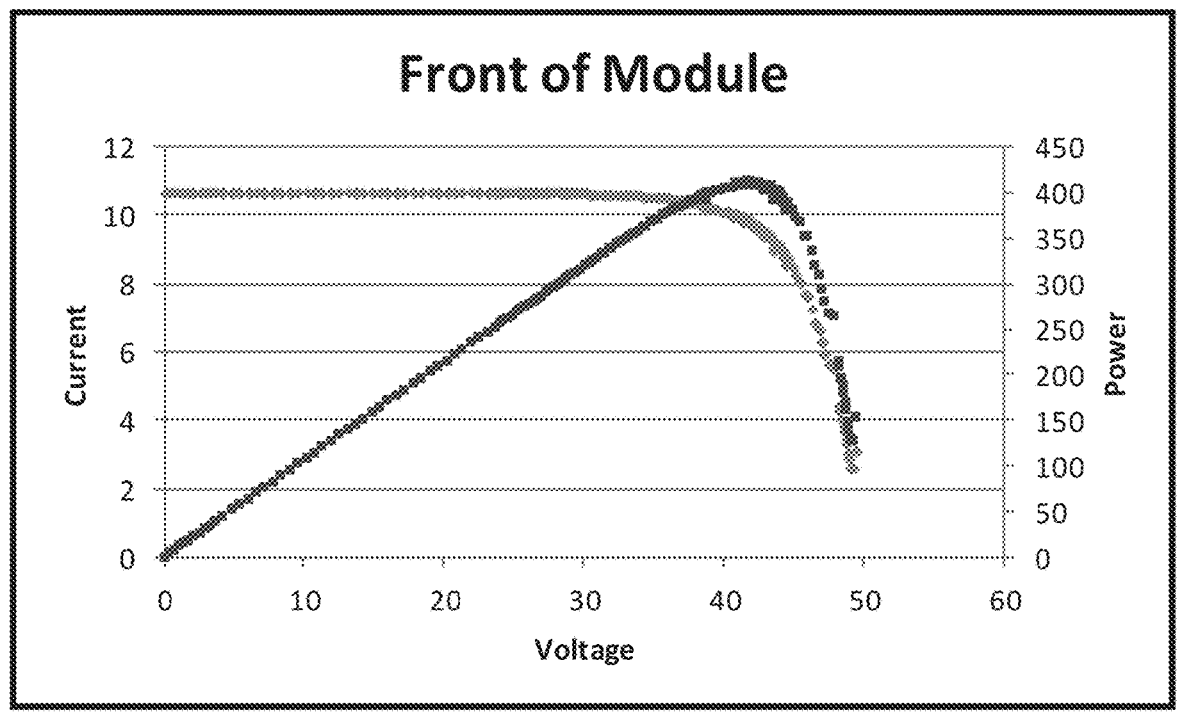
FIGS. 23A-B illustrate front and back test results respectively, of a bifacial photovoltaic module.
Figure 23B:
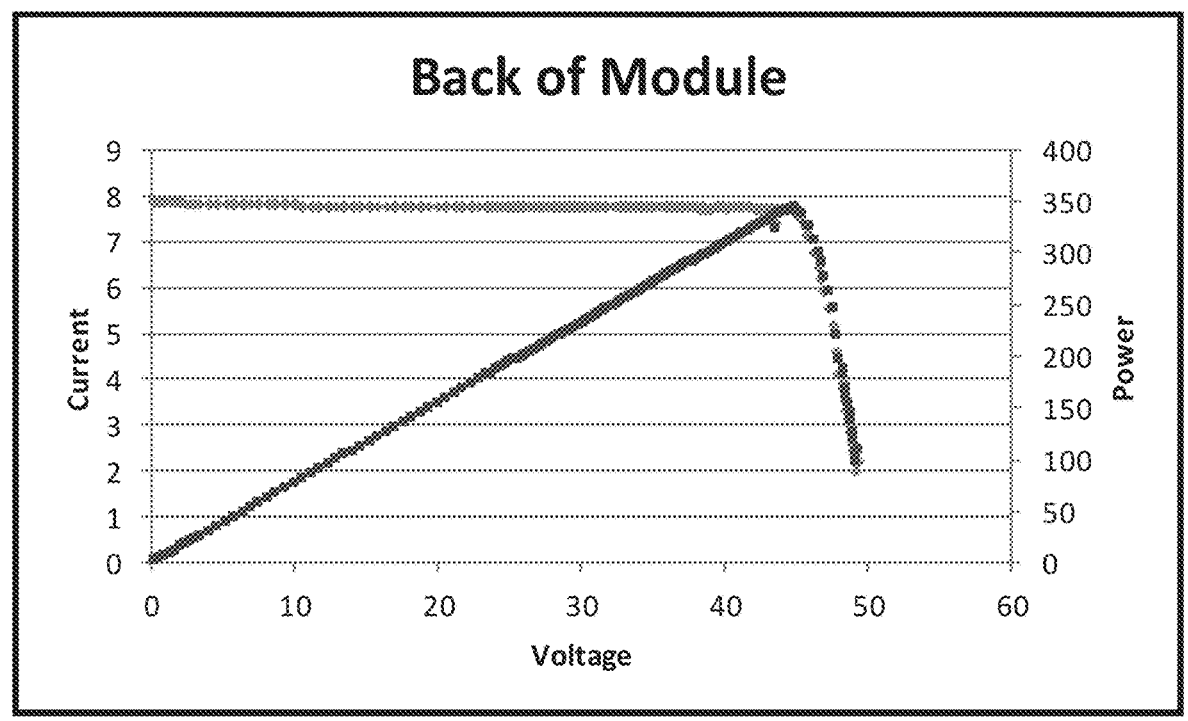

FIG. 20 and FIG. 21 illustrate respective front and bask surfaces of an embodiment of a PV cell 2000 that may be used in a bifacial module. The front face 2002 illustrated by FIG. 20 lacks metallic bus bar material coupling the metallic fingers 2004. Instead, PV material is directly exposed by portions 2006 where metallic bus material is present in conventional cells. In such an embodiment, the cells are cut at the parts where the metallic bus material would otherwise be present to form strips, and an ECA material is applied to the ends of the strips to electrically couple fingers on one strip to fingers of an overlapping strip. Metallic fingers 2008 are present on the backside 2010 of the cell, which are coupled to fingers of a front side of an adjacent PV element when the cells are cut into strips and arranged in a string. The fingers on a front of a strip may be coupled to fingers on a back of an overlapping strip by an ECA material.

It is noted that for a bifacial module, the fingers on the front and back side may be composed of different metals. For example, the front fingers may comprise silver, while the back fingers comprise aluminum.

The PV cell of FIGS. 20-21 are substantially square in shape, such that they have very small truncated corners 2012 relative to the size of the overall cell. In another embodiment, the PV cell has truncated corners similar to the cell illustrated in FIG. 1A.

Several technological advantages can be achieved by PV strips that lack a conventional metallic bus bar interface on an aperture side of the strips. The time and materials used to create the front bus bars is saved, reducing cost and complexity. Tolerances for alignment of strips in a string can be increased, which results in time and cost savings. Appearances are improved due to a lack of distracting elements on the front of a solar module. In addition, testing has shown that electrical characteristics of the electrical interface are improved, including a reduction in resistance, thereby increasing efficiency and performance of a module.

Clause 1A. A bifacial photovoltaic (PV) module comprising:
 a string that includes a plurality of PV strips coupled in series, each of the plurality of strips including first and second end strips disposed at opposing ends of the string and at least one middle strip disposed between the first and second end strips, wherein each strip comprises:
  a front side with exposed PV material; and
  a back side opposite to the aperture side, the back side having exposed PV material;
  wherein the back bus bar of every middle strip covers part of an adjacent strip in the string so that the only front bus bar that is not covered by an adjacent strip is a front bus bar of the first end strip;
 a frame surrounding the PV strips;
 a first junction box mounted on a first side of the frame; and
 a second junction box mounted on a second side of the frame that is opposite to the first side.

Clause 2A. The PV module of clause 1A, wherein the first junction box is a positive terminal, the second junction box is a negative terminal, and the first and second sides are long sides of the module.

Clause 3A. The PV module of clause 2A, wherein no portion of the junction boxes overlaps with the PV material exposed on the backside of the module.

Clause 4A. The PV module of clause 1A, wherein the plurality of strips in the string are coupled to one another using an electrically conductive adhesive (ECA).

Clause 5A. The PV module of clause 1A, wherein the module comprises a plurality of zones, and each zone comprises a plurality of strings that are coupled in parallel.

Clause 6A. The PV module of clause 5A, wherein each zone is protected by a single diode.

Clause 7A. The PV module of clause 1A, further comprising an opaque portion disposed on the backside of the module running across a middle of the module between the first and second junction boxes.

Clause 8A. The PV module of clause 6A, wherein a plurality of wires connecting the PV material to the junction boxes are disposed over the opaque portion.

Clause 9A. The PV module of clause 1A, wherein each of the front surfaces of the strips have a plurality of metallic fingers oriented along a length of the strip, and the strips are free from metallic bus material oriented orthogonal to the fingers.

Clause 10A. The PV module of clause 9A, wherein an ECA material couples the fingers on the front surface of a strip to fingers on a back surface of an overlapping strip within the strings.

Clause 11A. A photovoltaic (PV) system comprising a plurality of bifacial modules, the PV system comprising:
  first and second pillars;
  a torque tube coupled between the first and second pillars;
  a plurality of PV modules mounted on the torque tube, each PV module comprising:
    a string that includes a plurality of PV strips coupled in series, each of the plurality of strips including first and second end strips disposed at opposing ends of the string and at least one middle strip disposed between the first and second end strips, wherein each strip comprises a front side with exposed PV material; and a back side opposite to the aperture side, the back side having exposed PV material;
    wherein the back bus bar of every middle strip covers part of an adjacent strip in the string so that the only front bus bar that is not covered by an adjacent strip is a front bus bar of the first end strip;
    a frame surrounding the PV strips;
    a first junction box mounted on a first side of the frame;
    a second junction box mounted on a second side of the frame that is opposite to the first side; and
    an opaque portion disposed on the backside of the module running across a middle of the module between the first and second junction boxes,
  wherein the opaque portions of the modules overlap the torque tube.

Clause 12A. The system of clause 11A, wherein the first junction box of one of the plurality of modules is directly coupled to the second junction box of an adjacent module.

FIGS. 22A to 28 illustrate test results from testing PV modules that have wiring oriented along the long axis of the module, as shown in the embodiment of FIG. 19. FIGS. 22A-B and 23A-B illustrate front/back test results for modules that have rectangular strips.

These results are also listed in the following tables.

FIGS. 22A-B

| Side of Module | Pmax | Isc | Voc | Imp | Vmp | FF |
|---|---|---|---|---|---|---|
| Front | 412.584 | 10.641 | 50.154 | 9.772 | 42.222 | 77.308 |
| Back | 340.792 | 7.675 | 50.032 | 7.562 | 45.065 | 88.747 |

FIGS. 23A-B

| Side of Module | Pmax | Isc | Voc | Imp | Vmp | FF |
|---|---|---|---|---|---|---|
| Front | 411.917 | 10.676 | 50.167 | 9.852 | 41.809 | 76.909 |
| Back | 345.546 | 7.888 | 49.977 | 7.703 | 44.861 | 87.700 |

Figure 24A:
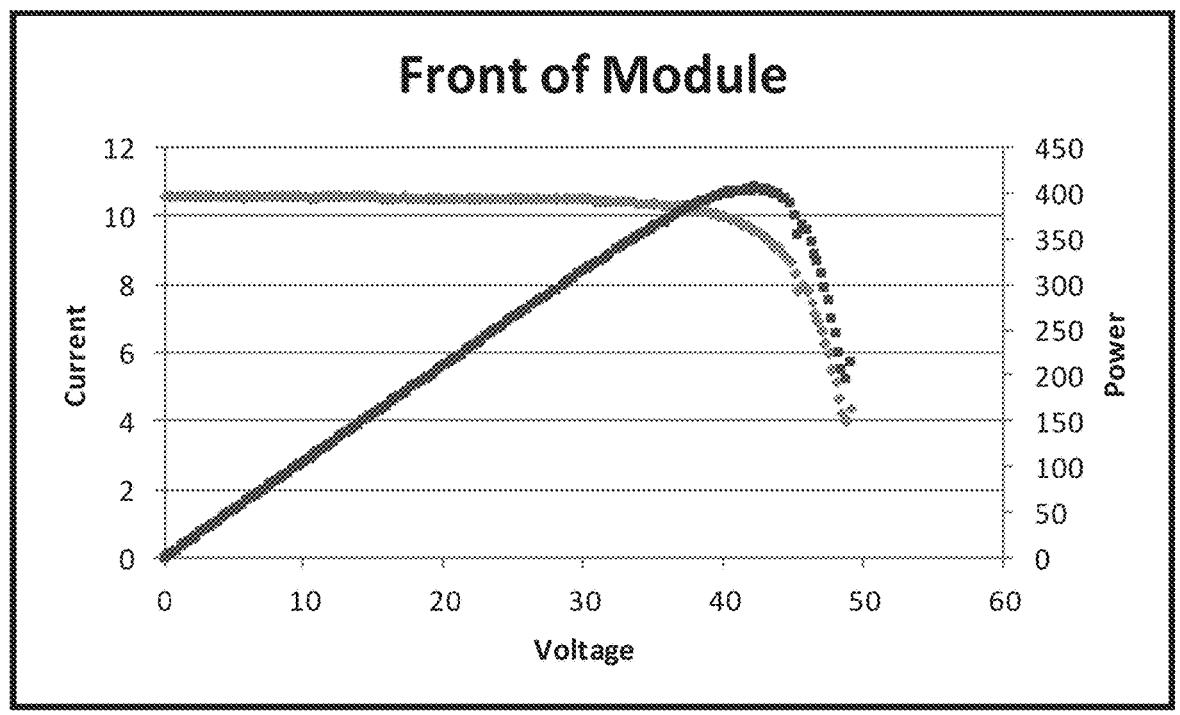
FIG. 24A-B illustrate front and back test results respectively, of a bifacial photovoltaic module.
Figure 24B:
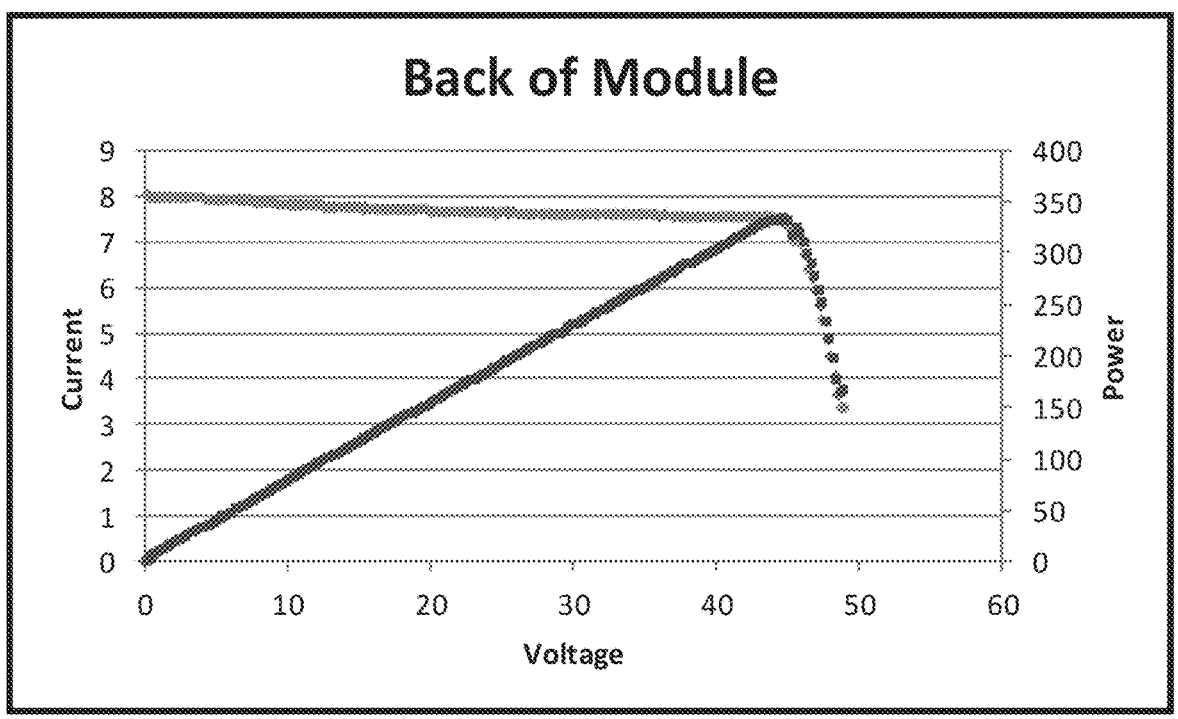
Figure 25:
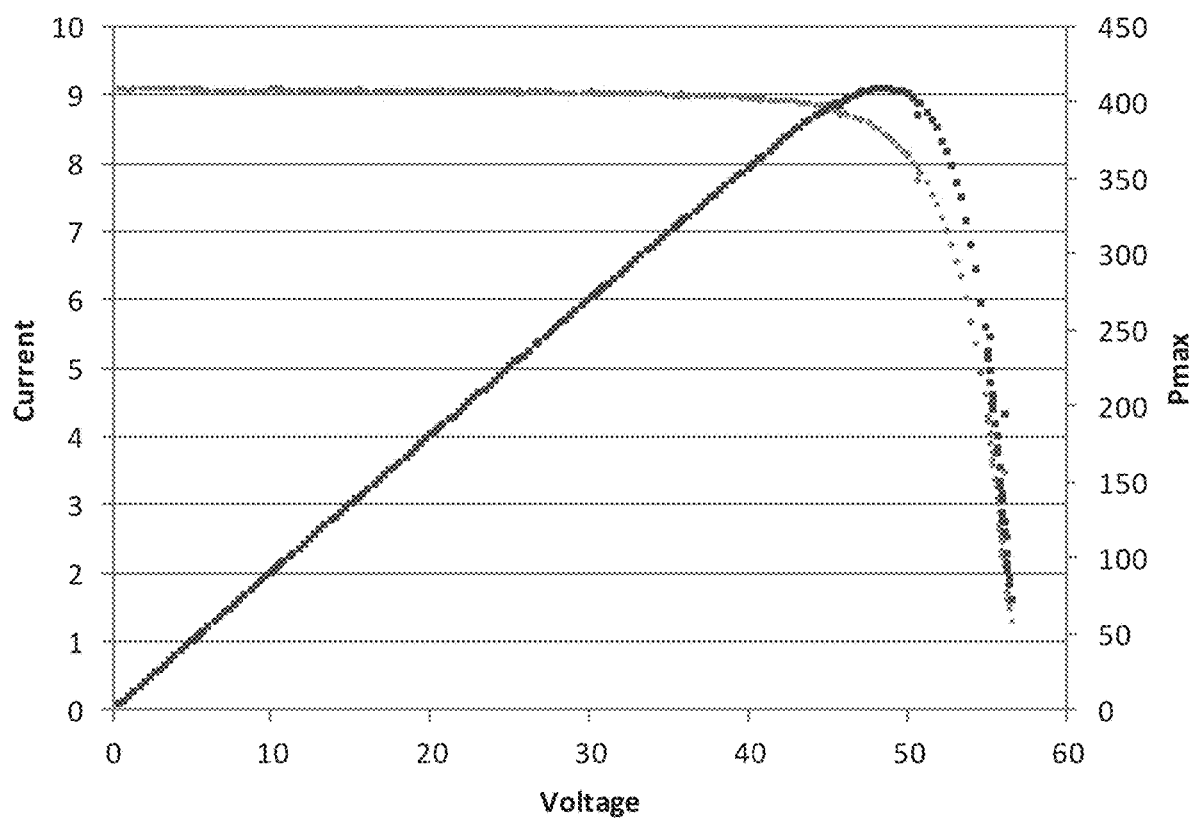
FIG. 25 illustrates test results of a bifacial photovoltaic module.
Figure 26:
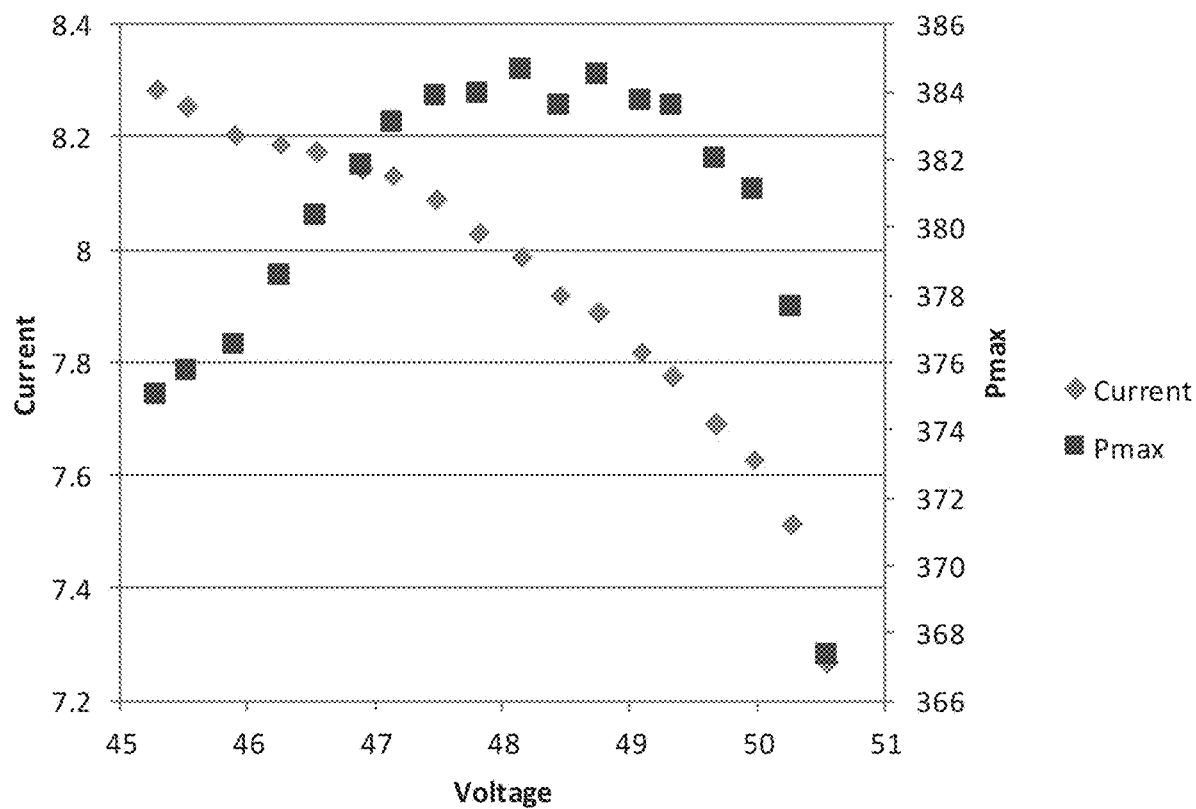
FIG. 26 illustrates test results of a bifacial photovoltaic module.

FIGS. 24A-B shows front/back test results for a module that uses strips with truncated corners along one edge. These test results are also listed in the following table.

FIGS. 24A-B

| Side of Module | Pmax | Isc | Voc | Imp | Vmp | FF |
|---|---|---|---|---|---|---|
| Front | 406.343 | 10.561 | 50.267 | 9.615 | 42.262 | 76.540 |
| Back | 334.179 | 8.022 | 50.052 | 7.461 | 44.791 | 83.229 |

Power output from the module with truncated corners is slightly lower than the power output from modules with fully rectangular strips.

FIGS. 25 to 28 show test results for modules that use different PV material from the modules whose results are illustrated in FIGS. 22A-24B. Those test results are also summarized in the following tables.

FIG. 25

| | |
|---|---|
| Pmax | 408.4379 |
| Isc | 9.070108 |
| Voc | 56.83443 |
| Imp | 8.481443 |
| Vmp | 48.15665 |
| FF | 79.23% |

FIG. 26

| | |
|---|---|
| Pmax | 384.6202 |

FIG. 27

| | |
|---|---|
| Pmax | 405.572 |
| Isc | 9.059364 |
| Voc | 56.67581 |
| Imp | 8.313092 |
| Vmp | 48.78714 |
| FF | 78.99% |

FIG. 28

| | |
|---|---|
| Pmax | 382.6739 |

Figure 27:
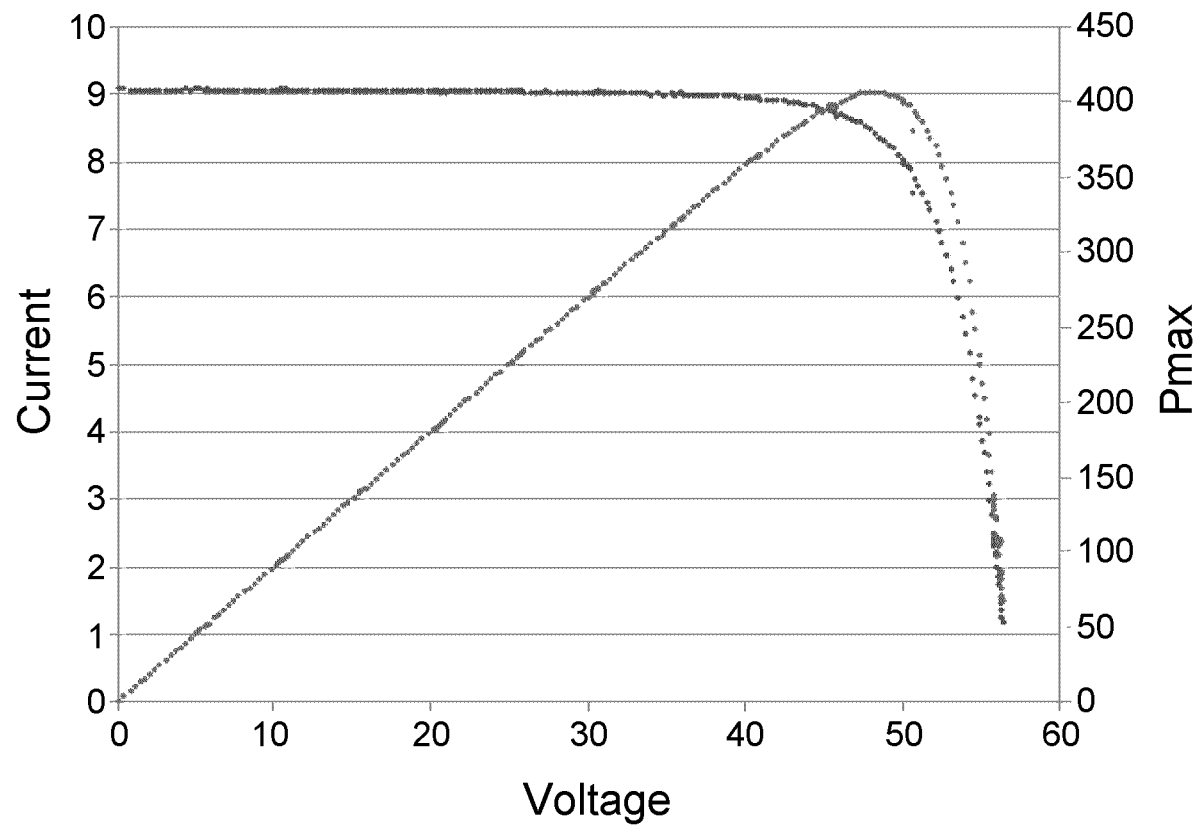
FIG. 27 illustrates test results of a bifacial photovoltaic module.
Figure 28:
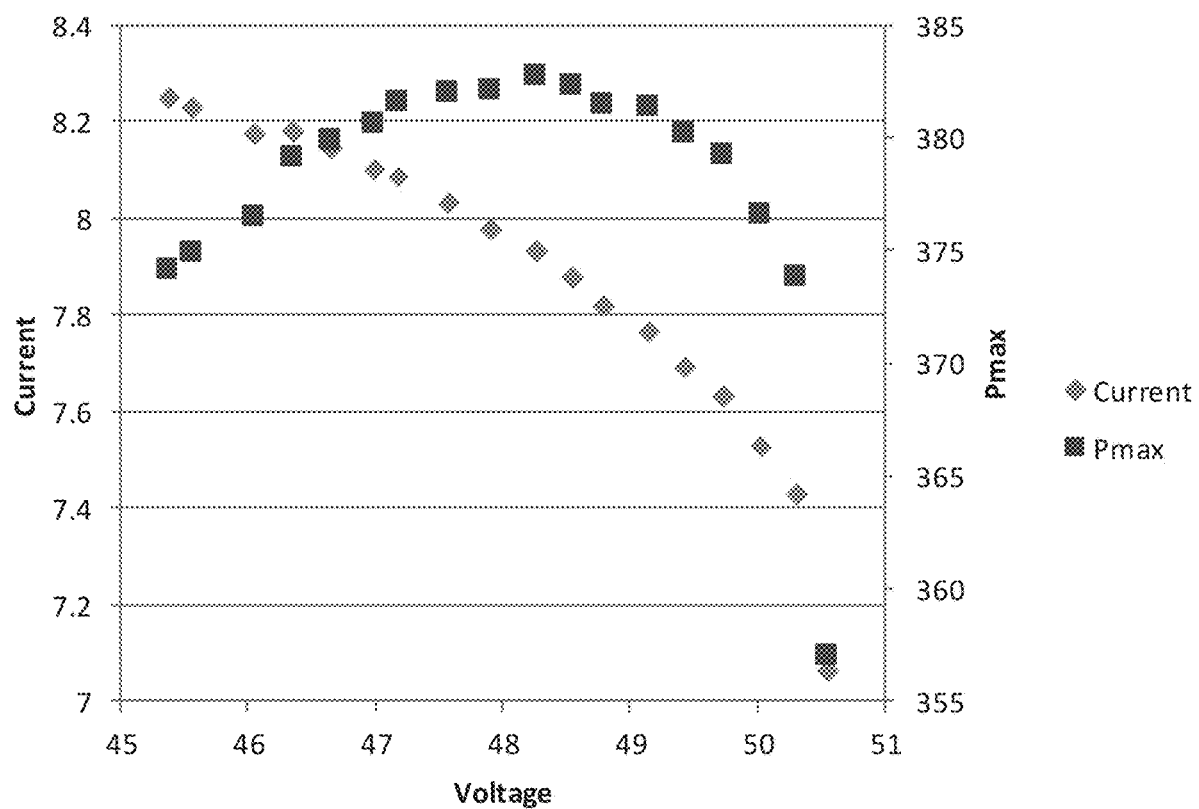
FIG. 28 illustrates test results of a bifacial photovoltaic module.

The modules of FIGS. 25 to 28 each have 6 strips in parallel along the width of a module, and 82 strips in a series connection, with a total of 492 strips in the modules. Differences between the test results in FIGS. 25 and 26 and the results in FIGS. 27 and 28 are the result of manufacturing variation.

Embodiments reflecting various aspects of a bifacial module are further described in clauses.

Clause 1B. An apparatus comprising:
a first string comprising a first plurality of overlapping strips of photovoltaic material connected in series, each of the first plurality of overlapping strips comprising,
a first conductive finger located on a front side,
a first front side bus bar in communication with the first conductive finger,
a second conductive finger located on a back side, and
a first back side bus bar in communication with the second conductive finger;
a second string comprising a second plurality of overlapping strips of the photovoltaic material connected in series, each of the second plurality of overlapping strips comprising,
a third conductive finger located on a front side,
a second side bus bar in communication with the third conductive finger,
a fourth conductive finger located on a back side, and
a second back side bus bar in communication with the fourth conductive finger;
a first zone comprising the first string and the second string connected in parallel; and
a bypass diode structure in dedicated electrical communication with the first zone and configured to compensate for uneven illumination of the back side of the first string relative to the back side of the second string.

Clause 2B. An apparatus as in clause 1 further comprising a solar tracking apparatus, wherein the first string and the second string together comprise a module mounted to the solar tracking apparatus.

Clause 3B. An apparatus as in clause 2B wherein the solar tracking apparatus comprises piers of vertical pillars spaced apart from one another and connected through a torque tube, wherein the module is mounted to the torque tube.

Clause 4B. An apparatus as in clause 3B wherein the torque tube shades the backside of the first string relative to the backside of the second string to result in the uneven illumination.

Clause 5B. An apparatus as in clause 2B wherein the module includes a junction box.

Clause 6B. An apparatus as in clause 5B wherein the single bypass diode structure is present in the junction box.

Clause 7B. An apparatus as in clause 2B wherein the single bypass diode structure is present on a front side of the module.

Clause 8B. An apparatus as in clause 2B wherein the single bypass diode structure is present on a back side of the module.

Clause 9B. An apparatus as in clause 1B wherein the single bypass diode structure is an embedded diode.

Clause 10B. An apparatus as in clause 9B wherein:
the first string and the second string together comprise a module;
the module further comprises a polymer; and
the single bypass diode structure is embedded in the polymer.

Clause 11B. A method comprising:
exposing a back side of a first string comprising a first plurality of overlapping strips of photovoltaic material connected in series, to light having a first intensity;
exposing a back side of a second string comprising a second plurality of overlapping strips of photovoltaic material connected in series, to light having a second intensity relative to the first intensity; and
connecting in parallel across a single bypass diode structure, electrically conductive material of the back side of the first string, with electrically conductive material on the back side of the second string,
wherein the single bypass diode structure serves to protect against uneven currents arising from differences between the first light intensity and the second light intensity.

Clause 12B. A method as in clause 11B wherein the first light intensity differs from the second light intensity due to shading of the back side of the second string.

Clause 13B. A method as in clause 12B wherein the shading is attributable to a solar tracking apparatus.

Clause 14B. A method as in clause 13B wherein the shading is attributable to a torque bar of the solar tracking apparatus.

Clause 15B. A method as in clause 11B further comprising:
exposing a front side of a first string to light having a third intensity;
exposing a front side of a second string to light having a fourth intensity;
connecting in parallel across the single bypass diode structure, electrically conductive material of the front side of the first string, and electrically conductive material on the front side of the second string,
wherein the single bypass diode structure serves to protect against uneven currents arising from differences between the third light intensity and the fourth light intensity.

Clause 16B. A method as in clause 15B wherein the light of the third intensity and the light of the fourth intensity comprise direct sunlight.

Clause 17B. A method as in clause 16B wherein differences between the light of the third intensity and the light of the fourth intensity are attributable to at least one of soiling, debris, shading, and degradation.

Clause 18B. A method as in clause 15B wherein:
the electrically conductive material of the front side of the first string and the electrically conductive material of the front side of the second string comprise a first metal; and
the electrically conductive material of the back side of the first string and the electrically conductive material of the back side of the second string comprise a second metal different from the first metal.

Clause 19B. A method as in clause 18B wherein the first metal comprises silver and the second metal comprises aluminum.

Clause 20B. A method as in clause 11B wherein:
the first string and the second string together comprise a module; and
the single bypass diode structure is present on a face of the module.

It is noted that a bifacial module according to embodiments, could additionally feature a coloration layer having a darkened front side. Such a coloration layer could allow the front side of a bifacial module to offer an aesthetically pleasing visual appearance to a viewer (e.g., homeowner, sidewalk observer, prospective home buyer).

In particular, the coloration layer could offer a dark color between serially connected photovoltaic elements (e.g., strings) that are also dark in color. The coloration layer could serve to hide one or more module features including but not limited to:
a transparent region between PV elements;
connecting ribbon tabs (e.g., between strings);

back side bussing;
a junction box;
an inverter;
others.

The appearance of one or more of these from the front side of the module could disrupt an otherwise aesthetically pleasing uniform (dark) visual appearance of the module's front side. Moreover, as additionally disclosed herein, the coloration layer could further serve to desirably enhance uniformity of backside surface area of PV elements exposed to illumination.

Figure 29:
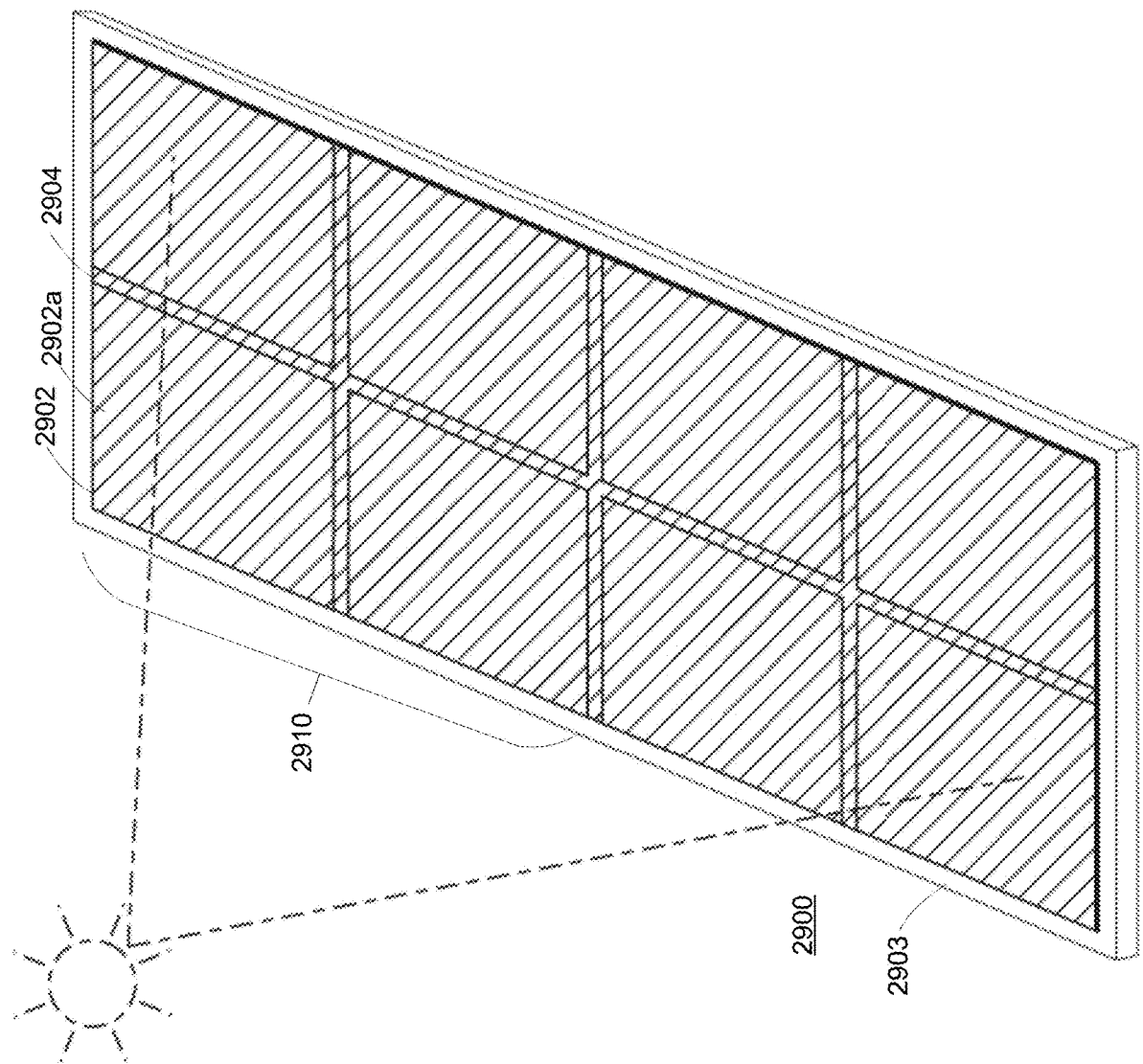
FIG. 29 illustrates a front perspective view of a bifacial photovoltaic module according to an embodiment.

FIG. 29 illustrates a simplified front perspective view of a bifacial photovoltaic module according to an embodiment. Here, the module 2900 comprises a plurality of photovoltaic elements 2902 supported in a frame 2903. In this particular embodiment, those photovoltaic elements are arranged in four quadrants 2910, with a pair of photovoltaic elements connected in parallel per quadrant.

As indicated by the cross-hatching, the photovoltaic elements exhibit a darkened appearance. Accordingly, the module 2900 also includes a coloration layer 2904 located in regions lying between the photovoltaic elements. The front surface 2904a of that coloration layer exhibits a darkened appearance substantially matching that of the photovoltaic elements.

Figure 30:
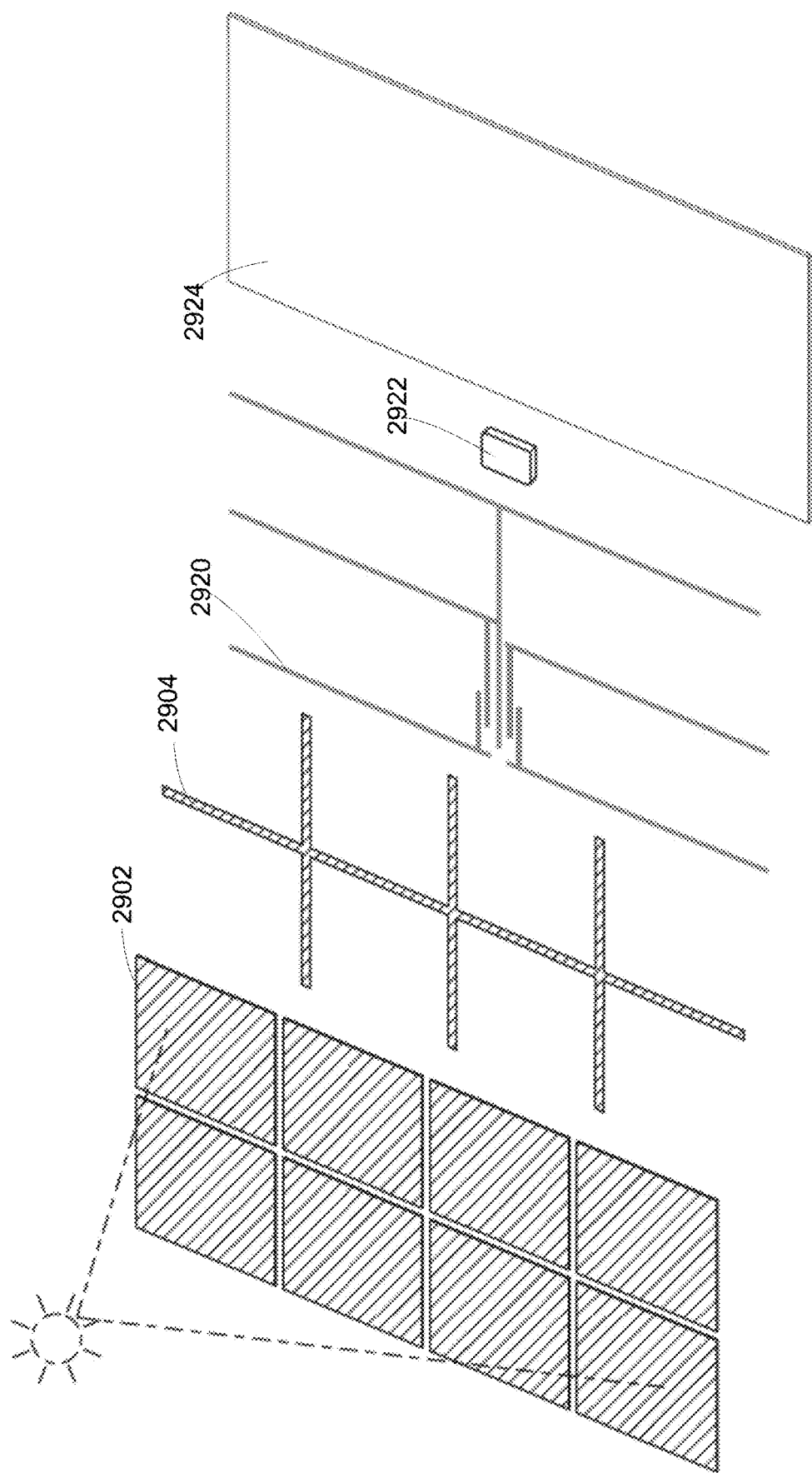
FIG. 30 illustrates a front exploded view of a bifacial photovoltaic module according to an embodiment.

FIG. 30 illustrates a simplified front exploded view of a bifacial photovoltaic module according to an embodiment. This front exploded view illustrates the various components of the module.

Specifically, in addition to the photovoltaic elements 2902 and the coloration layer 2904, the exploded view of FIG. 30 also shows the backside bussing 2920 that allows for electrical connection between the photovoltaic elements. As described in detail herein, that connection may be both serial and parallel in nature.

Further shown in FIG. 30 is the junction box 2922 that offers external connection to the photovoltaic elements. A transparent backplane 2924 admits light for collection by the backside of the bifacial module.

Figure 31:
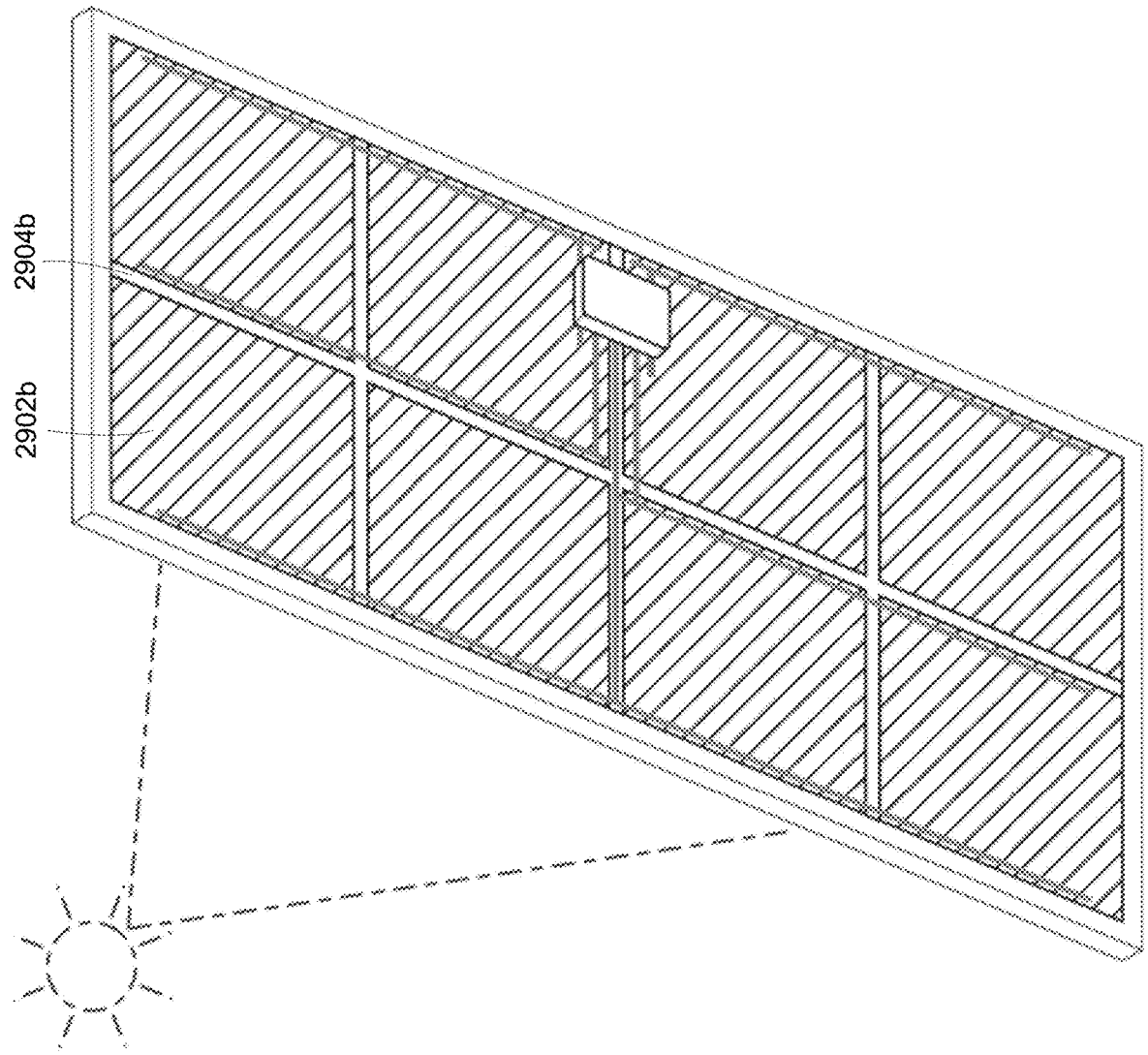
FIG. 31 illustrates a back perspective view of a bifacial photovoltaic module according to an embodiment.

In order to provide further disclosure regarding a bifacial module according to embodiments, FIG. 31 illustrates a back perspective view. Here, cross-hatching of the back surfaces 2902b of the photovoltaic elements 2902 indicates those surfaces to also be dark colored (like the front surfaces).

Unlike in the front view of FIG. 29, however, the back surface 2904b of the coloration layer 2904 is not necessarily dark colored. This is because the appearance of the module from the back side, need not appear to be pleasingly uniform (e.g., all dark) to a user. Rather, the module back side is typically facing a surface (such as a roof), and hence may exhibit a heterogenous appearance.

Thus the back side view of FIG. 31 shows the back side bussing 2920, as well as the junction box 2922. (The transparent backplane is not separately depicted in this perspective view, for ease of illustration).

Figure 32:
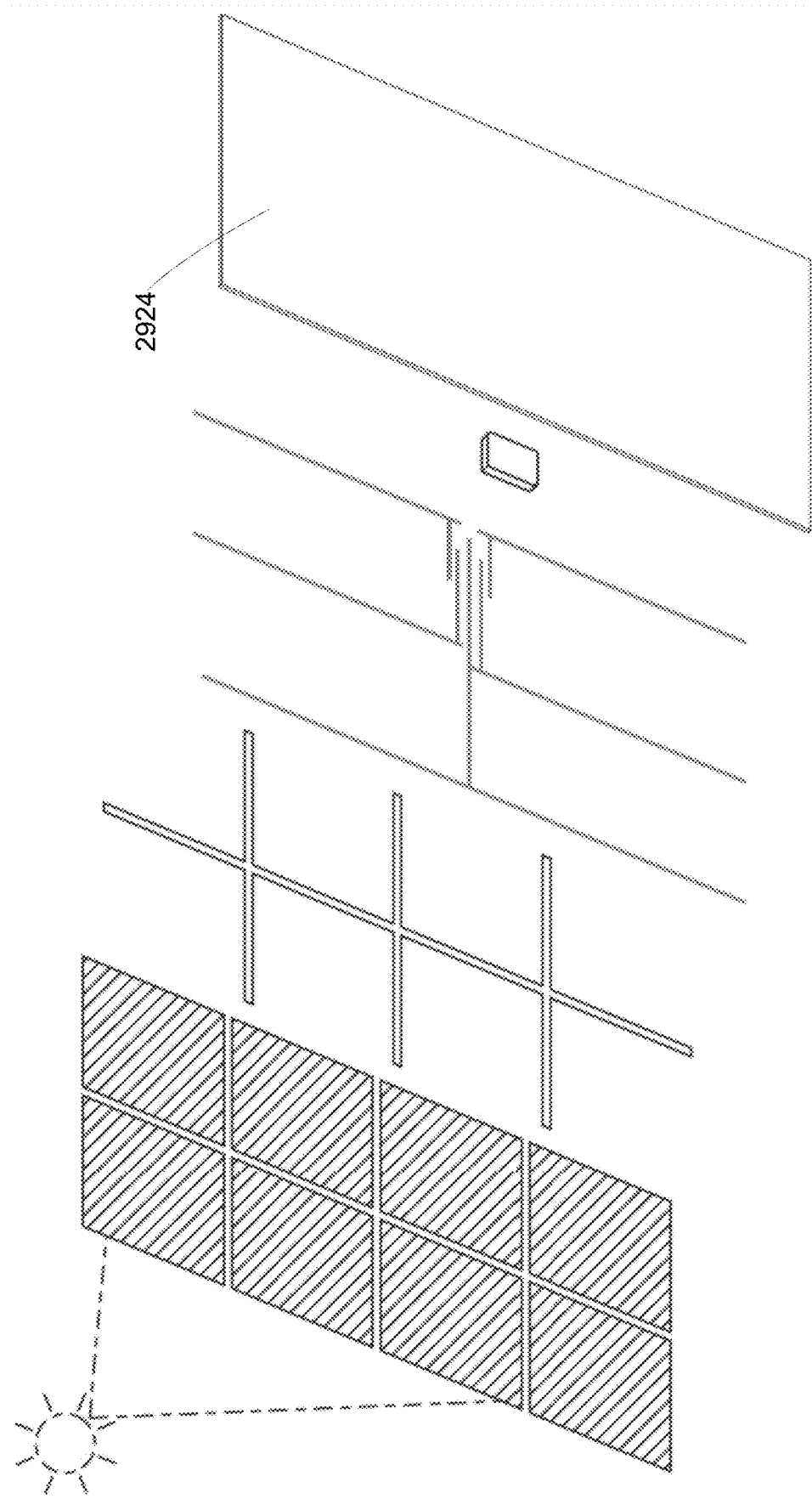
FIG. 32 illustrates a back exploded view of a bifacial photovoltaic module according to an embodiment.

FIG. 32 illustrates a back exploded view of a bifacial photovoltaic module according to an embodiment. Here, the transparent backplane is shown.

In this particular embodiment the back side of the coloration layer is shown as being white (or some intermediate color lighter than the front side of the coloration layer). Such an embodiment may offer benefits, in that backside illumination received at inter-photovoltaic element regions may not be absorbed—but rather reflected for possible indirect absorption.

However, this is not required. According to alternative embodiments, the backside of the coloration layer may also be dark in color. Such embodiments may afford the benefit of reduced cost, where the material of the coloration layer (e.g., tape) having the same (dark) color on both sides, is more cheaply available.

Figure 33:
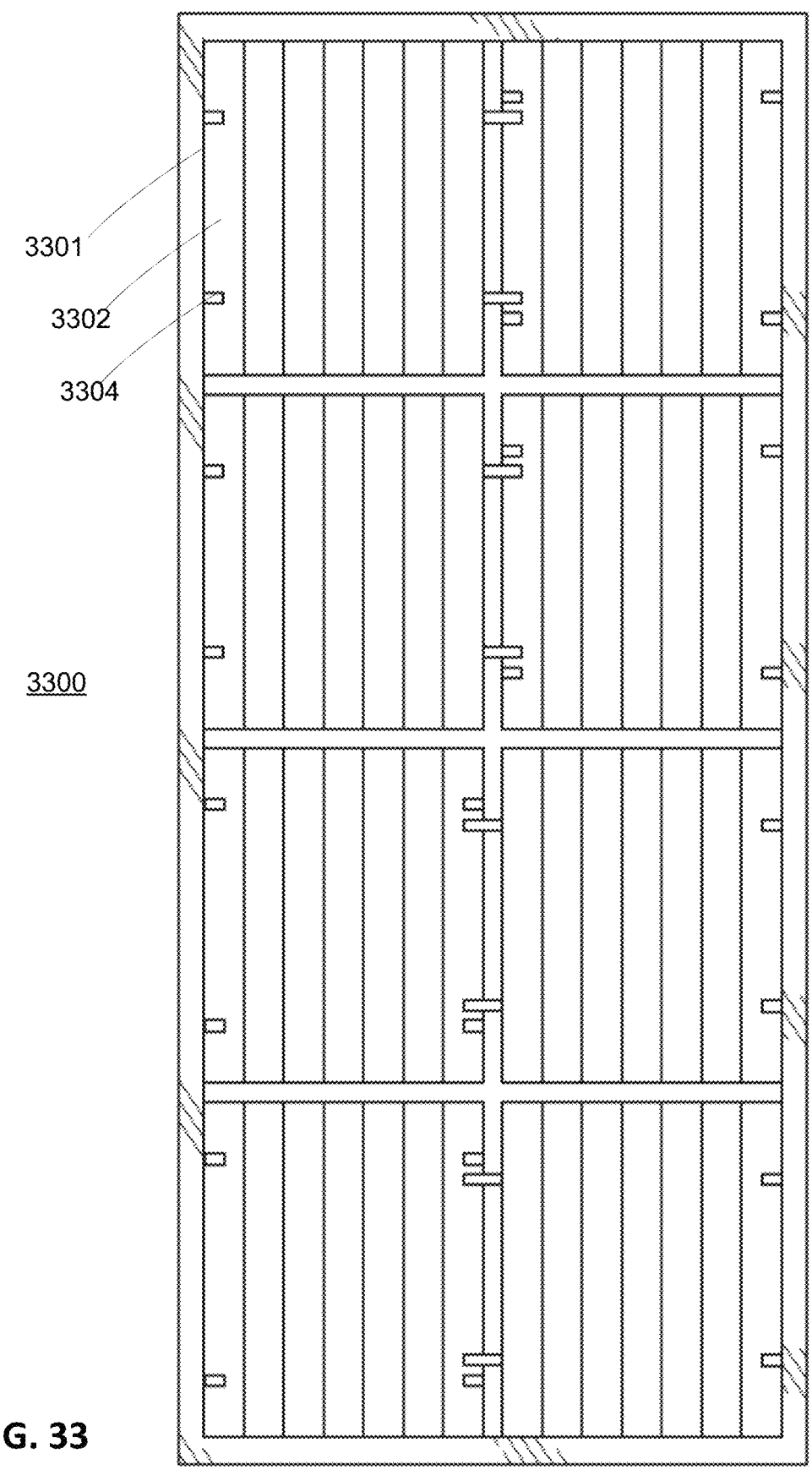
FIG. 33 shows a simplified plan view of a back surface of a bifacial module lacking a separate coloration layer.

In order to provide further understanding of bifacial modules according to particular embodiments, FIG. 33 shows a simplified plan view of a back surface of a bifacial module 3300 lacking a separate coloration layer. Here each photovoltaic element is a string 3301 of (seven) singulated strips 3302 assembled in series as an overlapping, shingled configuration.

Electrical connection between the various photovoltaic elements is discussed in detail later below, at least with reference to the specific backside bussing pattern of FIG. 35. However, the simplified view of FIG. 33 does show the existence of ribbon tabs 3304 that serve to provide contact between the photovoltaic elements.

Figure 34:
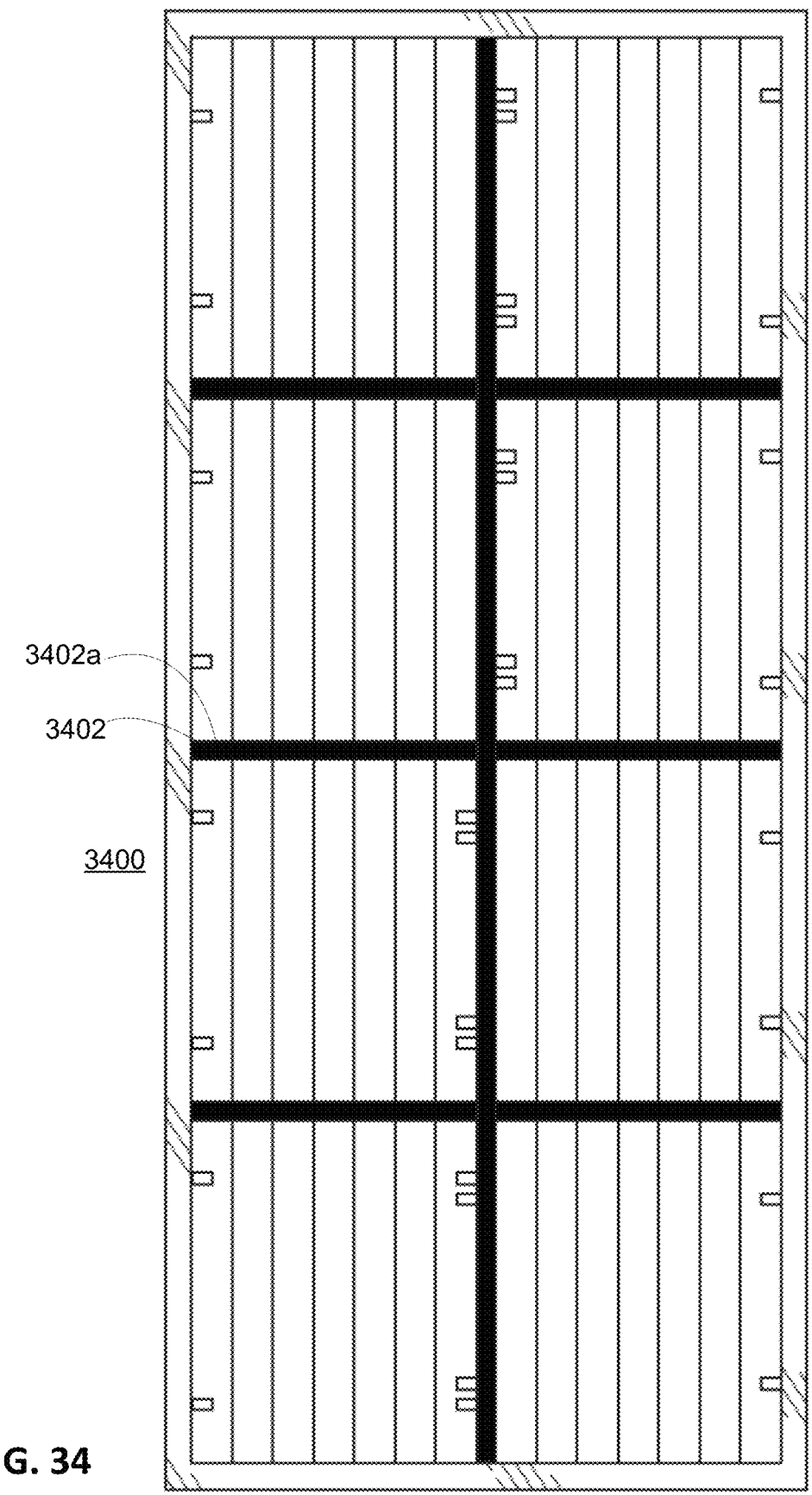
FIG. 34 shows a simplified plan view of a back surface of a bifacial module that includes a separate coloration layer.

FIG. 34 shows a simplified plan view of a back surface of a bifacial module 3400 that includes a separate coloration layer 3402. In this particular embodiment, not only the front side but also the back side 3402a of this coloration layer is black.

The presence of the coloration layer in inter-photovoltaic element regions, desirably serves to impart a uniform (e.g., all dark) visual appearance to the module. That is, the coloration layer blocks a viewer from seeing material (e.g. a roof) that may be present behind the module. Absent the coloration layer (i.e., as in the bifacial module of FIG. 33), the inter-element regions would be transparent, rendering the (roof) material behind them visible.

Figure 35:
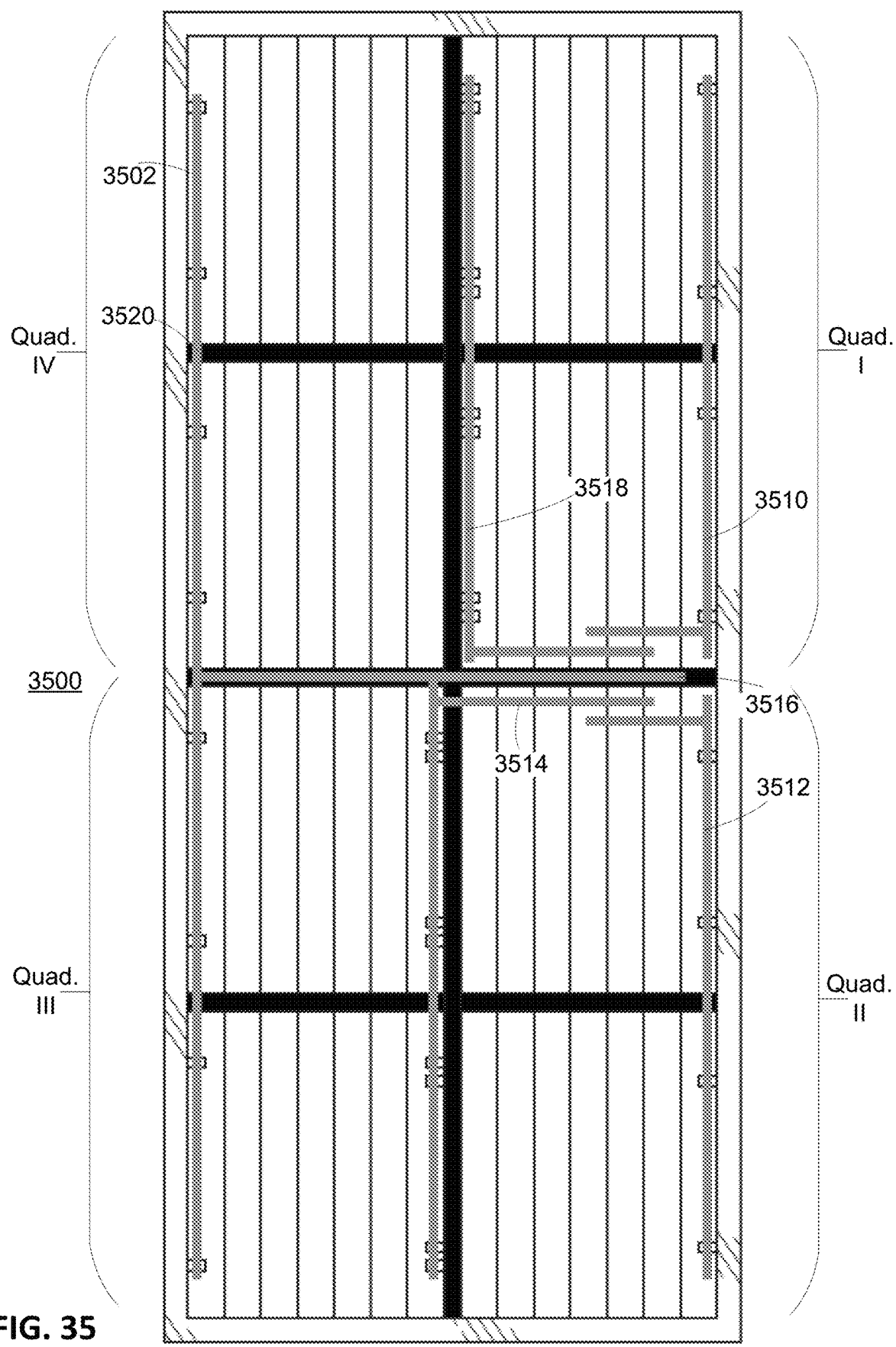
FIG. 35 is a simplified plan view of a back surface of a bifacial module that includes a particular back side bussing pattern.

FIG. 35 is a simplified plan view of a back surface of a bifacial module 3500 that includes a particular back side bussing 3502 pattern. In this specific example the photovoltaic elements of the module are connected with five contacts, as summarized in the following table.

| Contact | Voltage | Role |
| --- | --- | --- |
| 3510 | High ($V_{high}$) e.g., 48 V | Parallel High Voltage Contact with PV Elements of Quadrant I |
| 3512 | Low ($V_{low}$) e.g., 12 V | Parallel Low Voltage Contact with PV Elements of Quadrant II. |
| 3514, 3516 | Intermediate Low ($V_{Ilow}$), e.g., 24 V | Parallel Intermediate Low Voltage Contact with PV Elements of Quadrants II and III |
| 3518 | Intermediate High ($V_{Ihigh}$), e.g., 36 V | Parallel Intermediate High Voltage Contact with PV Elements of Quadrants III and IV. |

Here, in addition to making the front sides of the inter-photovoltaic element regions appear dark, the coloration layer also serves to block the visibility of certain back side bussing portions from the front. That is, the coloration layer lies between a viewer and the bussing portions 3520 that pass between photovoltaic elements.

It is noted that certain ribbon tabs may remain visible according to the particular patterning of the coloration layer of FIG. 35 and in certain other embodiments. The front side visibility/contrast offered by such ribbon tabs can be reduced by coloring them. This is described above at least with regard to FIGS. 7A and 8A.

Figure 36:
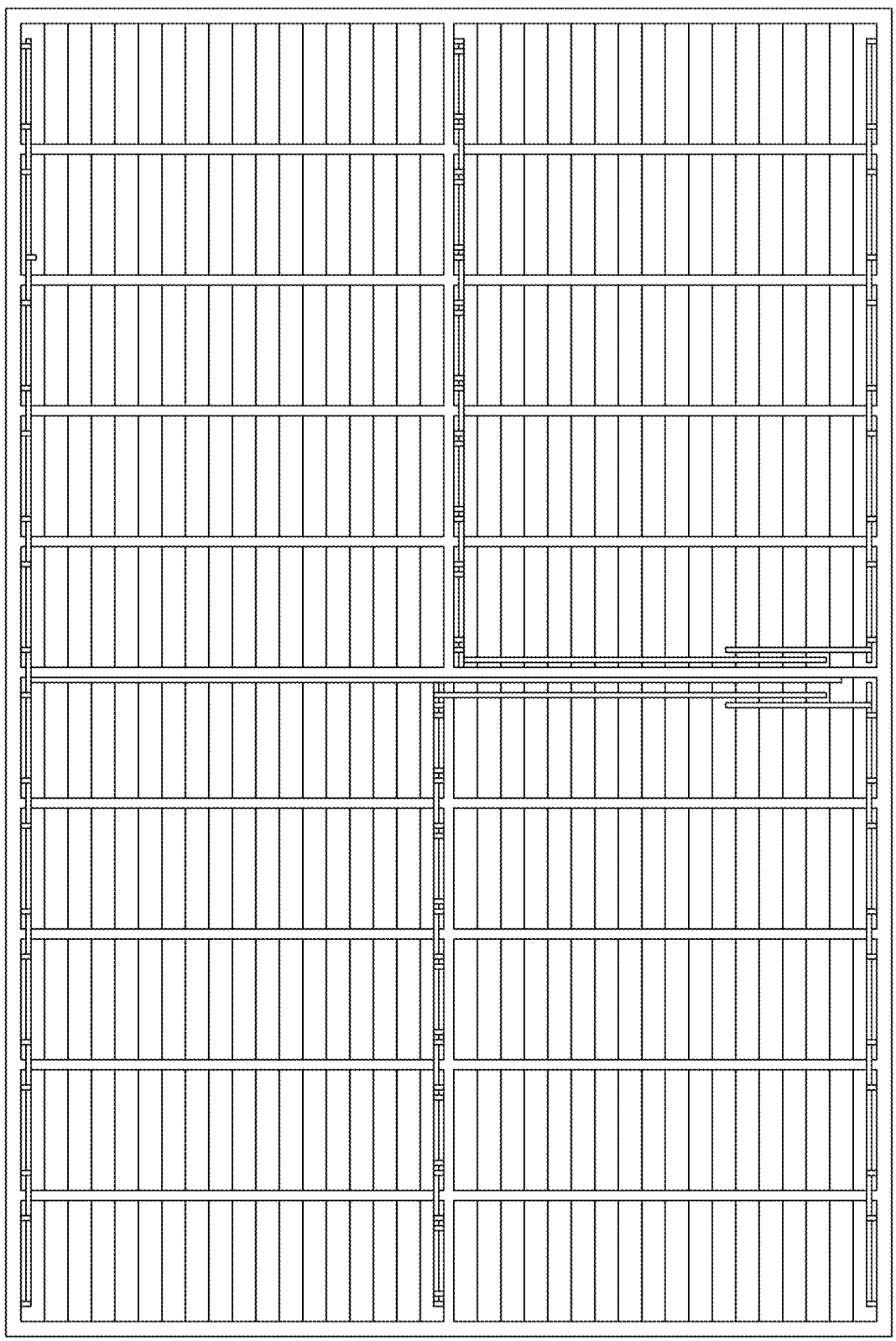
FIG. 36 is a simplified plan view of a back surface of a more complex bifacial module than that of FIG. 35.

FIG. 36 is a simplified plan view of a back surface of a more complex bifacial module than that of FIG. 35. Specifically, each quadrant of the module of FIG. 36 includes five (5) photovoltaic elements of eighteen (18) strips assembled in a shingled configuration. Otherwise, the parallel connectivity between different photovoltaic elements afforded by the backside bussing of FIG. 36, is similar to that shown in FIG. 35.

FIG. 36 illustrates that the presence of features on the backside, can result in non-homogeneity of illumination on the backside. For example, the back side bussing serves to partially cover some strips and not others. Also, the back side bussing covers over larger areas of some strips than others.

Figure 37:
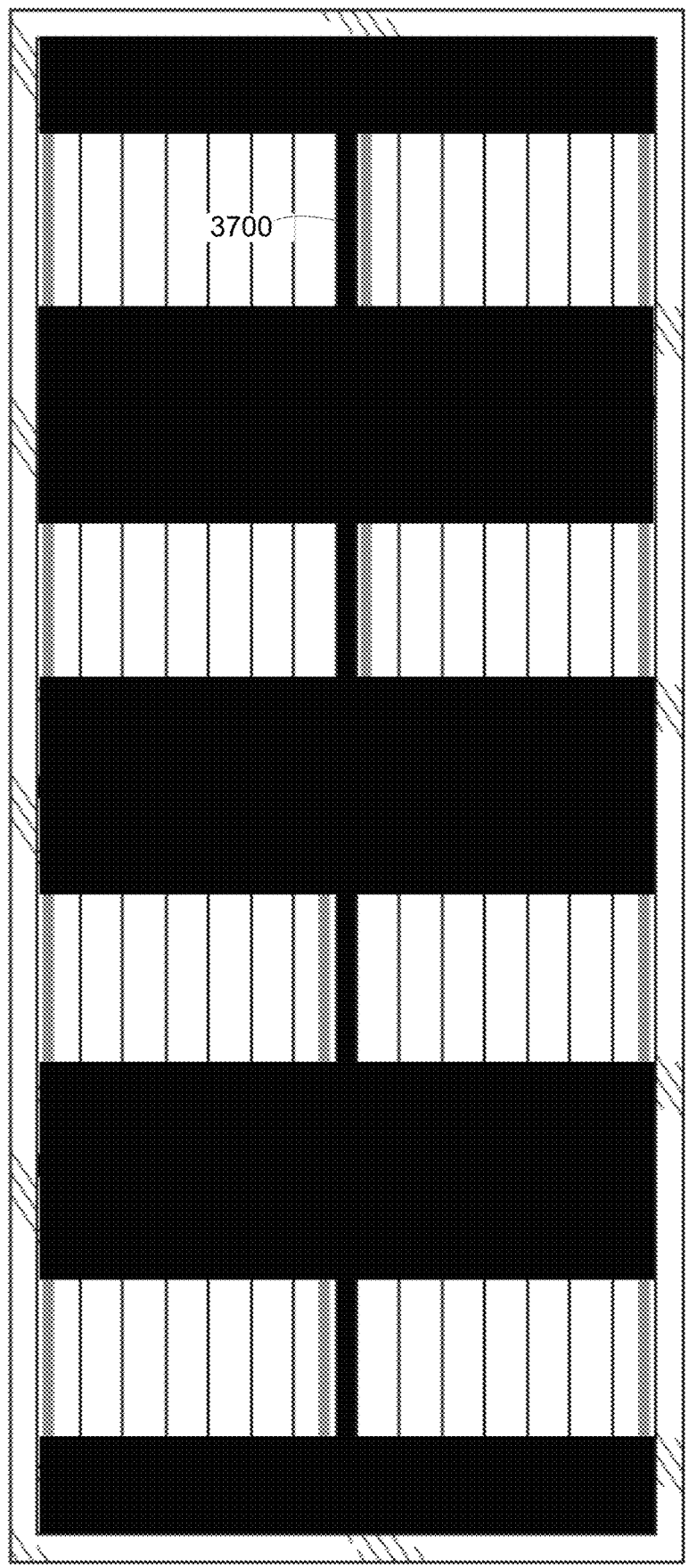
FIG. 37 shows a simplified alternative embodiment, wherein the coloration layer has a different pattern

Accordingly, FIG. 37 shows a simplified alternative embodiment, wherein the coloration layer 3700 has a different pattern. Here, the widened coloration layer portion 3702 serves to cover the edges of the strips so that each offers an approximately equal surface area to receive backside illumination.

In this single coloration layer embodiment, it is noted that the ribbon tabs and portions of the back side bussing that cross inter-element regions, will be visible from the front side. However, the inter-element regions are otherwise covered and exhibit a dark color.

It is noted that an embodiment as in FIG. 37 may offer benefits other than enhanced uniformity of back side illumination. In particular, the increased width portion of the coloration layer may offer more forgiving tolerances during fabrication processes (e.g., alignment of tape, and/or printing upon a transparent backplane).

Figure 38:
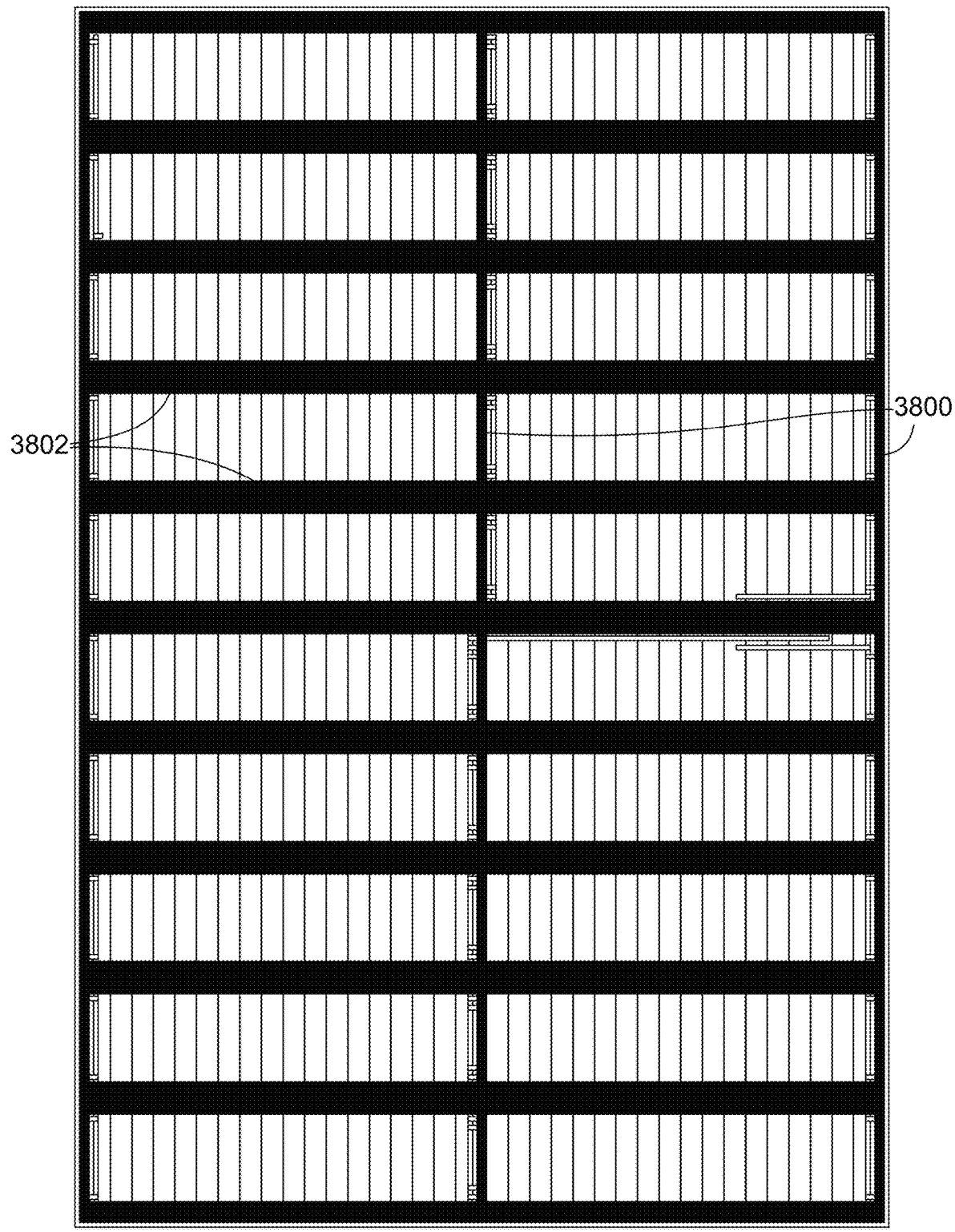
FIG. 38 shows coloration layer implemented with a more complex module.

FIG. 38 shows coloration layer implemented with a more complex module. In this particular embodiment, the coloration layer is implemented as two distinct layers. However, this is not required and a coloration layer could be implemented with a single layer or with more than two layers.

A first layer 3800 corresponds to the narrow portions, overlying inter-element regions. A second layer 3802 overlaps the first layer, portions of the strips, and the bussing, in order to provide the wide portions.

Figure 39:
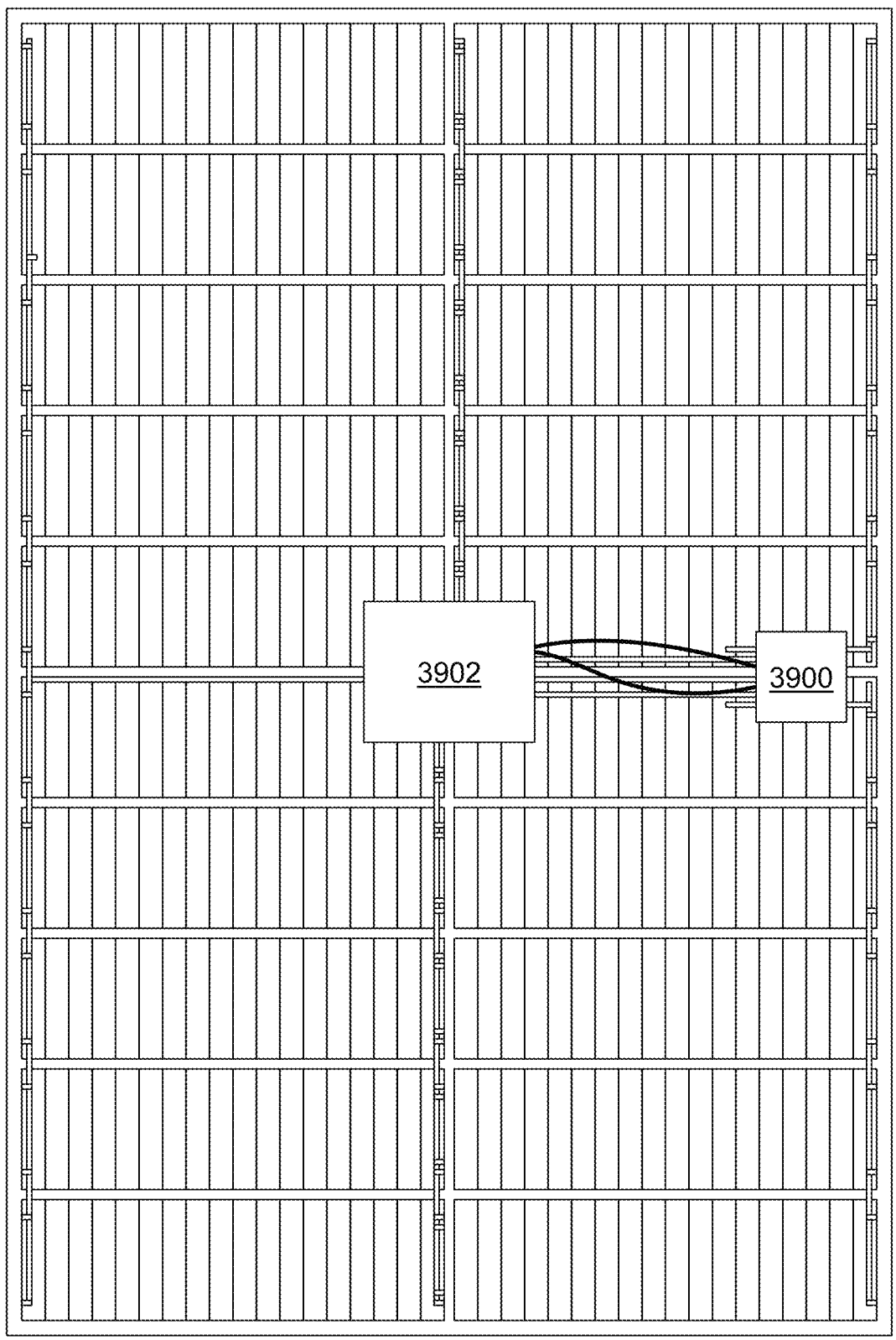
FIG. 39 shows a more complex module bearing a junction box and an inverter.

It is noted that features other than back side bussing, could give rise to areas of uneven illumination. FIG. 39 shows a more complex module bearing a junction box 3900, and an inverter 3902. The presence of the junction box and/or the inverter can block backside light from evenly illuminating the bifacial photovoltaic elements.

Figure 40:
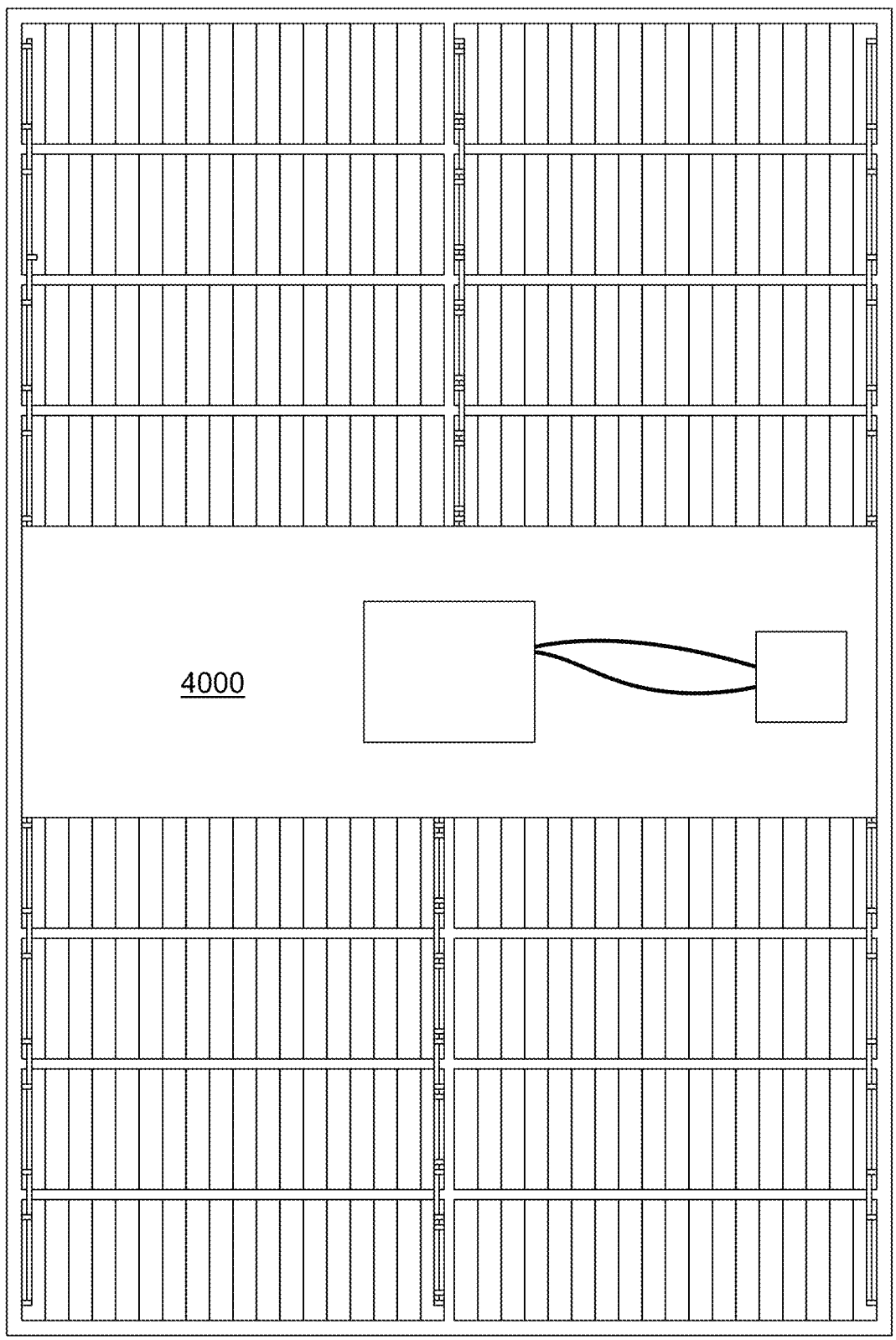
FIG. 40 shows the introduction of a coloration layer to address backside illumination with a junction box and an inverter present.

Accordingly, FIG. 40 shows the introduction of a coloration layer to address this issue. Here, the wide central portion 4000 covers the entire first strings of each of the quadrants. As shown in FIG. 40, both the junction box and the inverter are positioned overlapping the central portion, so that the remaining exposed strings experience homogenous backside illumination. In FIG. 40, the backside of the wide central portion of the coloration layer is shown white. This is done for purposes of illustration, but it is again emphasized that the back side of the coloration layer may be of any color.

Figure 41:
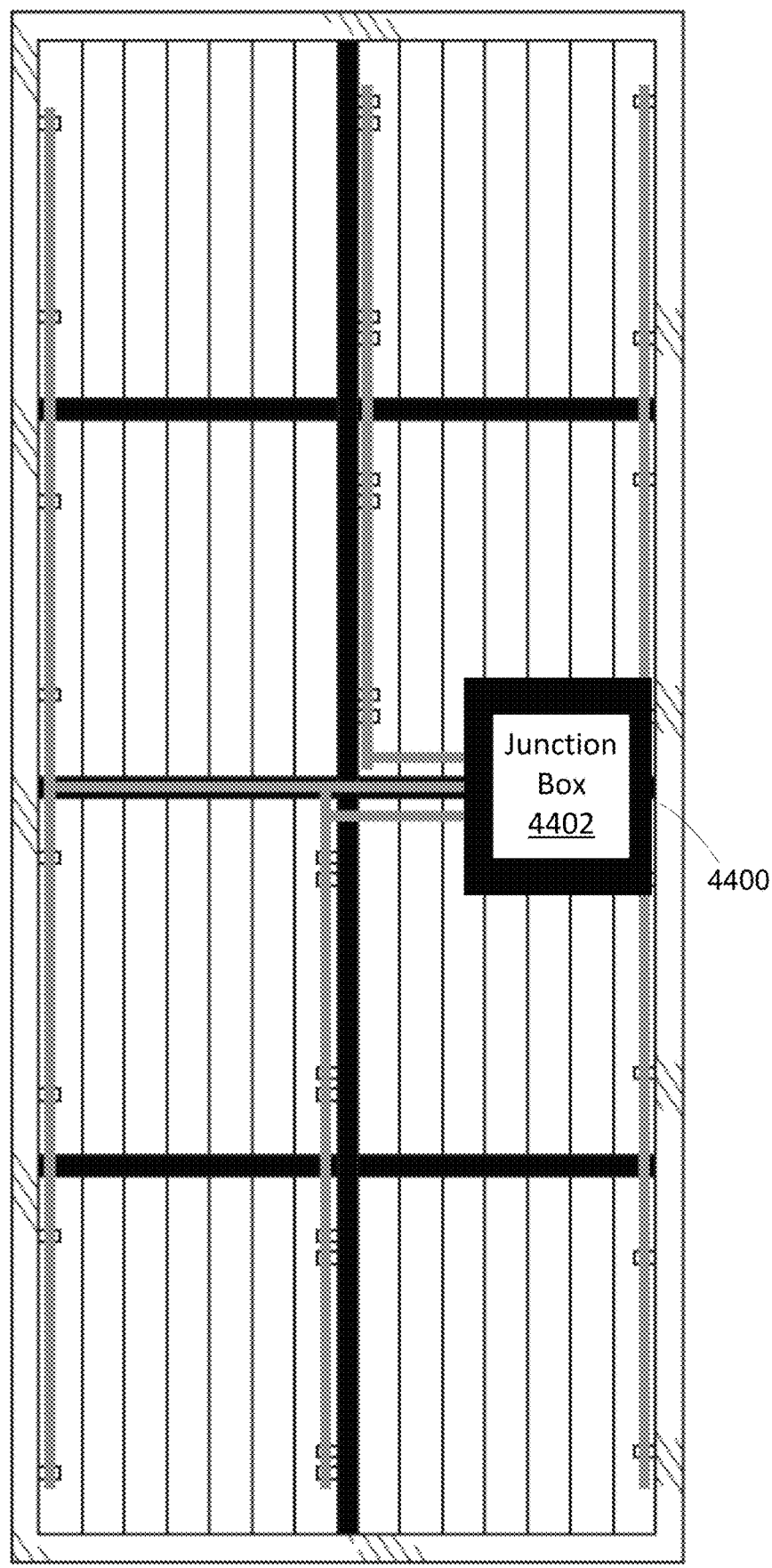
FIG. 41 shows a plan view of an embodiment of a bi-facial module including an irregular coloration layer that does not impart uniform illumination upon the backside.

A bifacial module including sets of serially-connected photovoltaic elements connected in parallel outside of a bypass diode, may permit the use of a coloration layer that does not necessarily impart uniform illumination to the backside. FIG. 41 shows one example of such a coloration layer pattern that does not impart uniformity.

Here the coloration layer includes a local enlargement 4400 located underneath a junction box 4402. Such an embodiment could be desirable where a cost of the material of the coloration layer is high, and that material is sought to be conserved to reduce expense.

Figure 42:
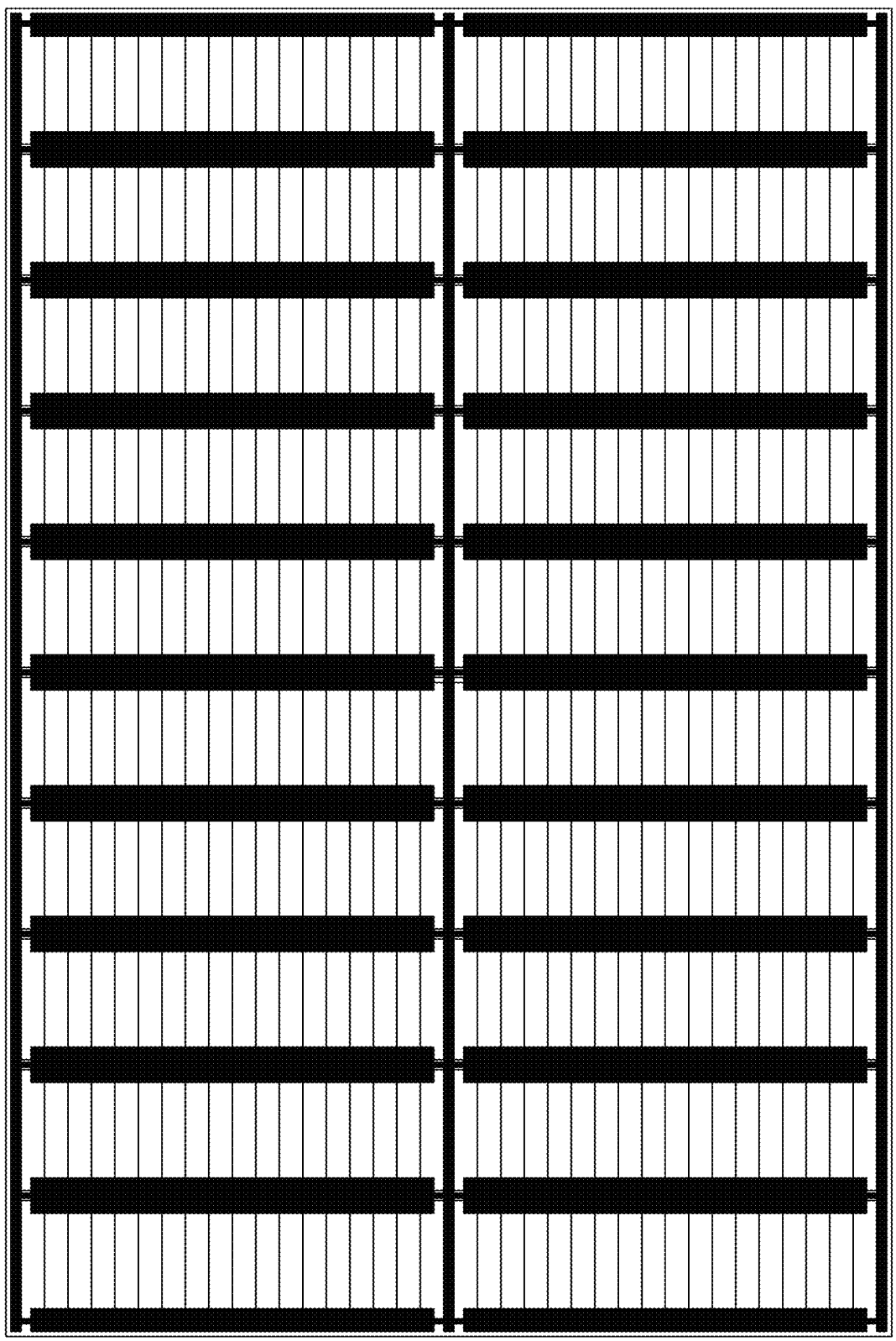
FIG. 42 shows a plan view of an embodiment of a complex bi-facial module including a coloration layer that imparts highly uniform illumination upon the backside.

The non-uniform backside illumination afforded by the embodiment of FIG. 41, may be effectively contrasted with the alternative approach of FIG. 42. This shows a plan view of an embodiment of a complex bi-facial module including a coloration layer that imparts highly uniform illumination upon the backside. That is, the precisely controlled shape of the coloration layer of FIG. 42 is designed to ensure that each photovoltaic element (e.g., singulated strips adhered in an overlapping shingled string) exhibits very nearly a same amount of exposed surface available for backside illumination.

What is claimed is:

1. A bifacial solar module apparatus comprising:
 a first bifacial photovoltaic element comprising a plurality of singulated strips assembled in a shingled configuration; each of the singulated strips is a bifacial solar cell having a front dark face with metallic fingers and a back dark face with metallic fingers, the front dark face having a dark color;
 a second bifacial photovoltaic element comprising a plurality of singulated strips assembled in a shingled configuration; each of the singulated strips is a bifacial solar cell having a front dark face with metallic fingers and a back dark face with metallic fingers, the second bifacial photovoltaic element separated from the first bifacial photovoltaic element by an inter-element region;
 a first coloration layer having a front side and a back side, the front side of the first coloration layer having a color that substantially matches the dark color of the front dark face of the singulated strips of the first bifacial photovoltaic element, the first coloration layer covering substantially only the inter-element region;
 bussing positioned adjacent to the back side of the first coloration layer and overlapping the first coloration layer; and
 a second coloration layer overlapping the bussing and partially overlapping the first bifacial photovoltaic element, the second coloration layer positioned adjacent to the back side of the first coloration layer so that the bussing is positioned between the first coloration layer and the second coloration layer.

2. A bifacial solar module apparatus as in claim 1 wherein the first bifacial photovoltaic element is in connected in parallel with the second bifacial photovoltaic element without an intervening diode.

3. A bifacial solar module apparatus as in claim 2 wherein the second coloration layer partially overlaps the first bifacial photovoltaic element to expose a non-uniform area to backside illumination.

4. A bifacial solar module apparatus as in claim 2 wherein the second coloration layer partially overlaps the first bifacial photovoltaic element to expose a uniform area to backside illumination.

5. A bifacial solar module apparatus as in claim 1 wherein the back side of the first coloration layer is also dark.

6. A bifacial solar module apparatus as in claim 1 wherein the back side of the first coloration layer is other than dark.

7. A bifacial solar module apparatus as in claim 1 wherein the first coloration layer comprises a tape.

8. A bifacial solar module apparatus as in claim 1 further comprising a transparent backplane, wherein the first coloration layer is in contact with the transparent backplane.

9. A bifacial solar module apparatus as in claim 1 further comprising an additional element positioned adjacent to the back side of the first coloration layer and overlapping the first coloration layer.

10. A bifacial solar module apparatus as in claim 9 wherein the additional element is selected from at least one of a ribbon tab, a junction box, and an inverter.

11. A bifacial solar module apparatus as in claim 1 further comprising an additional element overlapping the second coloration layer and positioned between the first coloration layer and the second coloration layer.

12. A bifacial solar module apparatus as in claim 11 wherein the additional element is selected from at least one of a junction box, and an inverter.

13. A bifacial solar module apparatus as in claim 1 further comprising a transparent backplane, wherein:
  the second coloration layer is in contact with the transparent backplane.

14. A bifacial solar module apparatus as in claim 13 wherein the first coloration layer comprises a tape.

* * * * *